(12) United States Patent
Bazan et al.

(10) Patent No.: US 10,396,286 B2
(45) Date of Patent: *Aug. 27, 2019

(54) REGIOREGULAR PYRIDAL[2,1,3]THIADIAZOLE π-CONJUGATED COPOLYMERS FOR ORGANIC SEMICONDUCTORS

(71) Applicant: The Regents of the University of California, Oakland, CA (US)

(72) Inventors: Guillermo C. Bazan, Santa Barbara, CA (US); Lei Ying, Goleta, CA (US); Ben B. Y. Hsu, Santa Barbara, CA (US); Wen Wen, Goleta, CA (US); Hsin-Rong Tseng, Goleta, CA (US); Gregory C. Welch, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 183 days.

This patent is subject to a terminal disclaimer.

(21) Appl. No.: 14/087,702

(22) Filed: Nov. 22, 2013

(65) Prior Publication Data

US 2014/0080986 A1 Mar. 20, 2014

Related U.S. Application Data

(62) Division of application No. 13/526,371, filed on Jun. 18, 2012.

(Continued)

(51) Int. Cl.
  *C08G 61/12* (2006.01)
  *H01L 51/00* (2006.01)
  *H01L 51/05* (2006.01)

(52) U.S. Cl.
  CPC ........ *H01L 51/0036* (2013.01); *C08G 61/122* (2013.01); *C08G 61/123* (2013.01);
  (Continued)

(58) Field of Classification Search
  CPC ............ C08G 2261/212; C08G 61/122; C08G 61/123; C08G 61/126
  See application file for complete search history.

(56) References Cited

U.S. PATENT DOCUMENTS 8,729,221 B2 * 5/2014 Bazan et al. .................. 528/377
2005/0059168 A1   3/2005 Bazan et al.
(Continued)

FOREIGN PATENT DOCUMENTS

| KR | 1020080072929 | 8/2008 |
| WO | 2008143850 | 11/2008 |
| WO | 2009152165 | 12/2009 |

OTHER PUBLICATIONS

Blouin, N., et al., "Toward a ration design for poly(2,7-carbazole) derivatives for solar cells," J. Am. Chem. Soc., 2008, 130, 732-742.*

(Continued)

*Primary Examiner* — Nicholas E Hill
(74) *Attorney, Agent, or Firm* — Gates & Cooper LLP

(57) ABSTRACT

A method of regioselectively preparing a pyridine-containing compound is provided. In particular embodiments, the method includes reacting halogen-functionalized pyridal[2,1,3]thiadiazole with organotin-functionalized cyclopenta[2,1-b:3,4-b']dithiophene or organotin-functionalized indaceno[2,1-b:3,4-b']dithiophene. Also provided is a method of preparing a polymer. The method includes regioselectively preparing a monomer that includes a pyridal[2,1,3]thiadiazole unit; and reacting the monomer to produce a polymer that includes a regioregular conjugated backbone section, (Continued)

wherein the section includes a repeat unit containing the pyridal[2,1,3]thiadiazole unit. A polymer that includes a regioregular conjugated backbone section, and electronic devices that include the polymer, are also provided.

19 Claims, 23 Drawing Sheets

Related U.S. Application Data

(60) Provisional application No. 61/498,390, filed on Jun. 17, 2011, provisional application No. 61/645,970, filed on May 11, 2012.

(52) U.S. Cl.
CPC ........ *C08G 61/126* (2013.01); *H01L 51/0043* (2013.01); *C08G 2261/124* (2013.01); *C08G 2261/148* (2013.01); *C08G 2261/1412* (2013.01); *C08G 2261/1646* (2013.01); *C08G 2261/212* (2013.01); *C08G 2261/3241* (2013.01); *C08G 2261/3246* (2013.01); *C08G 2261/344* (2013.01); *C08G 2261/414* (2013.01); *C08G 2261/91* (2013.01); *C08G 2261/92* (2013.01); *H01L 51/0094* (2013.01); *H01L 51/0533* (2013.01); *H01L 51/0545* (2013.01); *Y02E 10/549* (2013.01)

(56) References Cited

U.S. PATENT DOCUMENTS

| | | |
|---|---|---|
| 2008/0275212 A1 | 11/2008 | Heeney et al. |
| 2010/0180944 A1 | 7/2010 | Gaudiana et al. |
| 2010/0311879 A1 | 12/2010 | Rieke |
| 2011/0003967 A1 | 1/2011 | Amb et al. |
| 2011/0028656 A1* | 2/2011 | Bazan et al. ............... 525/326.7 |

OTHER PUBLICATIONS

Blouin, N., et al., "Toward a ration design for poly(2,7-carbazole) derivatives for solar cells," J. Am. Chem. Soc., 2008, 130, 732-742, Supporting Information.*
McCullough, R. D., et al., "Design, synthesis, and control of conducting polymer architectures: structurally homogenous poly(3-alkylthiophenes)," J. Org. Chem., 1993, 58, 904-912.*
Yamamoto, T., et al., "Preparation and characterization of regioregular head-to-tail pi-conjugated poly(pyridine-2,5-diyl)s," Chemistry Letters, 2001, 502-503.*
Berson, S., et al., "Effect ofcarbonitrile and hexyloxy substituents on alternated copolymer of polythiophene—Performances in photovoltaic cells," Solar Energy Materials & Solar Cells 94 (2010) 699-708.*
Bürgi, Lukas, et al. "High-Mobility Ambipolar Near-Infrared Light-Emitting Polymer Field-Effect Transistors." Advanced Materials 20.11 (2008): 2217-2224.
Bijleveld, Johan C., et al. "Poly (diketopyrrolopyrrole-terthiophene) for ambipolar logic and photovoltaics." Journal of the American Chemical Society 131.46 (2009): 16616-16617.
Li, Yuning, et al. "Annealing-Free High-Mobility Diketopyrrolopyrrole-Quaterthiophene Copolymer for Solution-Processed Organic Thin Film Transistors." Journal of the American Chemical Society 133.7 (2011): 2198-2204.
Yan, He, et al. "A high-mobility electron-transporting polymer for printed transistors." Nature 457.7230 (2009): 679-686.
Son, Hae Jung, et al. "Synthesis of fluorinated polythienothiophene-co-benzodithiophenes and effect of fluorination on the photovoltaic properties." Journal of the American Chemical Society 133.6 (2011): 1885-1894.

Liang, Yongye, et al. "For the bright future—bulk heterojunction polymer solar cells with power conversion efficiency of 7.4%." Advanced Materials 22.20 (2010): E135-E138.
Zhang, Ming, et al. "Field-effect transistors based on a benzothiadiazole-cyclopentadithiophene copolymer." Journal of the American Chemical Society 129.12 (2007): 3472-3473.
Tsao, Hoi Nok, et al. "The Influence of Morphology on High-Performance Polymer Field-Effect Transistors." Advanced Materials 21.2 (2009): 209-212.
Tsao, Hoi Nok, et al. "Ultrahigh mobility in polymer field-effect transistors by design." Journal of the American Chemical Society 133.8 (2011): 2605-2612.
Welch, Gregory C., et al. "Band gap control in conjugated oligomers via Lewis acids." Journal of the American Chemical Society 131.31 (2009): 10802-10803.
Blouin, Nicolas, et al. "Toward a rational design of poly (2, 7-carbazole) derivatives for solar cells." Journal of the American Chemical Society 130.2 (2008): 732-742.
Zhou, H., et al. "Enhanced photovoltaic performance of low-bandgap polymers with deep LUMO levels." Angewandte Chemie (International ed. in English) 49.43 (2010): 7992-7995.
Yamamoto, Takakazu, et al. "Copolymers of thiophene and thiazole. Regioregulation in synthesis, stacking structure, and optical properties." Macromolecules 36.21 (2003): 7986-7993.
Nambiar, Rakesh, et al. "Synthetic Approaches to Regioregular Unsymmetrical Dialkoxy-Substituted Poly (1, 4-phenylene ethynylene) s." Macromolecules 42.1 (2009): 43-51.
Osaka, Itaru, et al. "Advances in molecular design and synthesis of regioregular polythiophenes." Accounts of chemical research 41.9 (2008): 1202-1214.
Tilley, Jefferson W., et al. "A convenient palladium-catalyzed coupling approach to 2, 5-disubstituted pyridines." The Journal of Organic Chemistry 53.2 (1988): 386-390.
Schröter, Sven, et al. "Regioselective cross-coupling reactions of multiple halogenated nitrogen-, oxygen-, and sulfur-containing heterocycles." Tetrahedron 61.9 (2005): 2245-2267.
Handy, Scott T., et al. "Disubstituted pyridines: The double-coupling approach." The Journal of organic chemistry 72.22 (2007): 8496-8500.
Coffin, Robert C., et al. "Streamlined microwave-assisted preparation of narrow-bandgap conjugated polymers for high-performance bulk heterojunction solar cells." Nature chemistry 1.8 (2009): 657-661.
Sun, Ying, et al. "High-mobility low-bandgap conjugated copolymers based on indacenodithiophene and thiadiazolo [3, 4-c] pyridine units for thin film transistor and photovoltaic applications." Journal of Materials Chemistry 21.35 (2011): 13247-13255.
Ying, Lei, et al. "Regioregular pyridal [2, 1, 3] thiadiazole π-conjugated copolymers." Journal of the American Chemical Society 133.46 (2011): 18538-18541.
Liu, Fengmin, et al. "Efficient polymer photovoltaic cells using solution-processed MoO3 as anode buffer layer." Solar Energy Materials and Solar Cells 94.5 (2010): 842-845.
Wang, Ming, et al. "Donor—acceptor conjugated polymer based on naphtho [1, 2-c: 5, 6-c] bis [1, 2, 5] thiadiazole for high-performance polymer solar cells." Journal of the American Chemical Society 133.25 (2011): 9638-9641.
Zhang, Weimin, et al. "Indacenodithiophene semiconducting polymers for high-performance, air-stable transistors." Journal of the American Chemical Society 132.33 (2010): 11437-11439.
PCT International Search Report & Written Opinion dated Feb. 14, 2013 for PCT Application No. PCT/US2012/043004.
Gregory C. Welch et al. "Lewis Acid Adducts of Narrow Band Gap Conjugated Polymers", Journal of the American Chemical Society, vol. 133, No. 12, pp. 4632-4644, Mar. 30, 2011.
Blouin N et al. "Toward a rational design of Poly(2,7-carbazole) Derivatives for Solar Cells", Journal of the American Chemical Society, ACS Publications, vol. 130, No. 2, pp. 732-742, Jan. 1, 2008.
Supplementary European Search Report for EP Patent Application No. 12801086.5.

* cited by examiner (a)

(b)

(a)  (b)

(a)  (b)

REGIOREGULAR PYRIDAL[2,1,3]THIADIAZOLE π-CONJUGATED COPOLYMERS FOR ORGANIC SEMICONDUCTORS

CROSS-REFERENCE TO RELATED APPLICATIONS

This application is a divisional application that claims the benefit under 35 U.S.C. § 120 of U.S. patent application Ser. No. 13/526,371 by Guillermo C. Bazan et al., filed Jun. 18, 2012 and titled "Regioregular Pyridal[2,1,3]Thiadiazole Pi-Conjugated Copolymers for Organic Semiconductors", which claims priority under Section 119(e) from U.S. Provisional Application Ser. No. 61/498,390, filed Jun. 17, 2011, and Ser. No. 61/645,970, filed May 11, 2012, the contents of which are incorporated herein by reference.

BACKGROUND

Field of the Invention

The invention relates to conjugated polymers and methods of making the same.

Related Art

Organic π-conjugated polymers are attractive materials for use in the active layer, as they combine good absorption and emission characteristics with efficient charge carrier mobility and have the ability to be solution processed onto flexible substrates. Recent advances in the field have seen organic field effect transistors (OFET) achieve charge carrier mobility on the order of 1.0 cm$^2$V$^{-1}$ s$^{-1}$ [1] and organic photovoltaic (OPV) devices reach power conversion efficiencies over 7% [2]. While these results are promising for the field, there still exits a complexity of correlating molecular structure to optical and electronic properties. Among the available narrow band-gap materials, donor-acceptor copolymers based on cyclopenta[2,1-b:3,4-b']dithiophene (CDT) and benzothiadiazole (BT) have attracted considerable attention due to the high charge carrier mobility and excellent photovoltaic performance. Müllen and co-workers have eloquently demonstrated that CDT-BT copolymers with linear side chains and high molecular weights, p-type FETs with mobilities on the order of 1.4-3.3 cm$^2$V$^{-1}$ s$^{-1}$ [3].

The incorporation of a nitrogen atom into the acceptor unit of CDT-BT copolymers results in the narrowing of the optical bandgap and the emergence of these materials to selectively bind Lewis acids [4]. The replacement of the BT unit with the pyridal[2,1,3]thiadiazole (PT) acceptor unit results in a higher electron affinity across the polymeric backbone leading to a decreased LUMO level of polymer. Copolymers based on PT and carbazole reported by Lerclerc et al. [5] have fairly low molecular weights (ca. 4-5 kDa), and the efficiencies of the fabricated solar cells (under 1%) are much lower than predicated. You and co-workers have demonstrated that by introducing two alkyl chains to the 4-position of the thienyl unit could lead to a more soluble PT based acceptor (DTPyT), and allows access to polymers with high molecular weights and excellent photovoltaic efficiency up to 6.32% [6]. In each case, however, the nature of the step-growth polymerization strategy leads to these polymer systems having a regiorandom origination of the pyridal-N atom along the polymeric backbone.

SUMMARY

The inventors understand that regioregularity can have a great impact on the properties of polymers [7]. For instance, enhanced regioregularity of poly(3-alkylthiophene) can impart to polymers a higher crystallinity, red-shifted optical absorption, higher conductivity, and smaller band-gap [8]. The inventors have surmised that for a polymer based on an asymmetric PT unit, a regioregular backbone structure with more effective electron localization can result in a higher charge carrier mobility and enhanced photovoltaic performance. Recognizing that for the copolymerization of distannyl CDT monomers and 4,7-dibromo-pyridal[2,1,3]thiadiazole (PTBr$_2$) as starting material, the resulted polymer would not be truly random because the bromine at the electron-deficient C4-position of PTBr$_2$ is more favorable for coupling than the C7-position [9], the inventors take advantage of this difference by preparing regiochemically precise backbones of PT-based polymers using specific synthetic procedures.

In one aspect, a method of preparing a regioregular polymer is provided. The method includes regioselectively preparing a monomer; and reacting the monomer to produce a polymer that includes a regioregular conjugated main chain section.

In a further aspect, a regioregular polymer that includes a regioregular conjugated main chain section is provided. Also provided is an electronic device that includes the regioregular polymer.

In some embodiments, the regioregular polymer includes a regioregular conjugated main chain section having a repeat unit that includes a pyridine of the structure

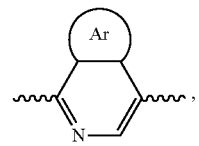

where a) Ar is a substituted or non-substituted aromatic functional group, or Ar is nothing and the valence of the pyridine ring is completed with hydrogen, and b) the pyridine is regioregularly arranged along the conjugated main chain section. The regioregularity of the main chain section can be 95% or greater, and the charge carrier mobility of the regioregular polymer can be greater than the charge carrier mobility of a regiorandom polymer of similar composition. In some embodiments of the regioregular polymer, the repeat unit further includes a dithiophene of the structure

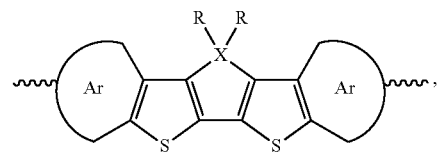

where a) each Ar is independently a substituted or non-substituted aromatic functional group, or each Ar is independently nothing and the valence of its respective thiophene ring is completed with hydrogen, b) each R is independently hydrogen or a substituted or non-substituted alkyl, aryl or alkoxy chain, and c) X is C, Si, Ge, N or P.

In some embodiments that include the pyridine and/or the dithiophene, each substituted or non-substituted aromatic functional group of the pyridine and the dithiophene independently includes one or more alkyl or aryl chains. In particular embodiments, the one or more alkyl or aryl chains are each independently a $C_6$-$C_{30}$ substituted or non-substituted alkyl chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), —(CH$_2$)$_n$N(C$_2$H$_5$)$_2$ (n=2~20), 2-ethylhexyl, PhC$_m$H$_{2m+1}$ (m=1~20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3).

In some embodiments that include the dithiophene, the substituted or non-substituted alkyl, aryl or alkoxy chain can be a $C_6$-$C_{30}$ substituted or non-substituted alkyl, aryl or alkoxy chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), —(CH$_2$)$_n$N(C$_2$H$_5$)$_2$ (n=2~20), 2-ethylhexyl, PhC$_m$H$_{2m+1}$ (m=1-20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3).

In some embodiments that include the dithiophene, X can be C or Si.

In some embodiments of the regioregular polymer that include the pyridine, the pyridine is a pyridine unit of Table 1 (which is described below). In some embodiments, the repeat unit further includes a dithiophene unit of Table 2 (which is described below). In certain embodiments, the pyridine unit is

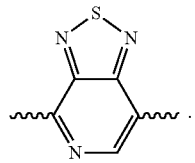

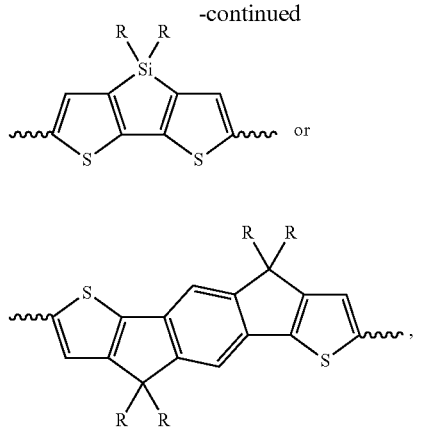

wherein each R is independently hydrogen or a substituted or non-substituted alkyl, aryl or alkoxy chain. In some embodiments, the substituted or non-substituted alkyl, aryl or alkoxy chain is a $C_6$-$C_{30}$ substituted or non-substituted alkyl, aryl or alkoxy chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), —(CH$_2$)$_n$N(C$_2$H$_5$)$_2$ (n=2~20), 2-ethylhexyl, PhC$_m$H$_{2m+1}$ (m=1-20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3). In some embodiments, X is C or Si. In particular embodiments, each R is $C_{12}H_{25}$, each R is 2-ethylhexyl, or each R is PhC$_6H_{13}$.

In some embodiments of the regioregular polymer, the repeat unit includes

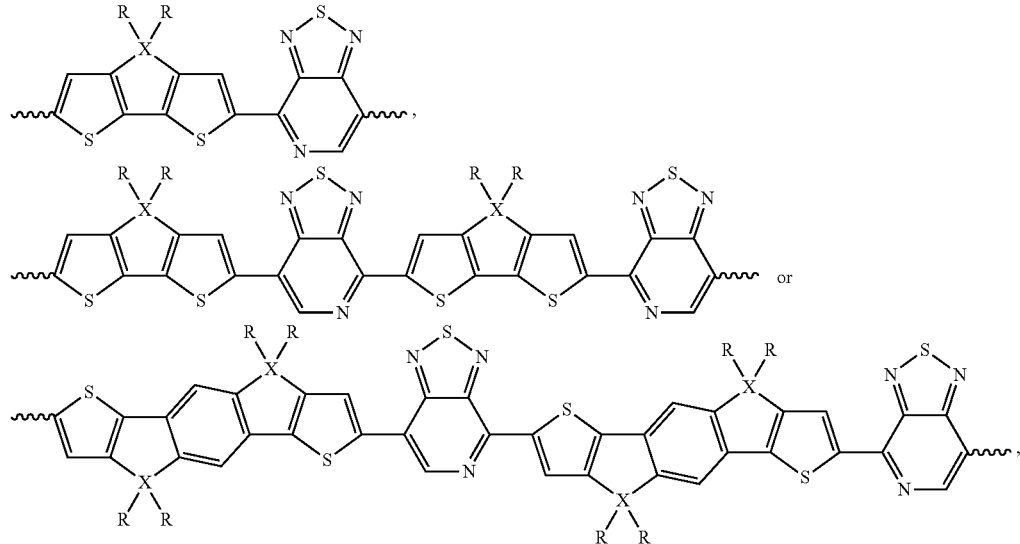

and the dithiophene unit is

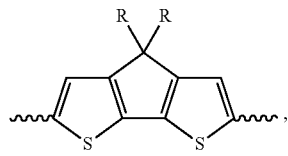

where each R is independently hydrogen or a substituted or non-substituted alkyl, aryl or alkoxy chain, and X is C, Si, Ge, N or P. In some embodiments, the substituted or non-substituted alkyl, aryl or alkoxy chain is a $C_6$-$C_{30}$ substituted or non-substituted alkyl, aryl or alkoxy chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), —(CH$_2$)$_n$N(C$_2$H$_5$)$_2$ (n=2~20), 2-ethylhexyl, PhC$_m$H$_{2m+1}$ (m=1-20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3). In some embodiments, X is C or Si. In particular embodiments, each R is $C_{12}H_{25}$, each R is 2-ethylhexyl, or each R is $PhC_6H_{13}$.

A device including any regioregular polymer described herein is provided. The device can be, but is not limited to, a field effect transistor, organic photovoltaic device, polymer light emitting diode, organic light emitting diode, organic photodetector, or biosensor. In the device, the regioregular polymer can form an active semiconducting layer.

The term "regioregular," "regioregularly" or "regioregularity" in relation to a polymer or a section of a polymer means the non-random orientation or arrangement of the pyridal-N along the polymer backbone. In some regioregular embodiments, the nitrogen atom of the pyridine faces in the same direction in all or a majority of the repeat units of the polymer or polymer section. For example, in the repeat unit of Scheme 1 below, the pyridal nitrogen atom of the PT unit faces the CDT unit. If we define the end of PT next to the pyridal nitrogen atom as the head, and the other end as the tail, then all or a majority of the PT units in the copolymers of Scheme 1 adopted a head-to-tail arrangement next to each other. In other regioregular embodiments, all or a majority of the repeat units of the polymer or polymer section have two pyridine units, with the nitrogen atoms of the pyridine units oriented toward each other. For example, in the repeat unit of Scheme 2 below, the pyridal nitrogen atom of one PT unit is oriented towards the pyridal nitrogen atom of the other PT unit, which is a head-to-head connection through the CDT unit.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
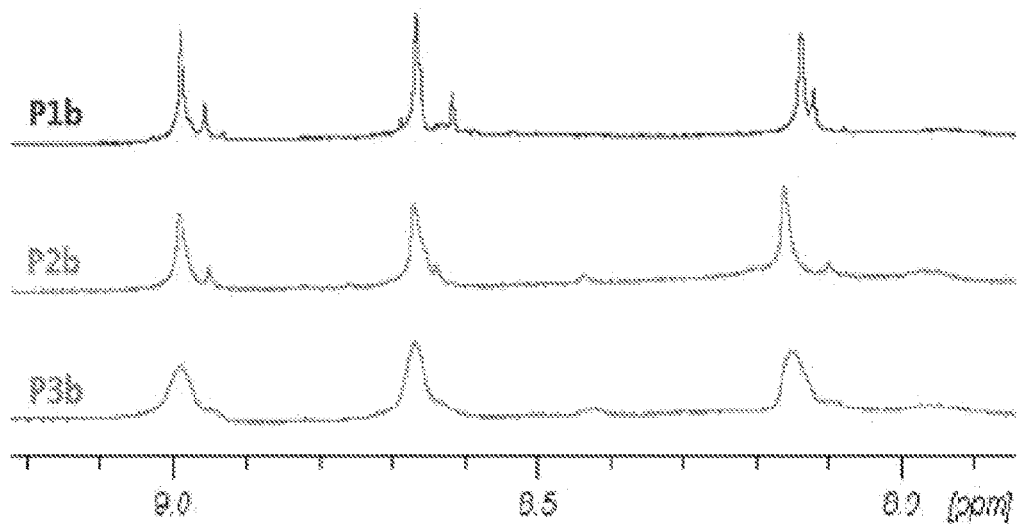
FIG. 1 is a panel of $^1$H NMR spectra of P1b, P2b and P3b in d-TCE at 110° C.

In the method of preparing a regioregular polymer, a monomer is regioselectively prepared. In some embodiments, the monomer is prepared by reacting halogen-functionalized PT with organotin-functionalized cyclopenta[2,1-b:3,4-b']dithiophene. The reaction can be carried out at a temperature in the range of about 50° C. to about 150° C., and the regioselectivity of the reaction can be 95% or greater. In other embodiments the monomer is prepared by reacting halogen-functionalized PT with organotin-functionalized indaceno[1,2-b:5,6-b']dithiophene (IDT), where the reaction can be carried out at a temperature in the range of about 50° C. to about 150° C. and the regioselectivity of the reaction can be 95% or greater. In other embodiments the monomer is prepared by reacting halogen-functionalized PT with organoboron-functionalized cyclopenta[2,1-b:3,4-b'] dithiophene or organoboron-functionalized indaceno[1,2-b:5, 6-b']dithiophene (IDT), where the reaction can be carried out at a temperature in the range of about 50° C. to about 150° C. and the regioselectivity of the reaction can be 95% or greater. In some embodiments the monomer is prepared by reacting halogen-functionalized PT with cyclopenta[2,1-b:3,4-b']dithiophene or indaceno[1,2-b:5,6-b']dithiophene (IDT) by direct arylation polymerization, in which direct arylation allows the formation of carbon-carbon bonds between aromatic units having activated hydrogen atoms without the use of organometallic intermediates, where the reaction can be carried out at a temperature in the range of about 50° C. to about 150° C. and the regioselectivity of the reaction can be 95% or greater.

The halogen-functionalized PT can have the following structure:

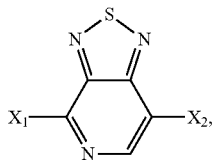

where $X_1$ and $X_2$ are each independently a halogen, and in particular embodiments can be I, Br, Cl, or $CF_3SO_3$.

The organotin-functionalized cyclopenta[2,1-b:3,4-b']dithiophene can have the following structure:

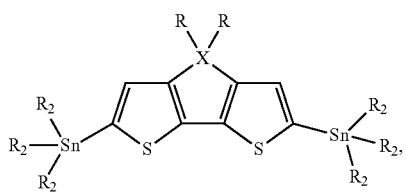

(I)

or the organotin-functionalized indaceno[1,2-b:5,6-b']dithiophene can have the following structure:

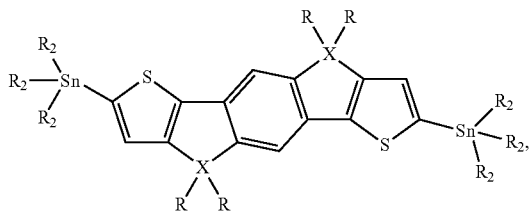

(II)

where each R is independently hydrogen or a substituted or non-substituted alkyl, aryl or alkoxy chain, each $R_2$ is independently methyl or n-butyl, and X is C, Si, Ge, N or P. In some embodiments, the R groups can be the same and the $R_2$ groups can be the same.

The term "alkyl" refers to a branched or unbranched saturated hydrocarbyl group such as methyl, ethyl, n-propyl, isopropyl, n-butyl, isobutyl, t-butyl, octyl, decyl and the like. The term "aryl" refers to an aromatic hydrocarbyl group containing a single aromatic ring or multiple aromatic rings that are fused together, linked covalently, or linked to a common group such as a methylene or ethylene moiety. The term "alkoxy" refers to an alkyl group bound through a single, terminal ether linkage. The term "substituted" refers to a hydrocarbyl group in which one or more bonds to a hydrogen atom contained within the group is replaced by a bond to a non-hydrogen atom of a substituent group. Examples of non-hydrogen atoms include, but are not limited to, carbon, oxygen, nitrogen, phosphorus, and sulfur. Examples of substituent groups include, but are not limited to, halo, hydroxy, amino, alkoxy, aryloxy, nitro, ester, amide, silane, siloxy, and hydrocarbyl groups. The substituent can be a functional group such as hydroxyl, alkoxy, thio, phosphino, amino, or halo.

In particular embodiments of the cyclopenta[2,1-b:3,4-b'] dithiophene or indaceno[1,2-b:5,6-b']dithiophene: the substituted or non-substituted alkyl, aryl or alkoxy chain can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3); and/or X can be Si.

In some embodiments, the halogen-functionalized PT and/or the organotin-functionalized cyclopenta[2,1-b:3,4-b'] dithiophene are compounds of Scheme 1 or 2. In other embodiments, the halogen-functionalized PT and/or the organotin-functionalized indaceno[1,2-b:5,6-b']dithiophene are compounds of Scheme 4.

The regioselectively prepared monomer can have the following structure:

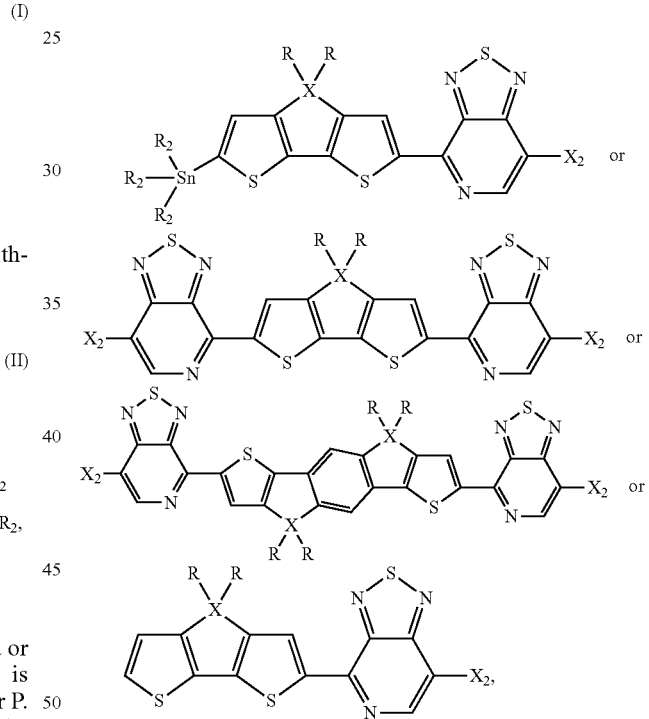

where each R is independently hydrogen or a substituted or non-substituted alkyl, aryl or alkoxy chain, each $R_2$ is independently methyl or n-butyl, X is C, Si, Ge, N or P, and $X_2$ is a halogen. In particular embodiments, $X_2$ can be I, Br, Cl, or $CF_3SO_3$. In some embodiments, the monomer has the following structure:

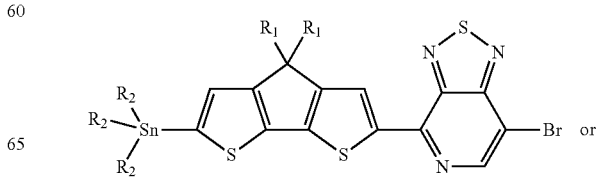

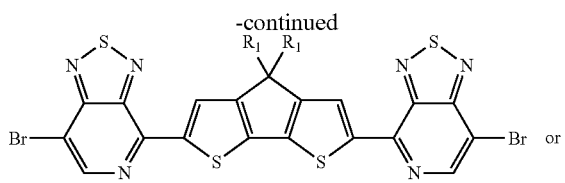

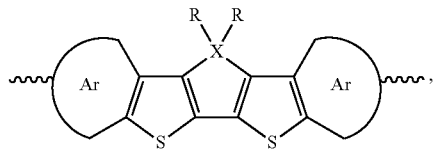

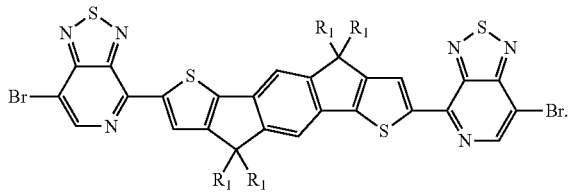

In these embodiments, each R or $R_1$ is independently hydrogen or a substituted or non-substituted alkyl, aryl or alkoxy chain, and each $R_2$ is independently methyl or n-butyl. In some embodiments, the substituted or non-substituted alkyl, aryl or alkoxy chain can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), or —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3); and/or X can be Si. In some embodiments, the R groups can be the same, the $R_1$ groups can be the same, and the $R_2$ groups can be the same.

In the method, the monomer is regioselectively prepared, then the monomer is reacted or polymerized to form a regioregular polymer having a regioregular conjugated main chain section. To form the regioregular polymer when the monomer is a CDT-PT monomer, the monomer can be reacted to itself, or reacted to another monomer containing a cyclopenta[2,1-b:3,4-b']dithiophene unit. When the monomer is a PT-IDT-PT monomer, the monomer can be reacted to another monomer containing an IDT-PT unit. The polymerization reaction can take place at a temperature in the range of about 80° C. to about 200° C. when the monomer is a CDT-PT monomer, and can take place at a temperature in the range of about 80° C. to about 200° C. when the monomer is a PT-IDT-PT monomer. The regioregular conjugated main chain section can comprise 5-100, or more, contiguous repeat units. In some embodiments, the number of repeat units is in the range of 10-40 repeats. The regioregularity of the conjugated main chain section can be 95% or greater.

The regioregular polymer in some embodiments has a main chain section that includes a repeat unit containing a pyridine of the structure

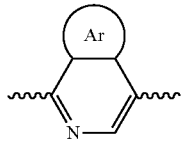

or a dithiophene of the structure

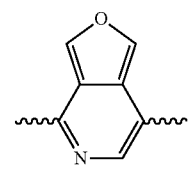

or a combination thereof, where each Ar is independently nothing or a substituted or non-substituted aromatic functional group, each R is independently hydrogen or a substituted or non-substituted alkyl, aryl or alkoxy chain, and X is C, Si, Ge, N or P. When Ar is nothing, the valence of the respective pyridine or thiophene ring is completed with hydrogen. In some embodiments, the R groups can be the same. The substituted or non-substituted aromatic functional group can include one or more alkyl or aryl chains, each of which independently can be a $C_6$-$C_{30}$ substituted or non-substituted alkyl or aryl chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3). The substituted or non-substituted alkyl, aryl or alkoxy chain can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), 2-ethylhexyl, $PhC_mH_{2m+1}$ (m=1-20), —$(CH_2)_nN(C_2H_5)_2$ (n=2~20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3).

In embodiments of the regioregular polymer, the repeat unit of the regioregular conjugated main chain section can contain a pyridine unit of Table 1, where each R is independently a substituted or non-substituted alkyl chain, which can be a $C_6$-$C_{30}$ substituted or non-substituted alkyl chain, —$(CH_2CH_2O)n$ (n=2~20), $C_6H_5$, —$C_nF_{(2n+1)}$ (n=2~20), —$(CH_2)_nN(CH_3)_3Br$ (n=2~20), —$(CH_2)_nN(C_2H_5)_2$ (n=2~20), 2-ethylhexyl, $PhC_mH_{2m+1}$ (m=1-20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3); in some embodiments, the R groups can be the same.

TABLE 1

Examples of pyridine units

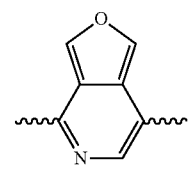

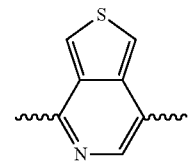

TABLE 1-continued
Examples of pyridine units
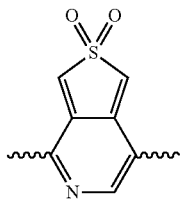
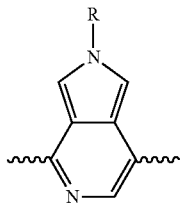
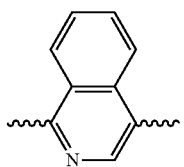
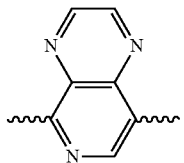
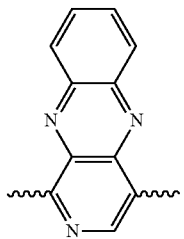
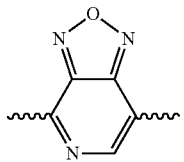
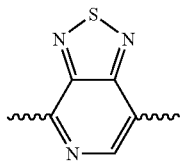
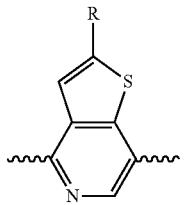
TABLE 1-continued
Examples of pyridine units
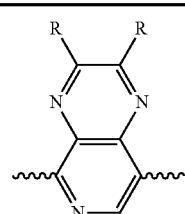
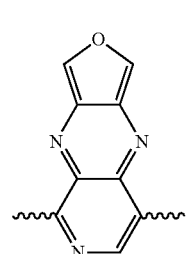
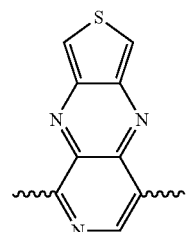
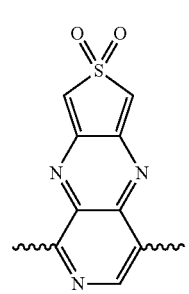
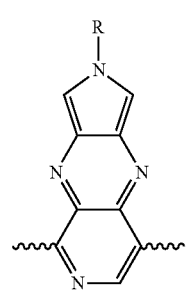
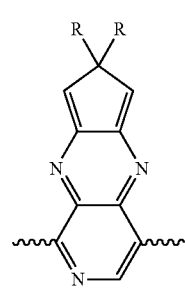

TABLE 1-continued
Examples of pyridine units
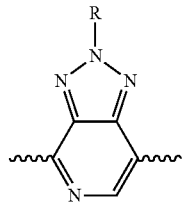
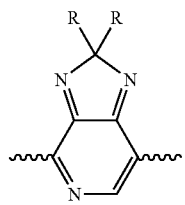
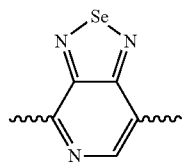
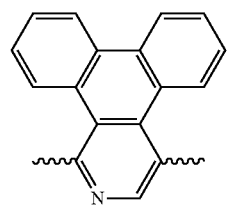
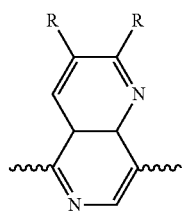
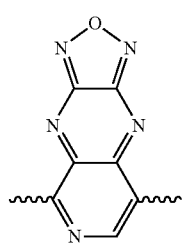
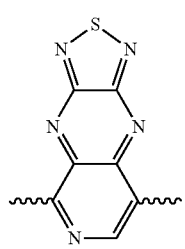
TABLE 1-continued
Examples of pyridine units
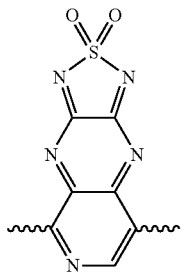
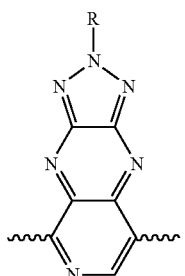
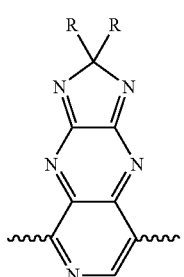
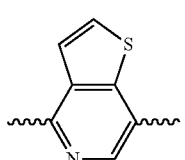
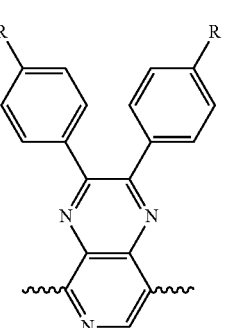

TABLE 1-continued
Examples of pyridine units

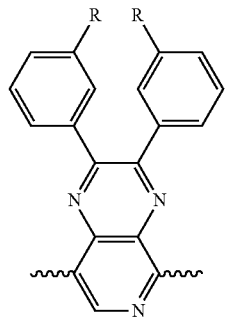

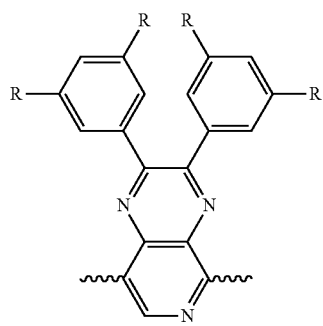

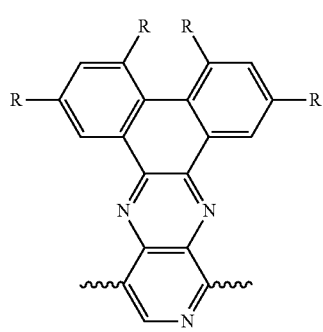

TABLE 2
Examples of dithiophene units

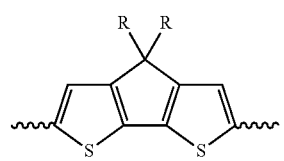

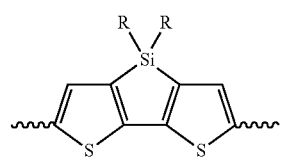

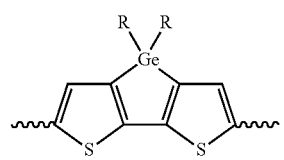

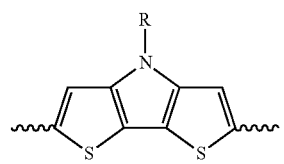

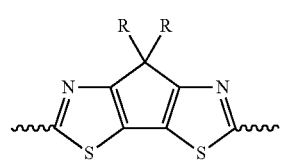

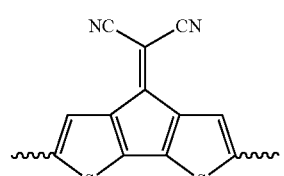

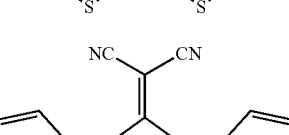

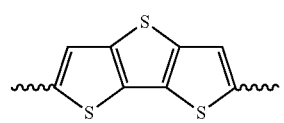

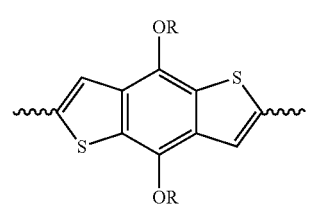

In embodiments of the regioregular polymer, the repeat unit of the regioregular conjugated main chain section can contain a dithiophene unit of Table 2, where each R is independently a substituted or non-substituted alkyl, aryl or alkoxy chain, which can be a $C_6$-$C_{30}$ substituted or non-substituted alkyl or alkoxy chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), —(CH$_2$)$_n$N(C$_2$H$_5$)$_2$ (n=2~20), 2-ethylhexyl, PhC$_m$H$_{2m+1}$ (m=1-20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3); in some embodiments, the R groups can be the same, and in some embodiments, a repeat unit may contain any combination of a pyridine unit of Table 1 and dithiophene unit of Table 2.

TABLE 2-continued
Examples of dithiophene units
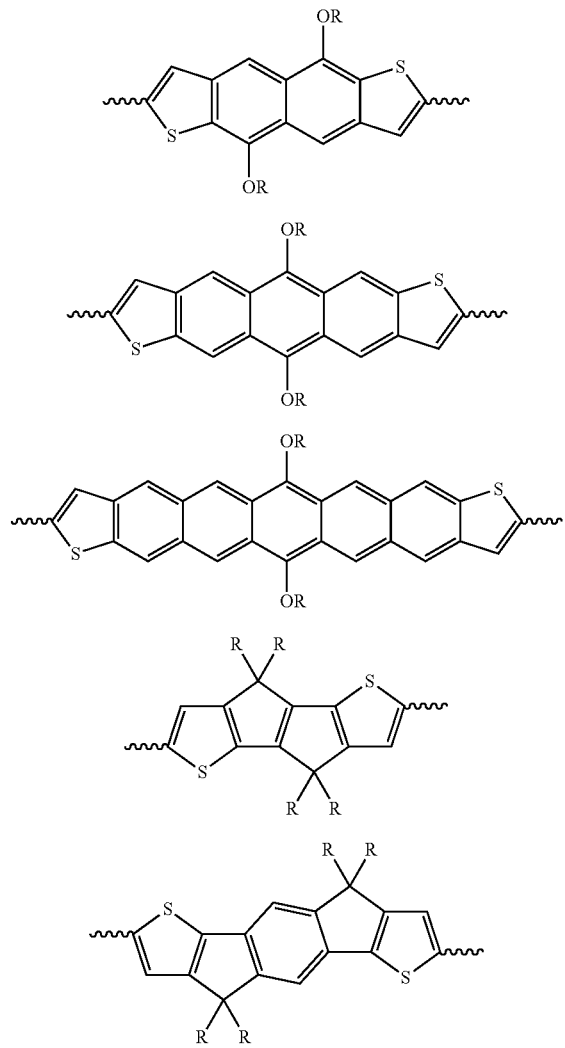
TABLE 2-continued
Examples of dithiophene units
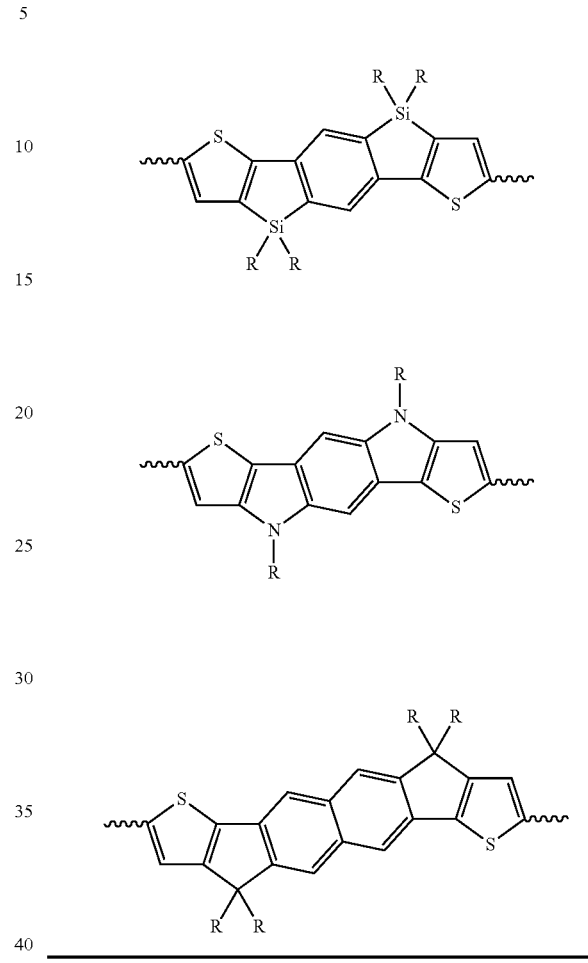
In some embodiments, the regioregular polymer comprises a regioregular conjugated main chain having a repeat unit of the following structure:
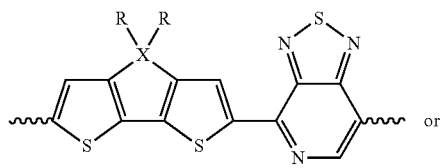 or
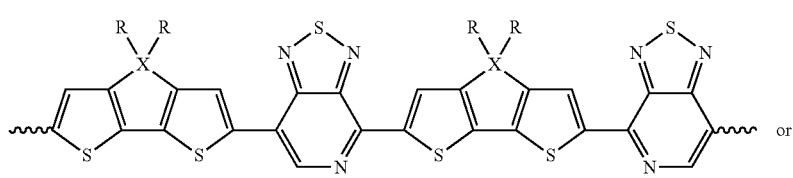 or

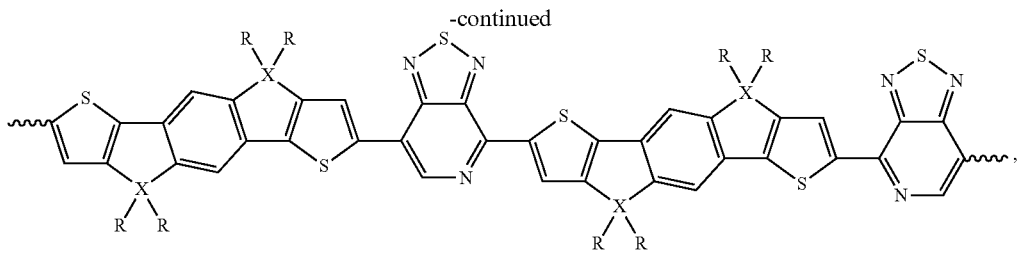

where each R is independently hydrogen or a substituted or non-substituted alkyl, aryl or alkoxy chain, and X is C, Si, Ge, N or P. In particular embodiments, the repeat unit has the following structure:

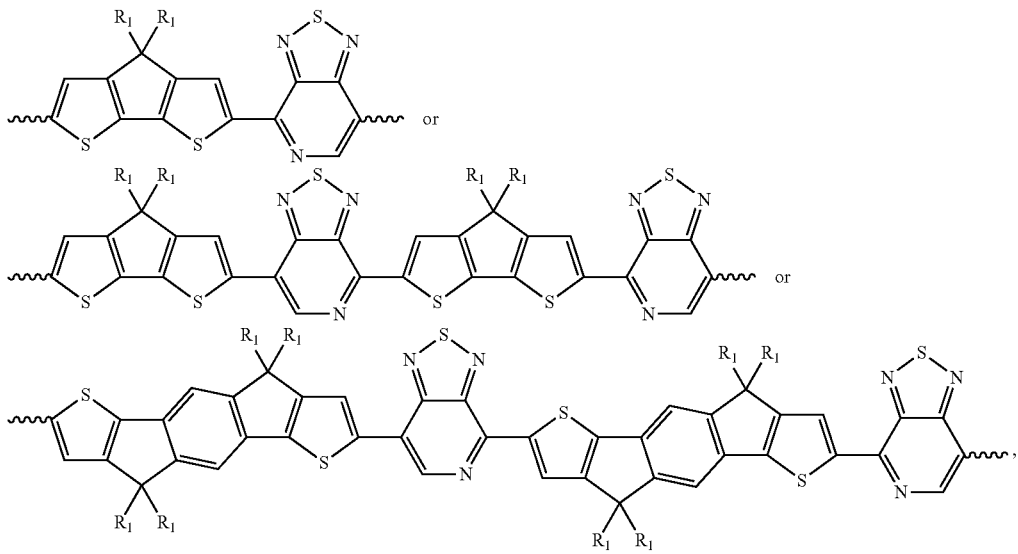

where each $R_1$ is independently hydrogen or a substituted or non-substituted alkyl, aryl or alkoxy chain. In some embodiments, the R groups can be the same, and the $R_1$ groups can be the same. In some embodiments, each R or $R_1$ can be a $C_6$-$C_{30}$ substituted or non-substituted alkyl, aryl or alkoxy chain, —(CH$_2$CH$_2$O)n (n=2~20), $C_6H_5$, —$C_nF_{(2n+1)}$ (n=2~20), —(CH$_2$)$_n$N(CH$_3$)$_3$Br (n=2~20), or —(CH$_2$)$_n$N(C$_2$H$_5$)$_2$ (n=2~20), 2-ethylhexyl, PhC$_m$H$_{2m+1}$ (m=1-20), —(CH$_2$)$_n$Si(C$_m$H$_{2m+1}$)$_3$ (m, n=1 to 20), or —(CH$_2$)$_n$Si(OSi(C$_m$H$_{2m+1}$)$_3$)$_x$(C$_p$H$_{2p+1}$)$_y$ (m, n, p=1 to 20, x+y=3); and/or X can be Si. In some embodiments, the polymer is prepared by any of the methods described herein, or shown in Scheme 1, 2, or 4.

The charge carrier mobility of the regioregular polymer can be greater than the charge carrier mobility of a regiorandom polymer of similar composition.

Embodiments of the polymer may be incorporated in electronic devices. Examples of electronic devices include, but are not limited to, field effect transistors, organic photovoltaic devices, polymer light emitting diodes, organic light emitting diodes, organic photodetectors and biosensors.

The electronic devices can be solution coated, where the solution coating process can be, but is not limited to, the following: spin coating, ink jet printing, blade coating, dip coating, spraying coating, slot coating, gravure coating or bar coating.

The present invention may be better understood by referring to the accompanying examples, which are intended for illustration purposes only and should not in any sense be construed as limiting the scope of the invention.

Example 1

Scheme 1. Synthetic route of P1a and P1b

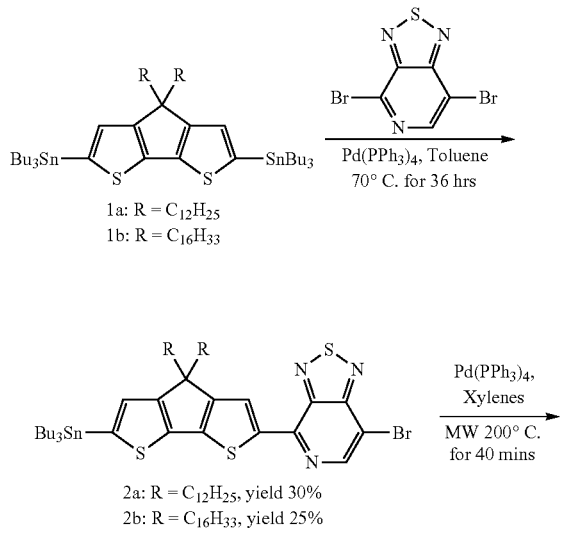

1a: R = C$_{12}$H$_{25}$
1b: R = C$_{16}$H$_{33}$

2a: R = C$_{12}$H$_{25}$, yield 30%
2b: R = C$_{16}$H$_{33}$, yield 25%

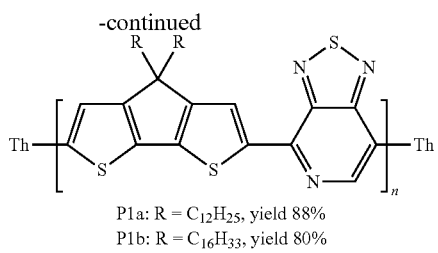

P1a: R = C₁₂H₂₅, yield 88%
P1b: R = C₁₆H₃₃, yield 80%

To develop a region regular structure, the functionalized donor-acceptor (DA) monomer 2 was targeted as a polymerization precursor. The more stable tributyltin was used as the functional group in the CDT unit because trimethyltin is not very stable during the purification procedure. An optimized Stille cross-coupling procedure (Scheme 1) was conducted in comparatively mild reaction condition as low as 70° C., which would allow for the regioselectively more preferred reaction at the C4-position of Br$_2$PT to form DA monomers 2a and 2b since more forcing conditions were needed for the C7-position. It was found that higher temperatures result in relatively complex mixtures that require tedious separation procedures. The isolation of 2a and 2b followed by microwave assisted Stile self-polymerization with Ph(PPh$_3$)$_4$ as catalyst in xylenes afforded regioregular P1a and P1b with precisely controlled PT regularity along polymer backbone. It was found that P1b with longer alkyl side chain yielded a higher molecular weight of 28.1 kDa than P1a with shorter alkyl side chains (15.4 kDa), a likely result of increased solubility during the polymerization reaction.

Scheme 2. Synthetic route of P2a and P2b

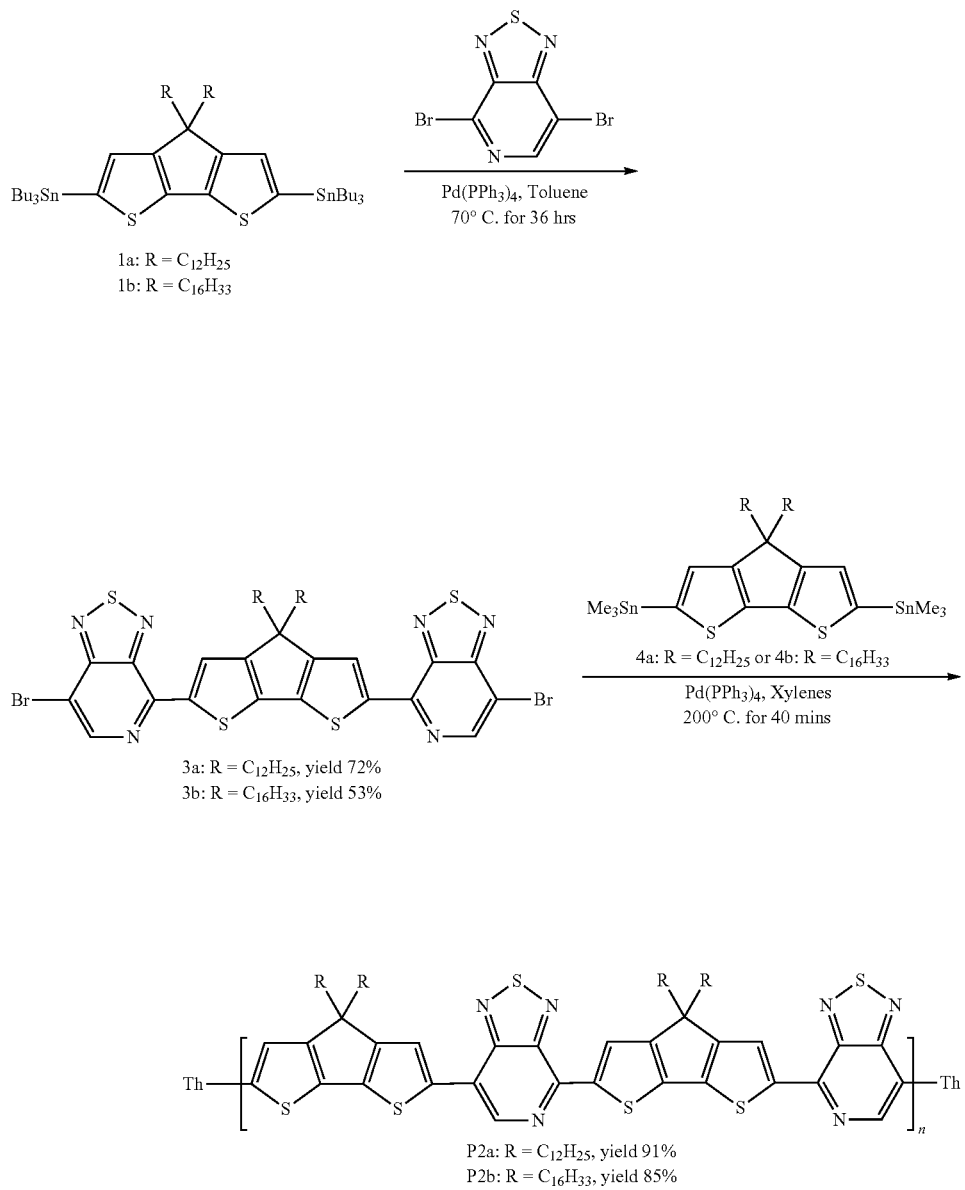

3a: R = C₁₂H₂₅, yield 72%
3b: R = C₁₆H₃₃, yield 53%

P2a: R = C₁₂H₂₅, yield 91%
P2b: R = C₁₆H₃₃, yield 85%

Alternatively, the coupling of 1a and 1b with 2 equivalents of PTBr$_2$ and regioselective reaction of PTBr$_2$ in C4-position can lead to the symmetric acceptor-donor-acceptor (ADA) 3a and 3b (Scheme 2) in high yield, respectively. Two single sharp resonances at 8.57 ppm (H in PT unit) and 8.57 ppm (H in CDT unit) in the $^1$H NMR spectra of both 3a and 3b match very well with their symmetric structures. Microwave assisted Stille polymerization of 3a and 3b with distannylated CDT monomer 4a and 4b yielded regiosymmetric polymers with high molecular weights of 27.1 kDa and 55.9 kDA for P2a and P2b, respectively.

For comparison, the regiorandom copolymers P3a and P3b (Scheme 3), in which the pyridal-N atom in the PT unit is randomly aligned along the polymer backbone, were synthesized via a one-pot polymerization of PTBr$_2$ with distannyl CDT 4a or 4b. The obtained P3a and P3b have molecular weights of 20.0 kDa and 40.2 kDA, respectively.

Scheme 3. Synthetic route of P3a and P3b.

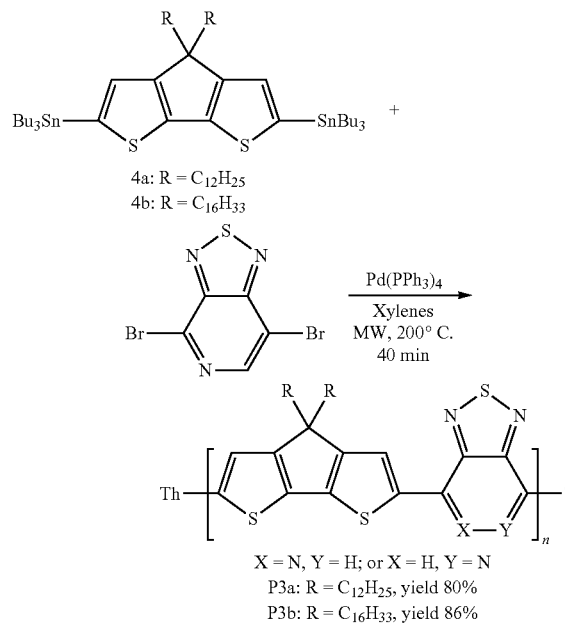

4a: R = C$_{12}$H$_{25}$
4b: R = C$_{16}$H$_{33}$

Pd(PPh$_3$)$_4$
Xylenes
MW, 200° C.
40 min

X = N, Y = H; or X = H, Y = N
P3a: R = C$_{12}$H$_{25}$, yield 80%
P3b: R = C$_{16}$H$_{33}$, yield 86%

To gain insight into the regioregularity of the polymer structures, high temperature $^1$H NMR spectroscopy was utilized (FIG. 1). The experiments where performed in deuterated tetrachloroethane (d-TCE) at 110° C. For all the three polymers P1b, P2b and P3b, the resonance at approximately δ 8.99 ppm could be assigned to the proton in PT unit, and the signal at 8.67 ppm could be assigned to the proton on the CDT moiety closest to the N atom of PT unit. The peaks from the proton in CDT unit situated away from the PT unit show slightly different chemical shifts for P1b (8.14 ppm), P2b (8.16 ppm) and P3b (8.15 ppm). In comparison to the narrow peaks for well-ordered P1b and P2b, the random P3b exhibits much broader peaks which might be generated from the complicated environment of the proton in CDT unit.

Figure 2:
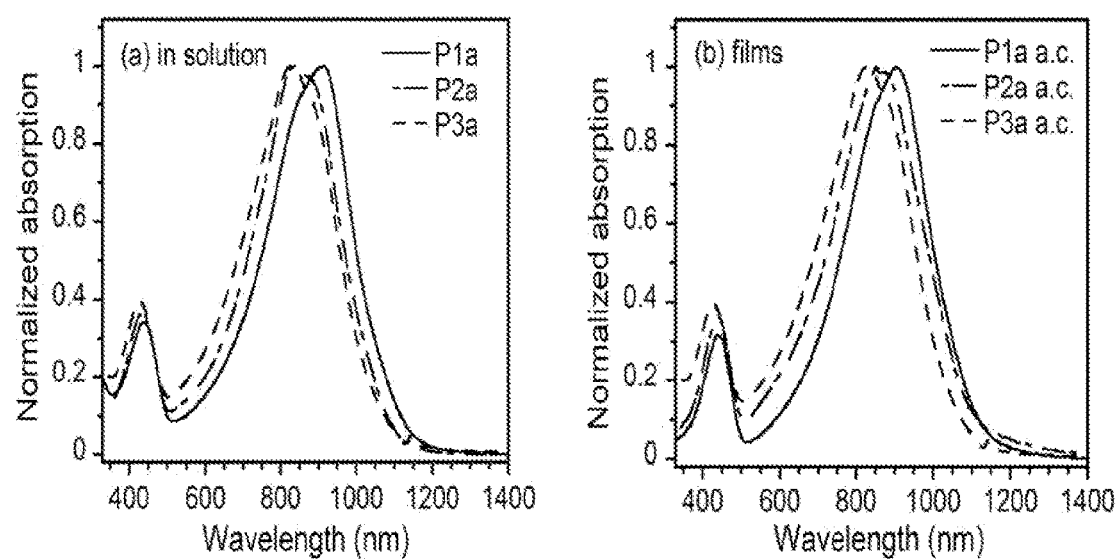
FIG. 2 is a panel of UV-Vis spectra of P1a, P2a and P3a (a) in o-DCB solutions at 25° C. and (b) as casting films.

The influence of the regioregular structure on the effective π-conjugated properties could also be recognized in the UV-vis-near IR absorption of the three classes of polymers (FIG. 2). In o-dichlorobenze solution and as thin films, the maximum absorption ($\lambda_{max}$) exhibits a gradual bathochromic shift from 825 nm for random P3a to 915 nm of regular P1a, and that of P2a lies in-between. Comparing the solution and film spectra, an approximate 50 nm bathochromic shift is observed when transitioning from solution to film, which could be attributed to the polymer interchain self-aggregation. P1b, P2b and P3b with C16 side chains displayed 20-30 nm shift (FIG. 4) to low energy wavelength, such shift could be attributed to the higher molecular weight and longer conjugation along polymer backbones. The optical band-gaps determined from the onset of film absorption were in range of 1.09-1.17 eV for all polymers (Table 3).

TABLE 3

Photophysical properties of polymers

| Polymer | in solution$^a$ | | films$^b$ | | $E_g^{optc}$ (eV) |
|---|---|---|---|---|---|
| | $\lambda_{max}$ (nm) | $\lambda_{max}$ (nm) | $\lambda_{onset}$ (nm) | $\lambda_{onset}$ (nm) | |
| P1a | 915 | 1078 | 905 | 1112 | 1.12 |
| P2a | 835 | 1063 | 864 | 1085 | 1.14 |
| P3a | 825 | 1040 | 840 | 1060 | 1.17 |
| P1b | 930 | 1128 | 920 | 1140 | 1.09 |
| P2b | 885 | 1078 | 885 | 1108 | 1.12 |
| P3b | 880 | 1074 | 870 | 1076 | 1.15 |

$^a$In o-dichlorobenzene solution.
$^b$films were spin-coated from o-dichlorobenzene solution.
$^c$Measurements performed on spin-coated films from the onset of the absorption band.

Figure 5:
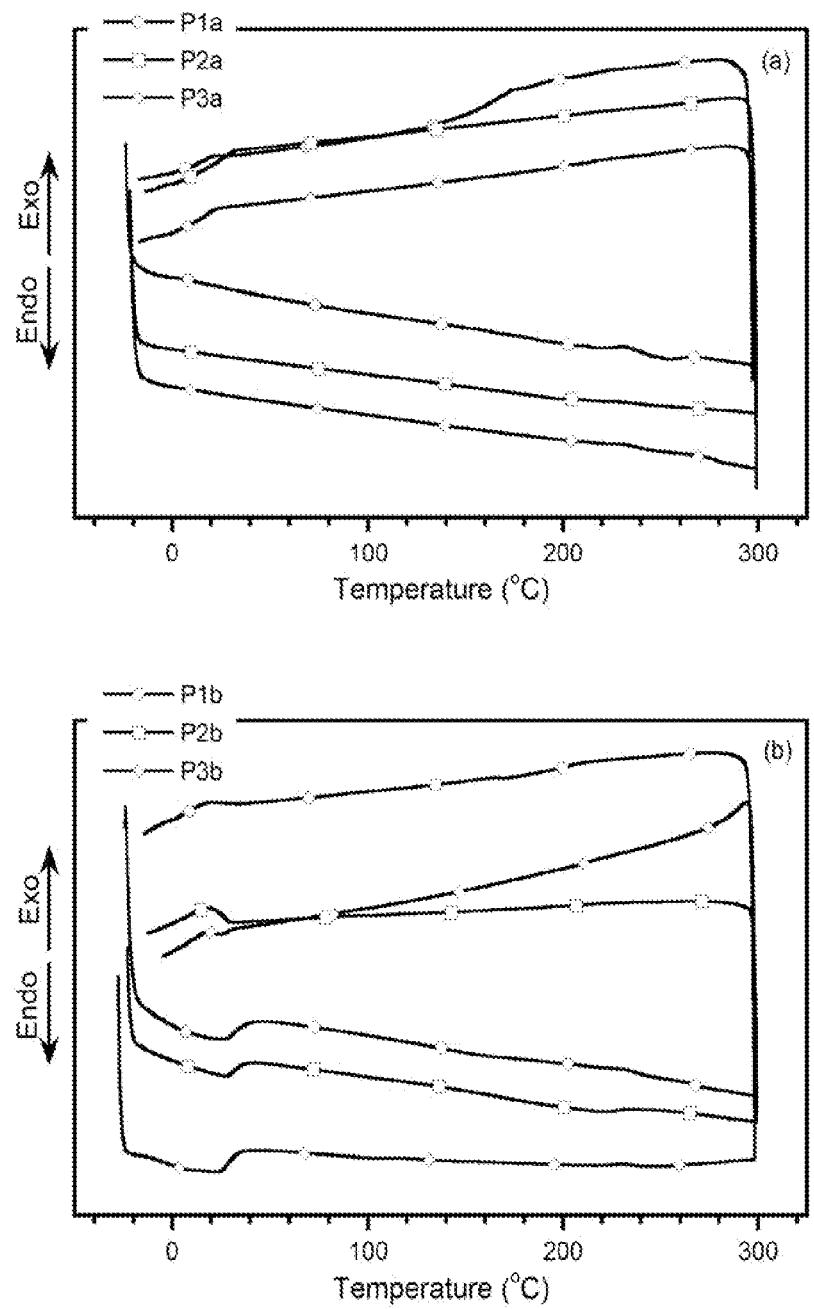
FIG. 5 is a panel of DSC curves of polymers with C12 side chain (a) and C16 side chain (b)

Heating the o-DCB solutions to 110° C. did not distinctly change the absorption profile of the ordered P1a and P2a. However, the random P3a exhibited a 30 nm blue-shift with respect to the 25° C. solution (FIG. 4), possibly indicating the breakup of the aggregates at this temperature. Moreover, the absorption profiles after thermal annealing the films at 110° C. for 15 min. are very similar to the as casted films for all resulted polymers, with no distinct phase transition up to 300° C. by differential scanning calorimetry (DSC) measurement for all polymers (FIG. 5), which might indicate the weak interchain π-π stacking in films.

Figure 6:
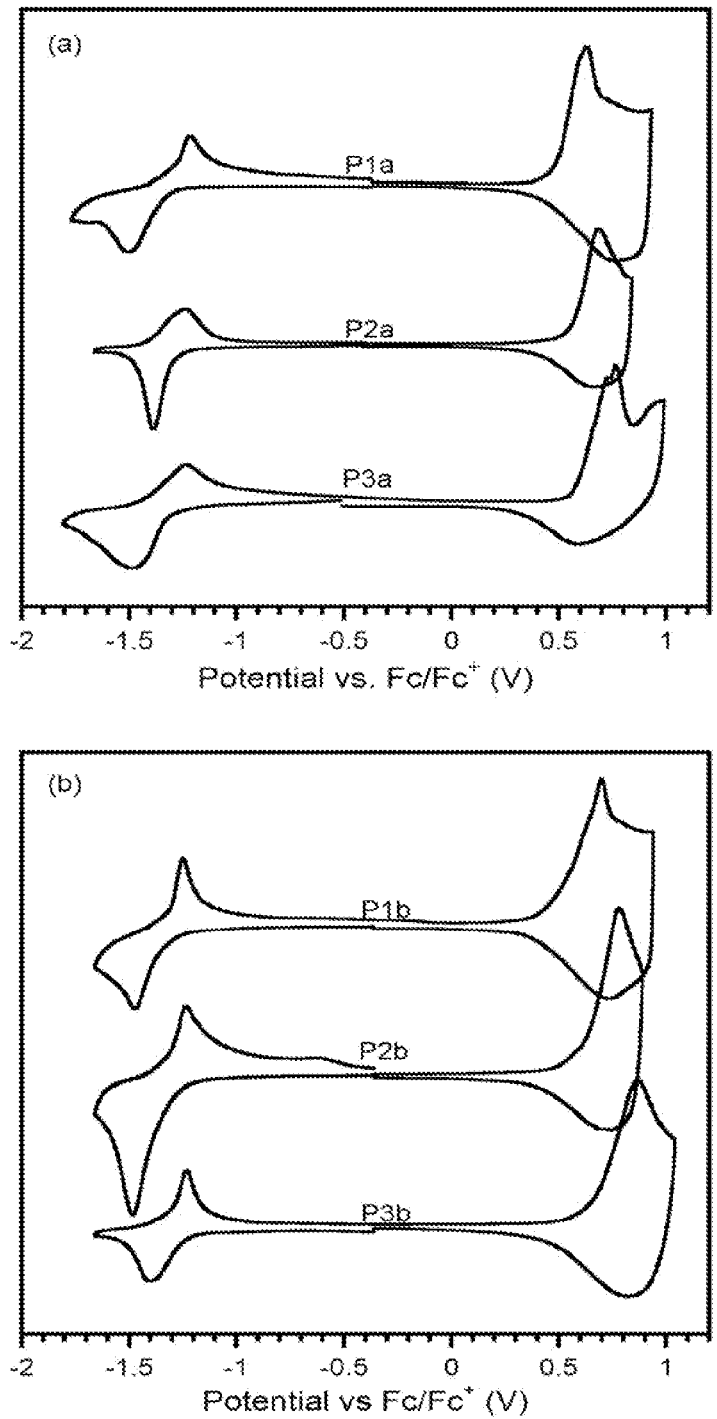
FIG. 6 is a panel of CV curves of polymers with C12 side chain (a) and C16 side chain (b)

The electrochemical properties of all polymers were investigated to gain insight into the affect of polymeric structure on the frontier molecular orbitals. Full details on the cyclic voltammetry (CV) measurements can be found in the supporting information in Example 2 (FIG. 6 and Table 9).

From the data presented in Table 4, it is clear the regioregularity of polymer backbone has minimal affect on the lowest unoccupied molecular orbital (LUMO) level, while the highest occupied molecular orbital (HOMO) level energy is decreased with decreasing backbone order. The increase of the electrochemical band-gap of the random P3a and P3b compared to P2 and P1, again implies less effective charge localization along the polymer backbone. The larger electrochemical band-gap in comparison to the optical band gap could be attributed to the interfacial barrier for charge injection during the CV measurements.

TABLE 4

GPC, CV and optical band-gap data of polymers

| Polymer | $M_n^a$/ kDa | PDI | $E_{HOMO}^b$/ eV | $E_{LUMO}^b$/ eV | $E_g^{cvc}$/ eV | $E_g^{optd}$/ eV |
|---|---|---|---|---|---|---|
| P1a | 15.4 | 1.84 | −5.12 | −3.70 | 1.42 | 1.12 |
| P1b | 28.1 | 1.93 | −5.10 | −3.71 | 1.39 | 1.09 |
| P2a | 27.2 | 2.60 | −5.16 | −3.69 | 1.47 | 1.14 |
| P2b | 55.9 | 4.15 | −5.16 | −3.65 | 1.51 | 1.12 |

TABLE 4-continued

GPC, CV and optical band-gap data of polymers

| Polymer | $M_n{}^a$/ kDa | PDI | $E_{HOMO}{}^b$/ eV | $E_{LUMO}{}^b$/ eV | $E_g{}^{cvc}$/ eV | $E_g{}^{optd}$/ eV |
|---|---|---|---|---|---|---|
| P3a | 20.0 | 2.21 | −5.23 | −3.64 | 1.59 | 1.17 |
| P3b | 40.2 | 2.50 | −5.22 | −3.68 | 1.54 | 1.15 |

[a]Determined by GPC (150° C. in 1,2,4-trichlorobenzene).
[b]Calculated from the onsets of oxidation and reduction peaks, respectively.
[c]Calculated as the difference of the onset of the oxidation and reduction.
[d]Measurements performed on spin-coated films from the onset of the absorption band.

Figure 3A:
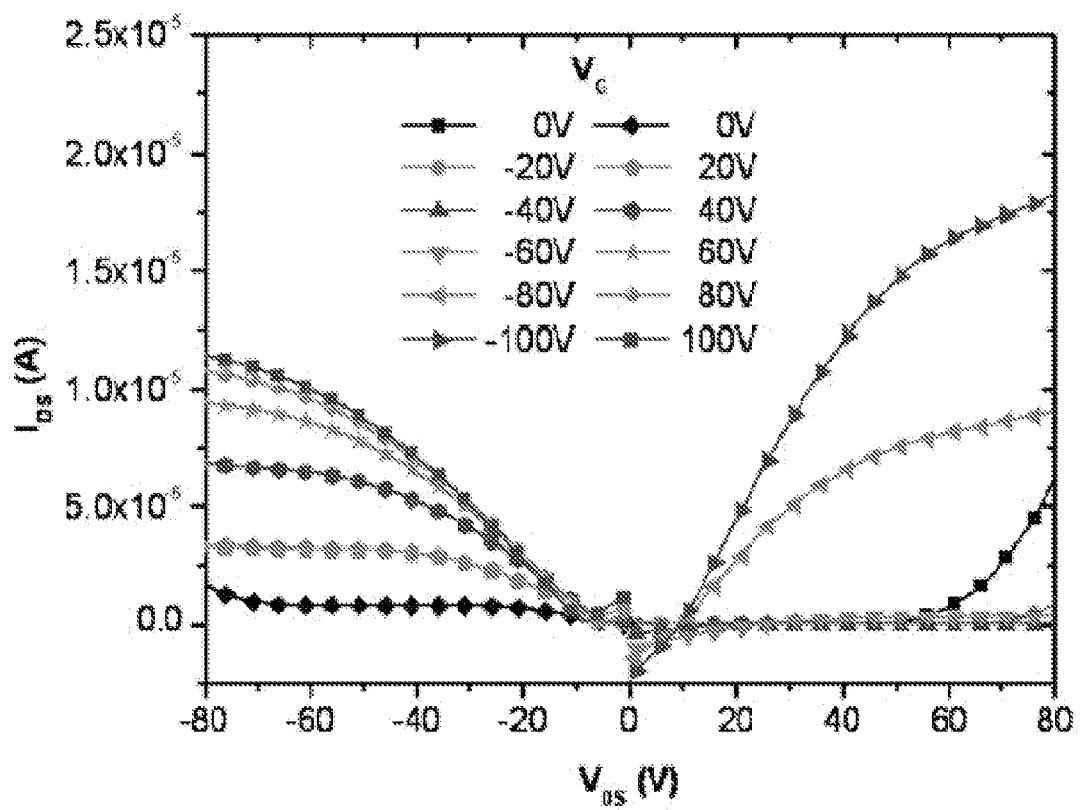
FIG. 3 is a panel showing output (a) and transfer (b) characteristics of FET devices based on P1a with PPCB as passivation layer.
Figure 3B:
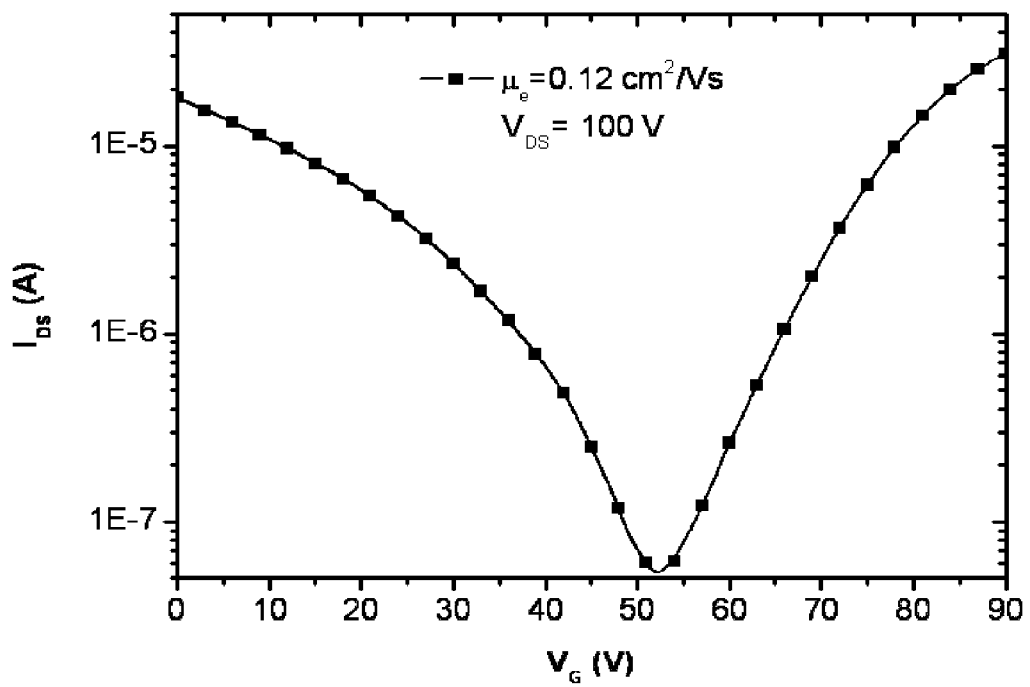
Figure 4A:
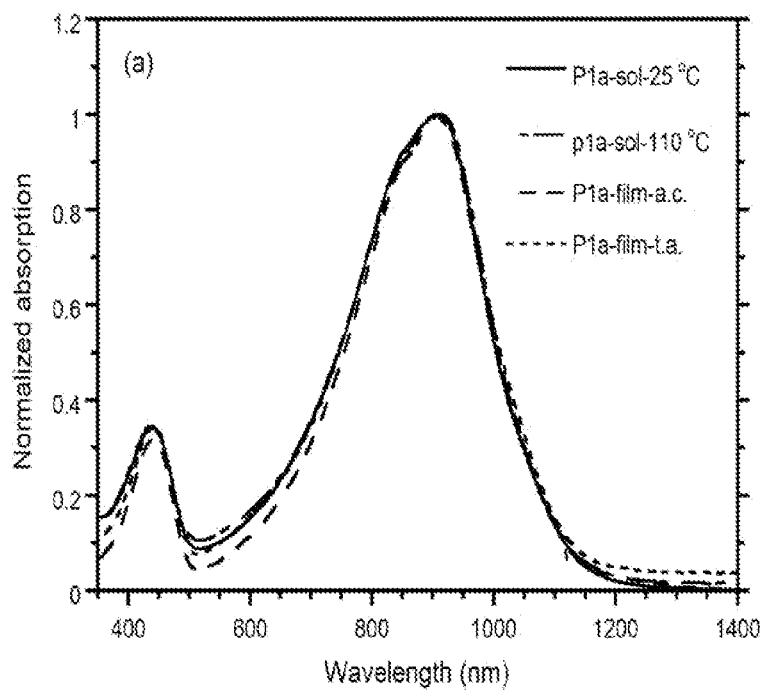
FIG. 4 is a panel of UV-vis spectra of polymers (a) P1a, (b) P1b, (c) P2a, (d) P2b, (e) P3a and (f) P3b in o-DCB solutions at 25 or 110° C., and in films as casting (a.c.) or after thermal annealing (t.a.) at 110° C. for 15 min.
Figure 4B:
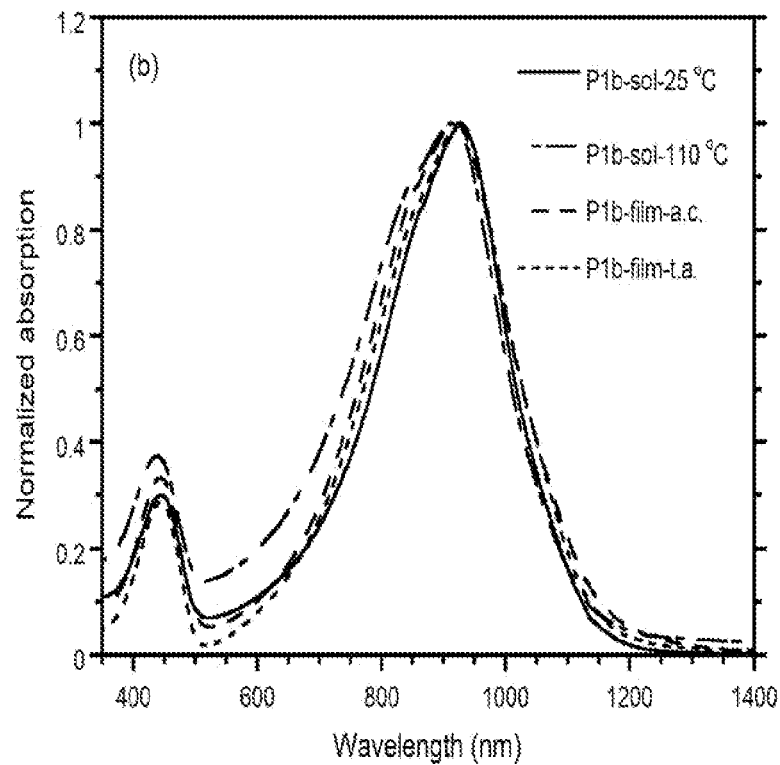
Figure 4C:
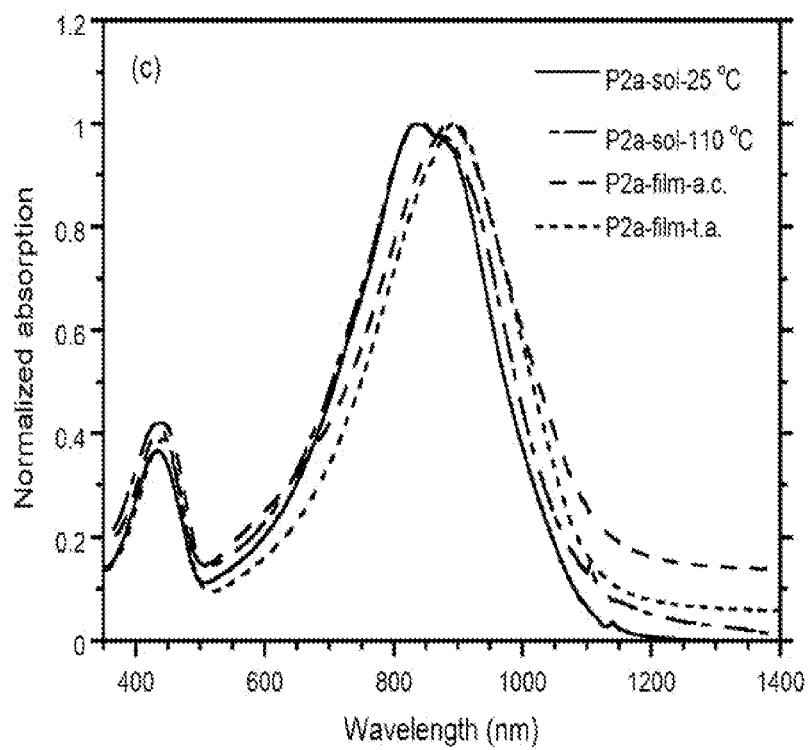
Figure 4D:
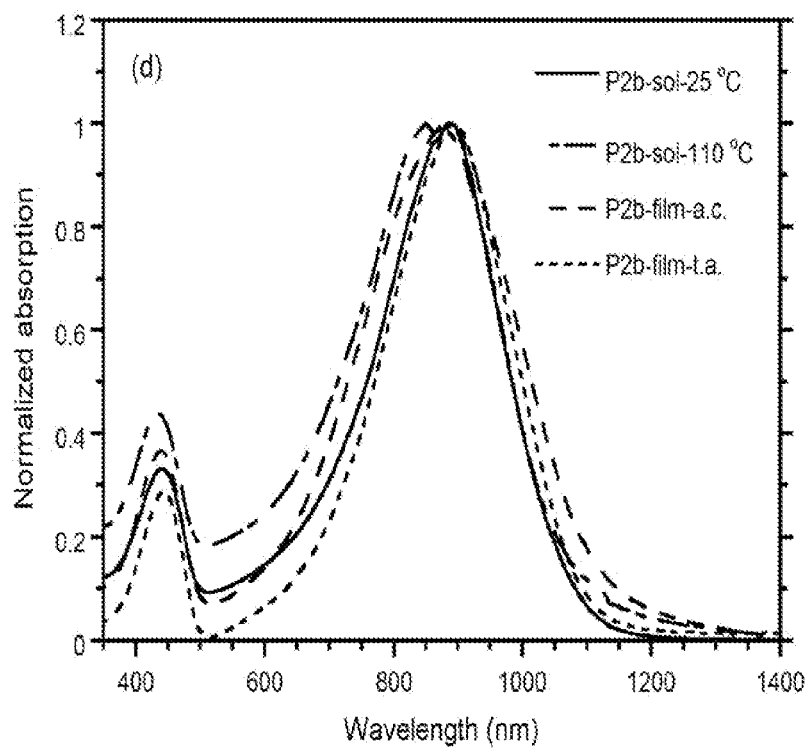
Figure 4E:
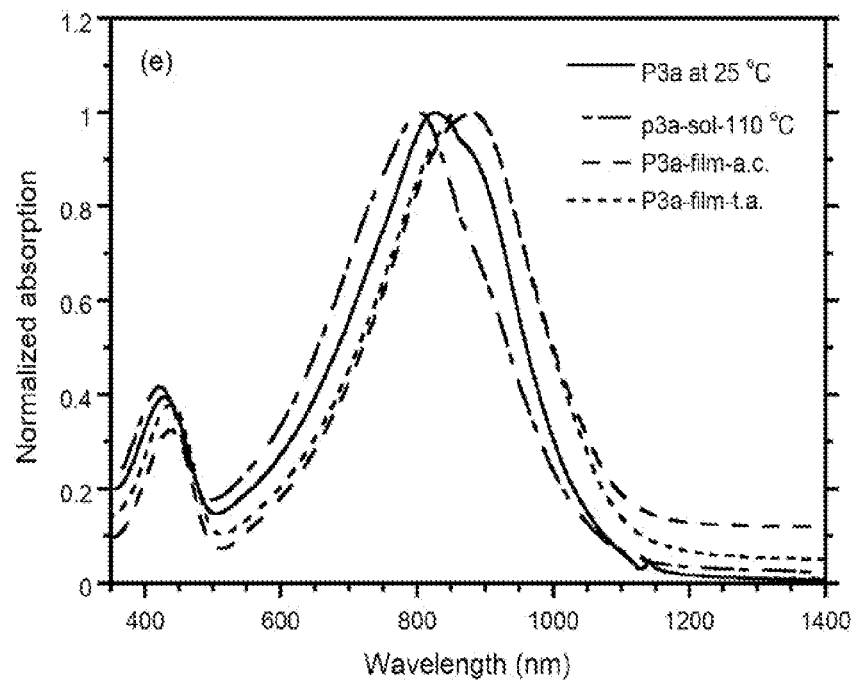
Figure 4F:
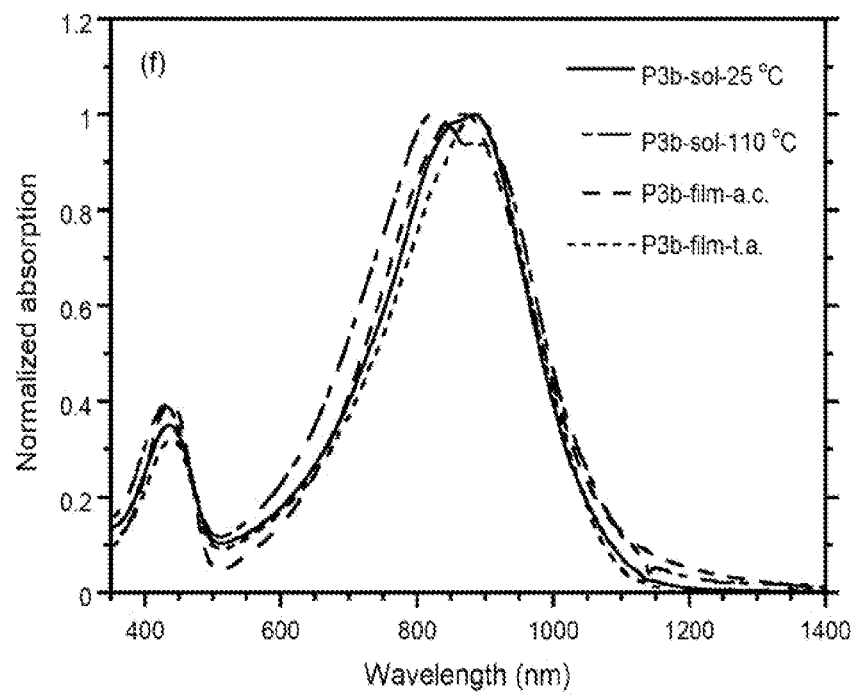
Figure 7:
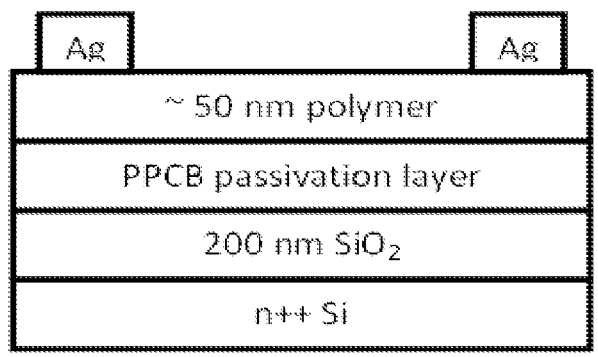
FIG. 7 is a schematic drawing of a device structure with PPCB passivation.
Figure 8:
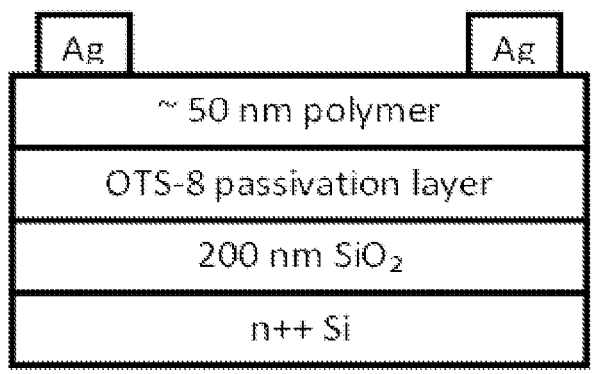
FIG. 8 is a schematic drawing of a device structure with OTS-8 passivation.

Next, the impact of the backbone structure on the charge carrier mobility was investigated. Considering that the low-lying LUMO energy level of polymer will improve electron injection and allow for effective electron transport, ambipolar OFETs based on these polymers were investigated as shown in FIG. 3. Bottom gate, top contact FETs with structure of Si/SiO$_2$/passivation layer/polymer (P1a, P2a or P3a)/Ag were fabricated by spin-coating from polymer solution on a highly n-doped silicon wafer with 200 nm of thermally-grown SiO$_2$ gate dielectrics passivated by PPCB or OTS-8. (FIGS. 7 and 8). Distinct ambipolar characteristics were found at various thermal annealing temperatures. It is noticeable that both P1a and P2a exhibit higher charge mobility than that of the random copolymer P3a (Table 5).

TABLE 5

FET mobility (cm$^2$ V$^{-1}$ s$^{-1}$) of polymers with Ag electrode

| Polymer | 25° C. $\mu_{hole}/\mu_{electron}$ | 90° C. $\mu_{hole}/\mu_{electron}$ | 130° C. $\mu_{hole}/\mu_{electron}$ |
|---|---|---|---|
| P1a$^a$ | 5.6 × 10$^{-3}$/2.7 × 10$^{-2}$ | 1.2 × 10$^{-4}$/4.9 × 10$^{-3}$ | 2.2 × 10$^{-2}$/1.2 × 10$^{-1}$ |
| P1a$^b$ | 4.8 × 10$^{-2}$/2.4 × 10$^{-3}$ | 4.9 × 10$^{-2}$/1.2 × 10$^{-3}$ | 3.5 × 10$^{-2}$/1.6 × 10$^{-3}$ |
| P2a$^a$ | 1.0 × 10$^{-2}$/3.4 × 10$^{-3}$ | 7.7 × 10$^{-3}$/1.4 × 10$^{-2}$ | 1.7 × 10$^{-2}$/9.7 × 10$^{-2}$ |
| P2a$^b$ | 6.4 × 10$^{-2}$/2.0 × 10$^{-2}$ | 6.3 × 10$^{-2}$/5.3 × 10$^{-3}$ | 9.4 × 10$^{-2}$/3.1 × 10$^{-3}$ |
| P3a$^a$ | 1.6 × 10$^{-4}$/2.8 × 10$^{-3}$ | 1.9 × 10$^{-4}$/4.9 × 10$^{-3}$ | 2.2 × 10$^{-4}$/8.3 × 10$^{-3}$ |
| P3a$^b$ | 6.3 × 10$^{-5}$/2.1 × 10$^{-4}$ | 4.7 × 10$^{-5}$/4.4 × 10$^{-5}$ | 4.5 × 10$^{-5}$/3.8 × 10$^{-6}$ |

[a]FET device with PPCB as passivation layer;
[b]OTS-8 as passivation layer

The strongly dependent of mobility of P1a on the annealing temperature was found. The best efficiency was obtained after thermal annealing of the device at 130° C., and the hole and electron mobility passivated by PPCB amounts to 2.2×10$^{-2}$ and 1.2×10$^{-1}$ cm$^2$V$^{-1}$ s$^{-1}$, respectively, which is much higher than that from as-cast films (Table 6). Moreover, for FET based on P2a with OTS-8 passivation layer, the device also shows evident ambipolar behavior, exhibiting a hole and electron mobility of 9.4×10$^{-2}$ and 3.1×10$^{-3}$ cm$^2$V$^{-1}$s−1 upon PPCB passivation, which is also much higher than that of the random P3a (Table 7). The distinct improvement of charge carrier mobility might be attributed to a more uniform orientation of the polymer chains in the solid-state.

TABLE 6

PPCB passivation hole mobility/electron mobility (cm$^2$ V$^{-1}$ s$^{-1}$)

| Polymer | 25° C. | 90° C. | 110° C. | 130° C. | 150° C. |
|---|---|---|---|---|---|
| P1a | 5.6 × 10$^{-3}$/2.7 × 10$^{-2}$ | 1.2 × 10$^{-4}$/4.9 × 10$^{-3}$ | 1.0 × 10$^{-4}$/7.0 × 10$^{-3}$ | 2.2 × 10$^{-2}$/1.2 × 10$^{-1}$ | 1.9 × 10$^{-2}$/9.6 × 10$^{-2}$ |
| P2a | 1.0 × 10$^{-2}$/3.4 × 10$^{-3}$ | 7.7 × 10$^{-3}$/1.4 × 10$^{-2}$ | 9.8 × 10$^{-3}$/5.1 × 10$^{-2}$ | 1.7 × 10$^{-2}$/9.7 × 10$^{-2}$ | 1.4 × 10$^{-2}$/7.3 × 10$^{-2}$ |
| P3a | 1.6 × 10$^{-4}$/2.8 × 10$^{-3}$ | 1.9 × 10$^{-4}$/4.9 × 10$^{-3}$ | 1.0 × 10$^{-4}$/7.0 × 10$^{-3}$ | 2.2 × 10$^{-4}$/8.3 × 10$^{-3}$ | 1.9 × 10$^{-4}$/1.3 × 10$^{-2}$ |

TABLE 7

OTS-8 passivation hole mobility/electron mobility (cm$^2$ V$^{-1}$ s$^{-1}$)

| Polymer | 25° C. | 90° C. | 110° C. | 130° C. | 150° C. |
|---|---|---|---|---|---|
| P1a | 4.8 × 10$^{-2}$/2.4 × 10$^{-3}$ | 4.9 × 10$^{-2}$/1.2 × 10$^{-3}$ | 4.5 × 10$^{-2}$/2.0 × 10$^{-3}$ | 3.5 × 10$^{-2}$/1.6 × 10$^{-3}$ | 4.5 × 10$^{-2}$/1.6 × 10$^{-3}$ |
| P2a | 6.4 × 10$^{-2}$/2.0 × 10$^{-2}$ | 6.3 × 10$^{-2}$/5.3 × 10$^{-3}$ | 6.2 × 10$^{-2}$/1.4 × 10$^{-3}$ | 9.4 × 10$^{-2}$/3.1 × 10$^{-3}$ | 8.8 × 10$^{-2}$/1.1 × 10$^{-3}$ |
| P3a | 6.3 × 10$^{-5}$/2.1 × 10$^{-4}$ | 4.7 × 10$^{-5}$/4.4 × 10$^{-5}$ | 3.2 × 10$^{-5}$/3.7 × 10$^{-5}$ | 4.5 × 10$^{-5}$/3.8 × 10$^{-6}$ | 7.1 × 10$^{-5}$/3.3 × 10$^{-6}$ |

Figure 9:
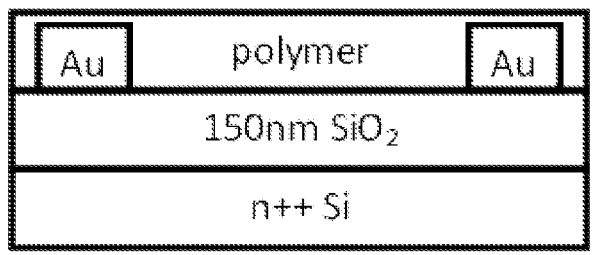
FIG. 9 is a schematic drawing of a bottom-gate, bottom contact device structure.

The on/off ratio of the top contact device with silver electrode is approximately 500. In order to achieve a higher on/off ratio, gold with a deeper work function was selected as electrode and moreover, bottom gate, and bottom contact FETs were fabricated based on polymers with C16 side chain (FIG. 9). It was found that after thermal annealing at 110° C. for 10 min, the hole mobility reached 0.15 and 0.14 cm$^2$ for P1b and P2b, respectively, which are much higher than the 0.025 cm$^2$V$^{-1}$ s$^{-1}$ obtained by random copolymer P3b. The current on/off ratios for all FETs are improved to ~10$^4$ for all devices (Table 8).

TABLE 8

Temperature-dependent FET hole mobilities obtained from saturation regime ($\mu_{hole}$, cm$^2$ V$^{-1}$ s$^{-1}$), and current on/off ratios (I$_{on}$:I$_{off}$) for polymers on Mitsubishi bottom-contact substrate, no passivation layer, 20 μm channel length.

| Polymer | 25° C. | | 90° C. | | 110° C. | |
|---|---|---|---|---|---|---|
| | $\mu_{hole}$ | I$_{on}$:I$_{off}$ | $\mu_{hole}$ | I$_{on}$:I$_{off}$ | $\mu_{hole}$ | I$_{on}$:I$_{off}$ |
| P1b | 1.2 × 10$^{-2}$ | 4.0 × 10$^3$ | 9.3 × 10$^{-3}$ | 3.7 × 10$^4$ | 1.5 × 10$^{-1}$ | 1.0 × 10$^4$ |
| P2b | 1.3 × 10$^{-2}$ | 5.0 × 10$^4$ | 1.7 × 10$^{-2}$ | 3.2 × 10$^4$ | 1.4 × 10$^{-1}$ | 3.8 × 10$^4$ |
| P3b | 2.6 × 10$^{-3}$ | 1.2 × 10$^4$ | 1.5 × 10$^{-3}$ | 6.0 × 10$^3$ | 2.5 × 10$^{-2}$ | 4.0 × 10$^4$ |

* The devices were post-annealed.

In summary, CDT and PT based narrow band-gap polymers with well-ordered main chain were prepared by precisely controlled regioselective chemistry. The resulted copolymers with regioregular structures show much longer conjugation length and better charge localization along the polymer backbone. The low-lying LUMO energy levels were realized for all polymers with the strong electron PT as acceptor, which resulted in the emergence of ambipolar properties for OFET devices. It was found that the regioregular polymers show much higher mobilities than the random copolymers under different OFET device configurations.

Example 2

Instruments

Nuclear magnetic resonance (NMR) spectra were obtained on Bruker Avance DMX500 MHz spectrometer. Microwave assisted polymerizations were performed in a Biotage Initiator™ microwave reactor. Gel permeation chromatography (135° C. in 1,2,4-trichlorobenzene) was performed on a Polymer Laboratories PL220 Chromatograph. Differential scanning calorimetry (DSC) was determined by a TA Instruments DSC (Model Q-20) with about 5 mg polymers samples at a rate of 10° C./min in the temperature range of −20 to 300° C. UV-Vis absorption spectra were recorded on a Shimadzu UV-2401 PC dual beam spectrometer. Cyclic voltammetry (CVs) measurements were conducted using a standard three-electrode configuration under an argon atmosphere. A three-electrode cell equipped with a glassy carbon working electrode, a Ag wire reference electrode, and a Pt wire counterelectrode was employed. The measurements were performed in absolute acetonitrile with tetrabutylammonium hexafluorophosphate (0.1 M) as the supporting electrolyte at a scan rate of 50-100 mV/s. Polymer films were drop-cast onto the glassy carbon working electrode from a 2 mg/ml chloroform solution. The ferrocene/ferrocenium (Fc/Fc$^+$) redox couple was used as an internal reference (see FIG. 6 and Table 9).

TABLE 9

CV data of polymers

| Polymer | E$_{onset}$[a]/V | E$_{1/2}$[b]/V | E$_{HOMO}$[f]/eV | E$_{onset}$[c]/V | E$_{1/2}$[d]/V | E$_{LUMO}$[f] [eV] | E$_g$[e] [eV] |
|---|---|---|---|---|---|---|---|
| P1a | 0.32 | 0.62 | −5.12 | −1.10 | −1.36 | −3.70 | 1.42 |
| P2a | 0.36 | 0.63 | −5.16 | −1.11 | −1.33 | −3.69 | 1.47 |
| P3a | 0.43 | 0.65 | −5.23 | −1.16 | −1.36 | −3.64 | 1.59 |
| P1b | 0.30 | 0.67 | −5.10 | −1.09 | −1.38 | −3.71 | 1.39 |

TABLE 9-continued

CV data of polymers

| Polymer | $E_{onset}{}^a$/V | $E_{1/2}{}^b$/V | $E_{HOMO}{}^f$/ eV | $E_{onset}{}^c$/V | $E_{1/2}{}^d$/V | $E_{LUMO}{}^f$ [eV] | $E_g{}^e$ [eV] |
|---------|---------|---------|---------|---------|---------|---------|---------|
| P2b | 0.36 | 0.70 | −5.16 | −1.15 | −1.38 | −3.65 | 1.51 |
| P3b | 0.42 | 0.81 | −5.22 | −1.12 | −1.32 | −3.68 | 1.54 |

[a] the oxidation onset potential;
[b] the oxidation redox potential $E_{1/2} = (E_{pa} + E_{pc})/2$;
[c] the reduction onset potential;
[d] the reduction redox potential $E_{1/2} = (E_{pa} + E_{pc})/2$;
[e] the band-gap was calculated by the difference between the onset of oxidation and reduction potential;
[f] $E_{HOMO} = -e(E_{ox} + 4.80)$ (eV), $E_{LUMO} = -e(E_{red} + 4.80)$ (eV), the potential of Ag reference calibrated by Fc/Fc$^+$.

Materials

4H-Cyclopenta[2,1-b:3,4-b']dithiophene (CDT) was purchased from WuXi AppTec Corporation. Toluene, THF and xylenes were purified according to standard procedures and distilled under nitrogen before use.

Synthesis of Monomers (4,4-Didodecyl-4H-cyclopenta[1,2-b:5,4-b']dithiophene-2,6-diyl)bis(tributylstannane) (1a)

A dry three-neck round bottom flask was equipped with a Schlenk adapter, dropping funnel, and rubber septum. Under nitrogen, 4,4-didodecyl-4H-cyclopenta[1,2-b:5,4-b']dithiophene (0.51 g, 1 mmol) was dissolved in dry THF (12 ml) and cooled −78° C. using a dry ice/acetone cold bath. Under nitrogen, a solution of t-butyllithium (1.7 M in pentane, 1.25 ml, 2.1 mmol) was added dropwise over 15 minutes to the reaction vessel. The reaction was stirred at −78° C. under nitrogen for one hour and at 25° C. for 5 hours. Then tributyltin chloride (0.81 g, 2.5 mmol) was added dropwise over 5 minutes to the reaction vessel via syringe at −78° C. The reaction was stirred at −78° C. under nitrogen for 1 hour and subsequently warmed to room temperature and stirred overnight. The mixture was then poured into deionized water (3×100 ml) and the organic phase was extracted with hexanes (3×100 ml). The organic phases were collected and washed with deionized water (5×100 ml), dried over sodium sulphate, filtered, and concentrated. The crude product was purified by flash column chromatography (Silica should be pretreated with 10 v/v % triethylamine/hexane solution) and dried under high vacuum to give 1.04 g of final product as yellowish oil, yield 95%. $^1$H NMR (500 MHz, CDCl$_3$) δ (ppm): 6.93 (s, 2H), 1.81-1.78 (m, 4H), 1.61-1.56 (m, 12H), 1.36-1.08 (m, 60H), 0.98-0.75 (m, 28H).

(4,4-Dihexadecyl-4H-cyclopenta[1,2-b:5,4-b']dithiophene-2,6-diyl)bis(tributylstannane) (1b)

A dry three-neck round bottom flask was equipped with a Schlenk adapter, dropping funnel, and rubber septum. Under nitrogen, 4,4-didodecyl-4H-cyclopenta[1,2-b:5,4-b']dithiophene (0.63 g, 1 mmol) was dissolved in dry THF (12 ml) and cooled −78° C. using a dry ice/acetone cold bath. Under nitrogen, a solution of t-butyllithium (1.7 M in pentane, 1.25 ml, 2.1 mmol) was added dropwise over 15 minutes to the reaction vessel. The reaction was stirred at −78° C. under nitrogen for one hour and at 25° C. for 5 hours. Then tributyltin chloride (0.81 g, 2.5 mmol) was added dropwise over 5 minutes to the reaction vessel via syringe at −78° C. The reaction was stirred at −78° C. under nitrogen for 1 hour and subsequently warmed to room temperature and stirred overnight. The mixture was then poured into deionized water (3×100 ml) and the organic phase was extracted with hexanes (3×100 ml). The organic phases were collected and washed with deionized water (5×100 ml), dried over sodium sulphate, filtered, and concentrated. The crude product was purified by flash column chromatography (Silica should be pretreated with 10 v/v % triethylamine/hexane solution) and dried under high vacuum to give 1.14 g of final product as yellowish oil, yield 95%. $^1$H NMR (500 MHz, CDCl$_3$) δ (ppm): 6.98 (s, 2H), 1.86 (m, 4H), 1.78-1.52 (m, 12H), 1.46-1.12 (m, 80H), 1.01-0.88 (m, 24H). $^{13}$C NMR (125 MHz, CDCl$_3$) δ (ppm): 158.34, 140.37, 133.89, 127.78, 50.13, 35.90, 32.76, 30.02, 29.68, 28.20, 27.80, 27.75, 27.55, 27.46, 27.18, 27.09, 27.00, 25.94, 25.52, 25.33, 25.30, 25.07, 24.94, 23.37, 22.76.

7-Bromo-4-(4,4-didodecyl-6-(tributylstannyl)-4H-cyclopenta[1,2-b:5,4-b']dithiophen-2-yl)-[1,2,5]thiadiazolo[3,4-c]pyridine (2a)

To a solution of 4,7-dibromo-pyridal[2,1,3]thiadiazole (0.28 g, 0.95 mmol) and 1a (1.04 g, 0.95 mmol) in freshly distilled toluene (10 ml) was added Pd(PPh$_3$)$_4$ (109.8 mg, 0.095 mmol) under nitrogen, and then capped with a rubber septum. The reaction mixture was stirred at 75° C. for 10 hours. The solvent was removed and purified by column chromatography (silica was pretreated by 10 v/v % triethylamine/hexane solution) with hexane as eluent. The column separation was repeated for 3 times to give 0.31 g of viscous purple oil, yield 30%. $^1$H NMR (500 MHz, CD$_2$Cl$_2$) δ (ppm): 8.55 (s, 1H), 8.53 (s, 1H), 7.01 (s, 1H), 1.95-1.91 (m, 4H), 1.63-1.56 (m, 6H), 1.37-1.31 (m, 6H), 1.26-1.12 (m, 42H), 1.08-0.97 (m, 4H), 0.91-0.82 (m, 15H); $^{13}$C NMR (CDCl$_3$, 125 MHz) δ (ppm): 163.11, 160.01, 156.33, 148.10, 147.92, 145.92, 143.99, 142.26, 141.81, 140.27, 129.80, 127.62, 106.17, 37.85, 31.88, 29.96, 29.61, 29.52, 29.34, 29.31, 28.98, 27.21, 24.57, 22.66, 13.85, 13.44, 10.95.

7-Bromo-4-(4,4-dihexadecyl-6-(tributylstannyl)-4H-cyclopenta[1,2-b:5,4-b']dithiophen-2-yl)-[1,2,5]thiadiazolo[3,4-c]pyridine (2b)

To a solution of 4,7-dibromo-pyridal[2,1,3]thiadiazole (0.28 g, 0.95 mmol) and 1b (1.14 g, 0.95 mmol) in freshly distilled toluene (10 ml) was added Pd(PPh$_3$)$_4$ (109.8 mg, 0.095 mmol) under nitrogen, and then capped with a rubber septum. The reaction mixture was stirred at 75° C. for 10 hours. The solvent was removed and purified by column chromatography (silica was pretreated by 10 v/v % triethylamine/hexane solution) with hexane as eluent. The column separation was run for 3 times to give 268 mg of viscous purple oil, with yield of 25%. $^1$H NMR (500 MHz, CDCl$_3$)

δ (ppm): 8.92 (s, 1H), 8.49 (s, 1H), 7.39 (s, 1H), 2.21 (m, 4H), 1.77 (m, 6H), 1.54-1.25 (m, 68H), 1.12-1.01 (m, 15H). $^{13}$C NMR (125 MHz, CD$_2$Cl$_2$) δ (ppm): 163.10, 160.00, 156.32, 148.09, 147.92, 145.93, 144.00, 142.24, 141.83, 140.28, 129.79, 127.62, 106.17, 53.53, 37.86, 31.92, 29.97, 29.66, 29.63, 29.59, 29.54, 29.42, 29.39, 29.35, 29.32, 29.29, 29.02, 28.99, 27.21, 24.58, 22.69, 22.65, 13.88, 13.45, 10.96.

4,4'-(4,4-Didodecyl-4H-cyclopenta[1,2-b:5,4-b']dithiophene-2,6-diyl)bis(7-bromo-[1,2,5]thiadiazolo[3,4-c]pyridine) (3a)

To a solution of 4,7-dibromo-pyridal[2,1,3]thiadiazole (0.22 g, 0.75 mmol) and 1a (0.27 g, 0.25 mmol) in freshly distilled toluene (10 ml) was added Pd(PPh$_3$)$_4$ (28.9 mg, 0.025 mmol) under nitrogen. The reaction mixture was stirred at 75° C. for 48 hours. Then the solvent was removed and the mixture was purified by column chromatography with chloroform/hexane (from 0 to 60 v/v %). Then the crude product was precipitated from dichloromethane and methanol to give 0.17 mg of purple oil, yield 72%. $^1$H NMR (500 MHz, CDCl$_3$) δ (ppm): 8.63 (s, 2H), 8.57 (s, 2H), 2.06-2.03 (m, 4H), 1.26-1.13 (m, 40H), 1.09 (t, J=4.0 Hz, 6H); $^{13}$C NMR (125 MHz, CD$_2$Cl$_2$) δ (ppm): 162.05, 156.40, 147.88, 147.69, 146.03, 143.60, 143.09, 126.80, 107.39, 54.63, 37.83, 31.87, 29.96, 29.63, 29.59, 29.56, 29.52, 29.34, 29.31, 24.66, 22.66, 14.10.

4,4'-(4,4-Dihexadecyl-4H-cyclopenta[1,2-b:5,4-b']dithiophene-2,6-diyl)bis(7-bromo-[1,2,5]thiadiazolo[3,4-c]pyridine) (3b)

To a solution of 4,7-dibromo-pyridal[2,1,3]thiadiazole (0.44 g, 1.5 mmol) and 1b (0.60 g, 0.5 mmol) in freshly distilled toluene (10 ml) was added Pd(PPh$_3$)$_4$ (57.8 mg, 0.05 mmol) under nitrogen. The reaction mixture was stirred at 75° C. for 48 hours. Then the solvent was removed and the mixture was purified by column chromatography with chloroform/hexane (from 0 to 60 v/v %). Then the crude product was precipitated from dichloromethane and methanol to give 280 mg of purple solid, yield 53%. $^1$H NMR (500 MHz, CDCl$_3$) δ (ppm): 8.66 (s, 2H), 8.59 (s, 2H), 2.07 (m, 4H), 2.07 (m, 4H), 1.32-1.08 (m, 56H), 0.89 (t, J=6.70 Hz, 6H). $^{13}$C NMR (125 MHz, CD$_2$Cl$_2$) δ (ppm): 162.04, 156.34, 147.81, 147.59, 145.96, 143.59, 143.13, 126.79, 107.34, 54.60, 37.80, 31.92, 30.04, 29.65, 29.60, 29.35, 24.73, 22.69, 14.13.

(4,4-Didodecyl-4H-cyclopenta[1,2-b:5,4-b']dithiophene-2,6-diyl)bis(trimethylstannane) (4a)

A dry three-neck round bottom flask was equipped with a Schlenk adapter, dropping funnel, and rubber septum. Under nitrogen, 4,4-didodecyl-4H-cyclopenta[1,2-b:5,4-b']dithiophene (0.51 g, 1 mmol) was dissolved in dry THF (12 ml) and cooled −78° C. using a dry ice/acetone cold bath. Under nitrogen, a solution of t-butyllithium (1.7 M in pentane, 2.35 ml, 4 mmol) was added dropwise over 15 minutes to the reaction vessel. The reaction was stirred at −78° C. under nitrogen for one hour and stirred at room temperature for 3 hours. Under nitrogen, a solution of trimethyltin chloride (1.0 g, 5 mmol) in dry pentane (2 ml) was added dropwise over 5 minutes to the reaction vessel at −78° C. The reaction was stirred at −78° C. under nitrogen for 1 hour and subsequently warmed to room temperature and stirred overnight. The mixture was then poured into deionized water (3×100 ml) and the organic phase extracted with hexanes (3×50 ml). The organic phases were collected and washed with deionized water (3×50 ml), dried over sodium sulphate, filtered, and concentrated. The product was dried under high vacuum with agitation for 48 hours to give 0.80 g of product as colorless oil, yield 95%. $^1$H NMR (500 MHz, CD$_2$Cl$_2$) δ (ppm): 6.94 (s, 2H), 1.79-1.76 (m, 4H), 1.29-1.15 (m, 36H), 1.08-1.02 (m, 4H), 0.88 (t, J=6.0 Hz, 6H), 0.39 (s, 18H).

(4,4-Dihexadecyl-4H-cyclopenta[1,2-b:5,4-b']dithiophene-2,6-diyl)bis(trimethylstannane) (4b)

A dry three-neck round bottom flask was equipped with a Schlenk adapter, dropping funnel, and rubber septum. Under nitrogen, 4,4-didodecyl-4H-cyclopenta[1,2-b:5,4-b']dithiophene (0.63 g, 1 mmol) was dissolved in dry THF (12 ml) and cooled −78° C. using a dry ice/acetone cold bath. Under nitrogen, a solution of t-butyllithium (1.7 M in pentane, 2.35 ml, 4 mmol) was added dropwise over 15 minutes to the reaction vessel. The reaction was stirred at −78° C. under nitrogen for one hour and stirred at room temperature for 3 hours. Under nitrogen, a solution of trimethyltin chloride (1.0 g, 5 mmol) in dry pentane (2 ml) was added dropwise over 5 minutes to the reaction vessel at −78° C. The reaction was stirred at −78° C. under nitrogen for 1 hour and subsequently warmed to room temperature and stirred overnight. The mixture was then poured into deionized water (3×100 ml) and the organic phase extracted with hexanes (3×50 ml). The organic phases were collected and washed with deionized water (3×50 ml), dried over sodium sulphate, filtered, and concentrated. The product was dried under high vacuum with agitation for 48 hours to give 0.92 g of white solid, yield 97%. $^1$H NMR (500 MHz, CD$_2$Cl$_2$) δ (ppm): 7.03 (s, 2H), 1.85 (m, 4H), 1.46-1.18 (m, 52H), 1.04 (n, 4H), 0.92 (t, J=6.65 Hz, 6H), 0.42 (t, 18H). $^{13}$C NMR (125 MHz, CD$_2$Cl$_2$) δ (ppm): 160.57, 142.11, 137.21, 129.58, 52.21, 37.62, 34.63, 34.57, 31.97, 31.94, 31.59, 30.03, 29.69, 29.63, 29.59, 29.36, 25.24, 24.63, 22.66, 20.42, 13.88.

Polymerization of P1a

Monomer 2a (0.16 g, 0.16 mmol) was carefully weighed and added to a 2-5 mL microwave tube. The tube was transferred into a glovebox, and then Pd(PPh$_3$)$_4$ (4.4 mg, 0.005 mmol), and 3.2 mL of xylenes were added into the microwave tube. The tube was sealed, removed from the glovebox and subjected to the following reaction conditions in a microwave reactor: 80° C. for 2 min, 120° C. for 2 min, 160° C. for 2 min and 200° C. for 40 min. The reaction was allowed to cool leaving a viscous liquid containing some solid material. After the polymerization, 2-bromothiophene (1.9 μl, 0.02 mmol) and 2 mL of xylenes was added, the mixture was stirred at 110° C. for 2 hours. And then tributyl(thiophen-2-yl)stannane (0.01 mL, 0.04 mmol) was added dropwise and stirred at 110° C. for 2 hours. Then the mixture was dissolved in hot 1,2-dichlorobenzene, then precipitated into methanol and collected via centrifugation. The residual solid was loaded into a cellulose extraction thimble and washed successively with methanol (3 hrs), hexanes (16 hrs), and acetone (3 hrs). The remaining polymer was dried on a high vacuum line overnight. Yield 92 mg (88%). $^1$H NMR (500 MHz, C$_2$D$_2$Cl$_4$, 110° C.) δ (ppm): 9.00 (s, 1H), 8.67 (s, 1H), 8.14 (s, 1H), 2.30-0.76 (m, 50H). $^{13}$C NMR (Solid-state, 75 MHz), δ (ppm): 159.57, 151.45, 145.77, 142.29, 138.67, 124.42, 116.17, 113.81, 52.57, 36.06, 29.83, 25.53, 22.61, 13.84.

Polymerization of P1b

Monomer 2b (128 mg, 0.11 mmol) and Pd$_2$(dba)$_3$ (5.2 mg, 0.0057 mmol), P(o-Tol)$_3$ (6.9 mg, 0.023 mmol) and freshly distilled xylenes (4 ml) was added to a 2-5 ml microwave tube under nitrogen. The mixture was heated to 95° C. on the oil bath and stirred for 12 hours. After that, tributyl(thiophen-2-yl)stannane (20 µl) was added and the reaction was stirred at 95° C. for 6 hours, then 2-bromothiophene (20 µl) was added and the reaction was stirred for another 6 hours. The mixture was precipitated in methanol, the resulted dark green fibers were collected and was re-dissolved in hot 1,2-dichlorobenzene. Then re-precipitated in methanol and collected via centrifugation. The collected solid fibers were loaded into a cellulose extraction thimble and washed successively with methanol (6 hours), acetone (6 hours), hexanes (12 hours) and chloroform (24 hours). The solid residue in the thimble was collected and dried followed by re-dissolved in hot 1,2-dichlorobenzene, filtrated and re-precipitated in methanol. Then the resulted dark-green fibers were collected via centrifugation, dried over high vacuum line to give 61 mg of polymers, yield 80%. $^1$H NMR (500 MHz, $C_2D_2Cl_4$, 110° C.) δ (ppm): 8.99 (s, 1H), 8.67 (s, 1H), 8.14 (s, 1H), 2.26-0.82 (m, 66H).

Polymerization of P2a

The polymer was prepared following a previously reported microwave assisted polymerization technique. Two monomers 3a (0.18 g, 0.19 mmol) and 4a (0.17 g, 0.20 mmol) were carefully weighed and added to a 2-5 mL microwave tube. The tube was transferred into a glovebox, and then Pd(PPh$_3$)$_4$ (9 mg, 0.008 mmol) and 3 mL of Xylenes were added into the microwave tube. The tube was sealed, removed from the glovebox and subjected to the following reaction conditions in a microwave reactor: 80° C. for 2 min, 120° C. for 2 min, 160° C. for 2 min and 200° C. for 40 min. The reaction was allowed to cool leaving a viscous liquid containing some solid material. After the polymerization, 2-bromothiophene (1.9 µl, 0.02 mmol) and 2 mL of xylenes was added, the mixture was stirred at 110° C. for 2 hours. And then tributyl(thiophen-2-yl)stannane (0.01 mL, 0.04 mmol) was added dropwise and stirred at 110° C. for 2 hours. The mixture was dissolved in hot 1,2-dichlorobenzene, then precipitated into methanol and collected via centrifugation. The residual solid was loaded into a cellulose extraction thimble and washed successively with methanol (4 hrs), hexanes (16 hrs), and acetone (3 hrs). The remaining polymer was dried on a high vacuum line overnight. Yield 225 mg (91%). $^1$H NMR (500 MHz, $C_2D_2Cl_4$, 110° C.) δ (ppm): 8.99 (s, 1H), 8.67 (s, 1H), 8.16 (s, 1H), 2.30-0.72 (m, 50H). $^{13}$C NMR (Solid-state, 75 MHz) δ (ppm): 158.76, 151.90, 143.27, 138.063, 123.15, 117.44, 52.74, 36.06, 29.75, 25.53, 22.55, 13.78.

Polymerization of P2b

Monomers 3b (158.3 mg, 0.15 mmol) and 4b (142.9 mg, 0.15 mmol) were added to a 2-5 mL microwave tube, then Pd(PPh$_3$)$_4$ (8.7 mg, 0.0075 mmol) and freshly distilled xylenes (4 ml) were added into the microwave tube. The tube was sealed and subjected to the following reaction conditions in a microwave reactor: 80° C. for 2 min, 130° C. for 2 min, 170° C. for 2 min and 200° C. for 40 min. The reaction was allowed to cool to room temperature, then tributyl(thiophen-2-yl)stannane (20 µl) was added and the reaction was subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 µl) was added and the end-capping procedure was repeated once again. The mixture was precipitated in methanol, collected via centrifugation. The collected solid fibers were loaded into a cellulose extraction thimble and washed successively with methanol (6 hours), acetone (6 hours), hexanes (12 hours), and the polymer comes out with chloroform (within 2 hours) from the thimble. Chloroform was removed under reduced pressure and resulted dark-green solid was dried over high vacuum line to give 130 mg of polymer, yield 85%. $^1$H NMR (500 MHz, $C_2D_2Cl_4$, 110° C.) δ (ppm): 8.99 (s, 1H), 8.67 (s, 1H), 8.16 (s, 1H), 2.30-0.81 (m, 66H).

Polymerization of P3a

The polymerization was performed following the procedure for P2a in microwave reactor, just replacing monomer 3a by 4,7-dibromo-pyridal[2,1,3]thiadiazole (44.2 mg, 0.15 mmole). The resulted dark-green solid was dried over high vacuum line to give 91 mg of polymer, yield 80%. $^1$H NMR (500 MHz, $C_2D_2Cl_4$, 110° C.) δ (ppm): 8.99 (s, 1H), 8.67 (s, 1H), 8.15 (s, 1H), 2.32-0.79 (m, 50H). $^{13}$C NMR (Solid-state, 75 MHz) δ (ppm): 159.04, 152.06, 142.95, 13839, 124.16, 117.54, 52.87, 36.01, 29.72, 25.67, 22.53, 13.76.

Polymerization of P3b

The polymerization was performed following the procedure for P2b in microwave reactor, just replacing monomer 3b by 4,7-dibromo-pyridal[2,1,3]thiadiazole (44.2 mg, 0.15 mmole). The resulted dark-green solid was dried over high vacuum line to give 101 mg of polymer, yield 86%. $^1$H NMR (500 MHz, $C_2D_2Cl_4$, 110° C.) δ (ppm): 8.99 (s, 1H), 8.67 (s, 1H), 8.15 (s, 1H), 2.35-0.84 (m, 66H).

Example 3A

To apply the regioregular PT based copolymer in an OPV device, we chose indacene-PT based copolymers due to (1) the broad narrow-bandgap absorption, (2) the two thiophene rings rigidified together with a central phenyl ring, which can provide strong intermolecular interactions for ordered packing to improve the charge carrier mobility, and (3) the low-lying HOMO level of the copolymer will provide high open-circuit voltage ($V_{oc}$) (see Jen et al. [11])

Result and Discussion

As shown in Scheme 4, the copolymerization of dibromo monomer Br-PT-IDT-PT-Br (M2) with bis(stannyl) monomer Me$_3$Sn-IDT-SnMe$_3$ (M1) was based on microwave assisted Stile coupling reaction to generate the regioregular indacenothiophene-PT based copolymer (PIPT-RG), which has the N-atom in the PT units selectively faced to the same indacene core. The reference polymer (PIPT-RA) was synthesized based on microwave assisted step-growth Stille copolymerization of M1 and 4,7-dibromo-pyridal[2,1,3]thiadiazole (PTBr$_2$), thus providing the polymer with the N-atom in the PT units randomly distributed along the polymer main chain. Both copolymers were purified by Soxhlet extraction using methanol, acetone, hexane and finally collected by chloroform. The polymer structures are shown in Scheme 5.

Scheme 4
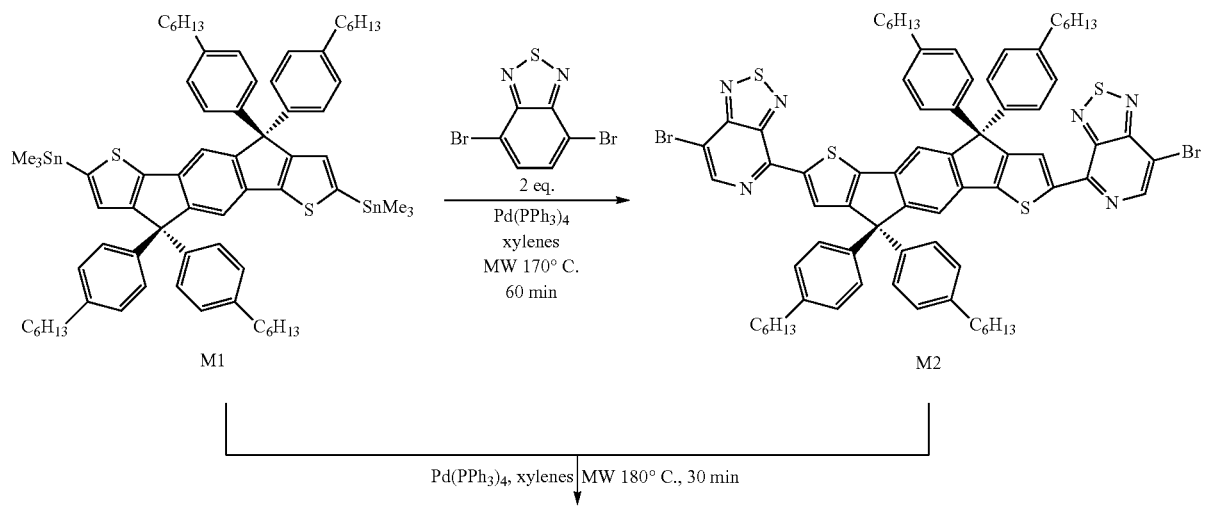
Scheme 5
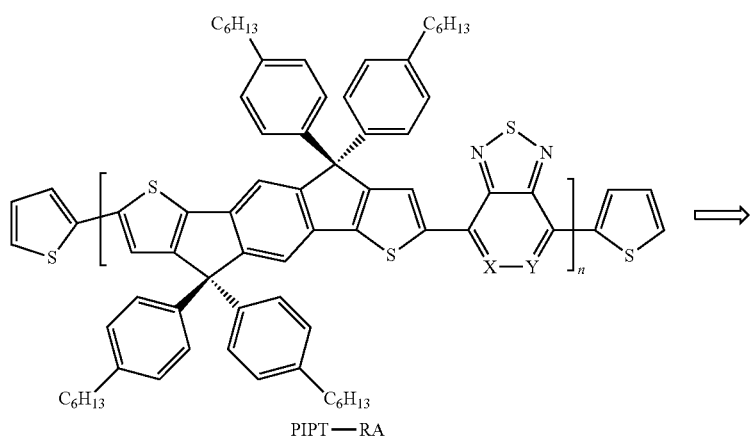

-continued

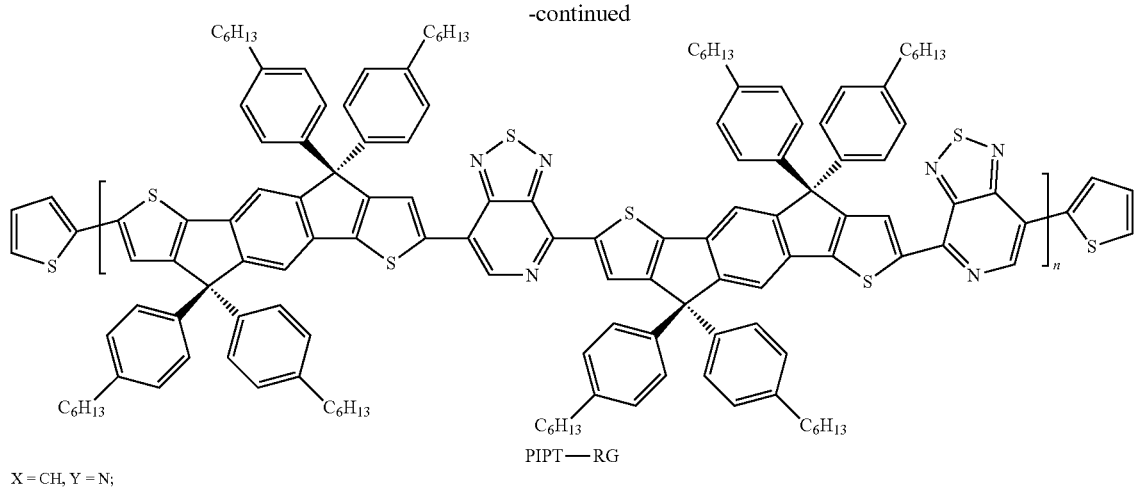

PIPT—RG

X = CH, Y = N;
or X = N, Y = CH

Figure 10:
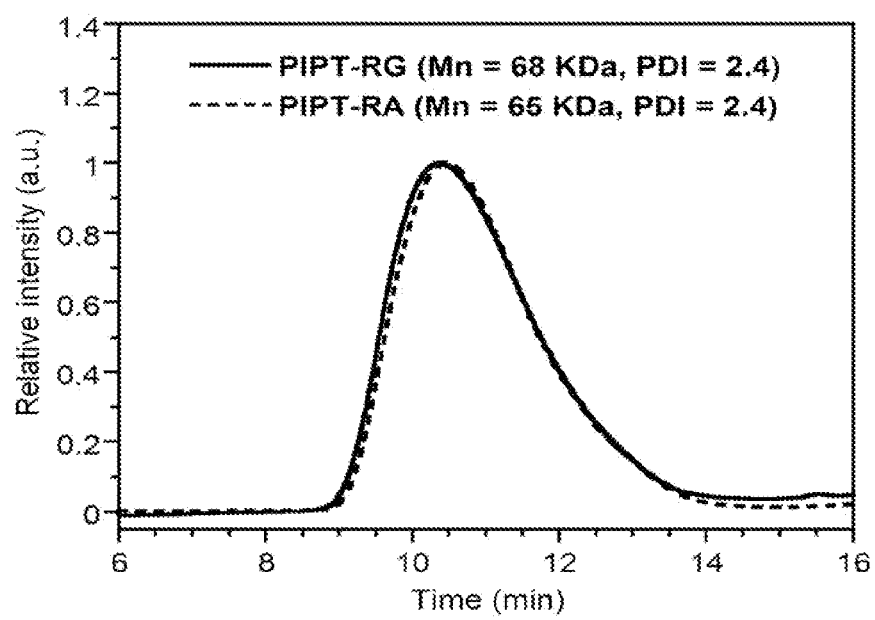
FIG. 10 is a composite drawing of GPC profiles of copolymers with chloroform as eluent.
Figure 11:
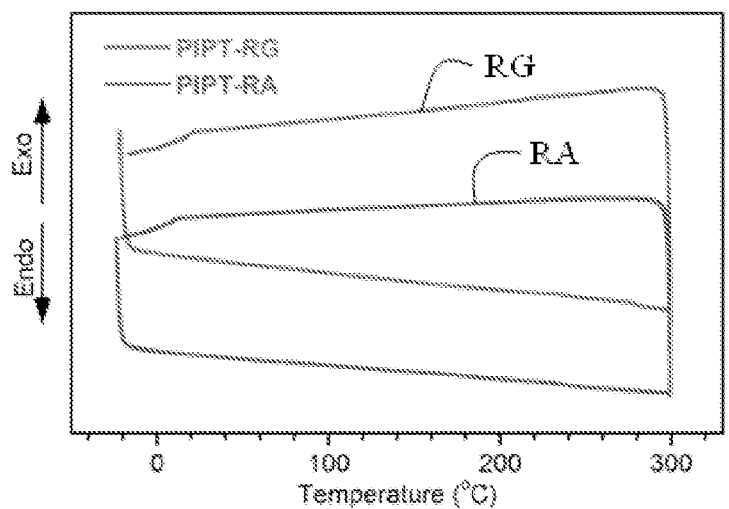
FIG. 11 is a composite drawing of DSC characteristics of copolymers.

The number average molecular weight ($M_n$) estimated by gel permeation chromatography (GPC) with chloroform as eluent and linear polystyrene as the reference at 35° C. is 68 kDa (PDI=2.4) for PIPT-RG and 59 kDa (PDI=2.5) for PIPT-RA; the GPC profiles are shown in FIG. 10. In contrast, GPC in 1,2,4-trichlorobenze (1,2,4-TCB) as eluent at 150° C. gave 46 kDa and 42 kDa for PIPT-RG and PIPT-RA, with a polydispersity of 2.3 and 2.8, respectively. The slightly lower Mn can be attributed to less aggregation in high temperature 1,2,4-TCB solution. Interestingly, both copolymers exhibited excellent solubility of higher than 15 mg/ml in xylenes, chloroform, chlorobenzene as well as 1,2-dichlorobenzene, which provides the opportunity to fabricate thick films based solution process procedures. No noticeable phase transitions were observed by differential scanning calorimetry up to 300° C. in both cases (FIG. 11).

Figure 12:
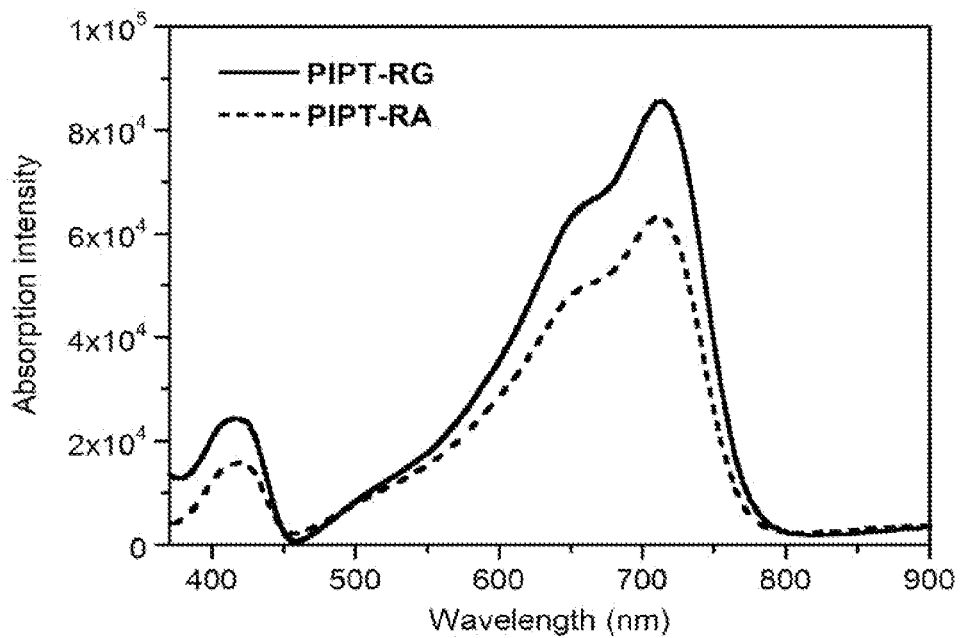
FIG. 12 is a composite drawing of UV-Vis spectra of PIPT-RG and PIPT-RA films (thickness ~30 nm).

UV-Vis absorption profiles of PIPT-RG and PIPT-RA in thin films are shown in FIG. 12. The absorption profile shapes are essentially the same for both copolymers. The short wavelength absorption bas (~417 nm) is assigned to a delocalized excitonic $\pi$-$\pi$* transition and the long wavelength absorption band (~715 nm) is ascribed to intramolecular charge transfer (ICT) interactions between the donor and acceptor moieties. However, the absorption intensity of PIPT-RG is much stronger than that of PIPT-RA, indicating a much higher molar absorption coefficient of PIPT-RG. The optical band gaps ($E_g$) calculated from the absorption onset are determined to be 1.60 eV for PIPT-RG, which is slightly lower than that of 1.62 eV for PIPT-RA.

Figure 13A:
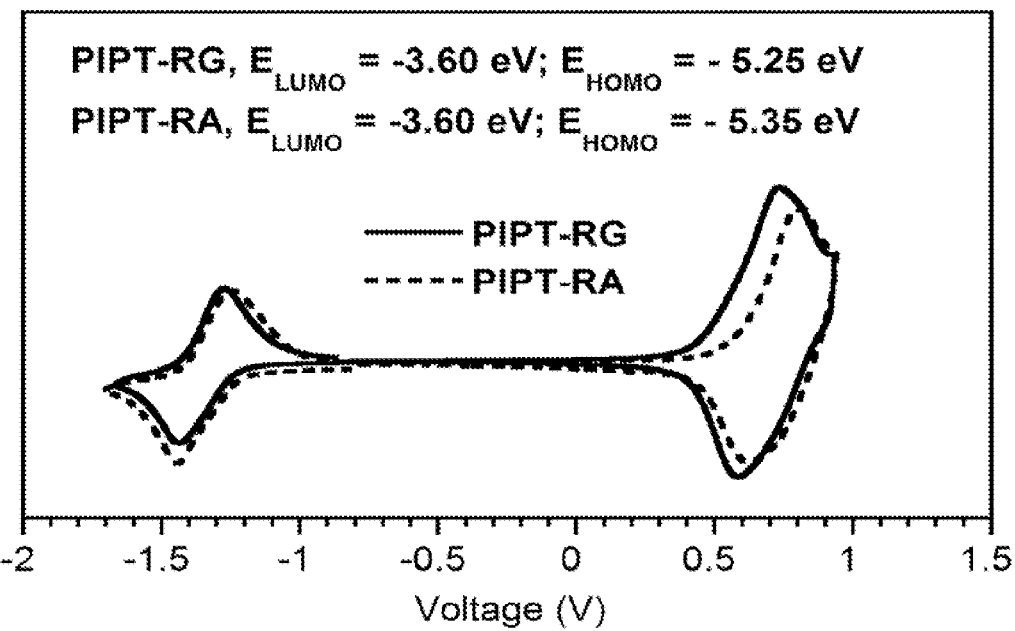
FIG. 13 is a panel of (a) CV curves and (b) UPS measurements of polymer films.
Figure 13B:
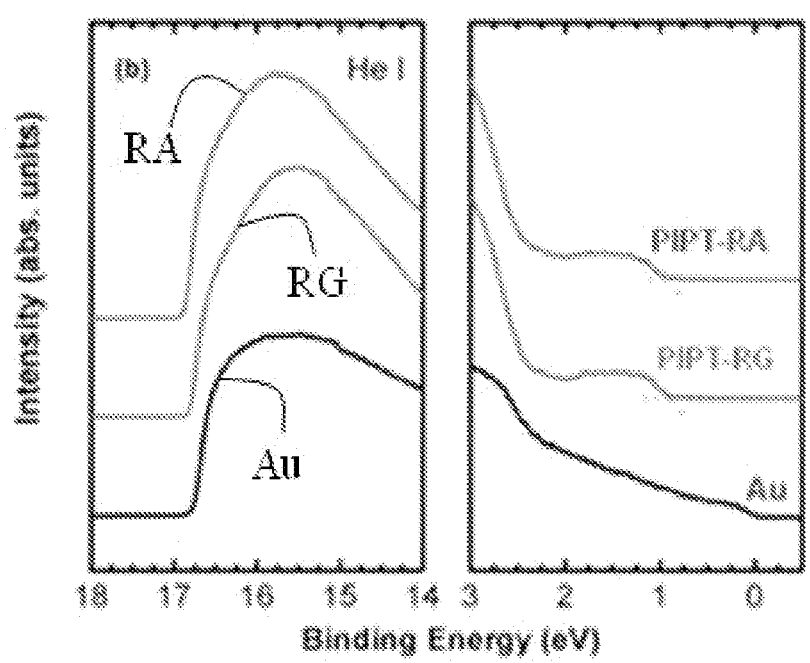

Cyclic voltammetry (CV) and ultraviolet photoelectron spectroscopy (UPS) were employed to evaluate the oxidation/reduction properties and electrical stability of the polymers. As can be seen in the CV curves in FIG. 13a, the onset of reduction ($E_{red}$) of the two copolymers were nearly identical and was located at about -1.20 V versus Ag/Ag$^+$, while the onset of oxidation ($E_{ox}$) were 0.45 V and 0.55 V for PIPT-RG and PIPT-RA, respectively. The slightly higher $E_{ox}$ of PIPT-RA to that of PIPT-RG might be attributed to the more disordered vector of the PT unit along the polymer main chain, which would disturb the $\pi$-conjugated electron distribution along the polymer backbone leading to a slightly raised $E_{ox}$. The highest occupied molecular orbital energy level ($E_{HOMO}$) and the lowest unoccupied molecular orbital energy level ($E_{LUMO}$) were calculated from the $E_{ox}$ and $E_{red}$, on the basis of the assumption that $E_{HOMO}$ of ferrocene/ferrocenium (Fc/Fc$^+$) is at 4.8 eV relative to vacuum. The calculated $E_{HOMO}$ are -5.25 eV and -5.35 eV for PIPT-RG and PIPT-RA, respectively, and the $E_{LUMO}$ are both at -3.60 eV. This is understandable since for such "donor-acceptor" based copolymers, the LUMO is mainly located in the acceptor and the HOMO is well-delocalized along the conjugated backbone, thus the two copolymers exhibited nearly identical $E_{LUMO}$ while slightly different $E_{HOMO}$. Further evaluation by ultraviolet photoelectron spectroscopy (UPS) measurements (FIG. 13b) demonstrated that the $E_{HOMO}$ of the two copolymers are quite similar, located at -5.31 eV and -5.33 eV for PIPT-RG and PIPT-RA, respectively. Nevertheless, the relatively low-lying $E_{HOMO}$ indicated that high $V_{oc}$ could be realized.

Figure 14A:
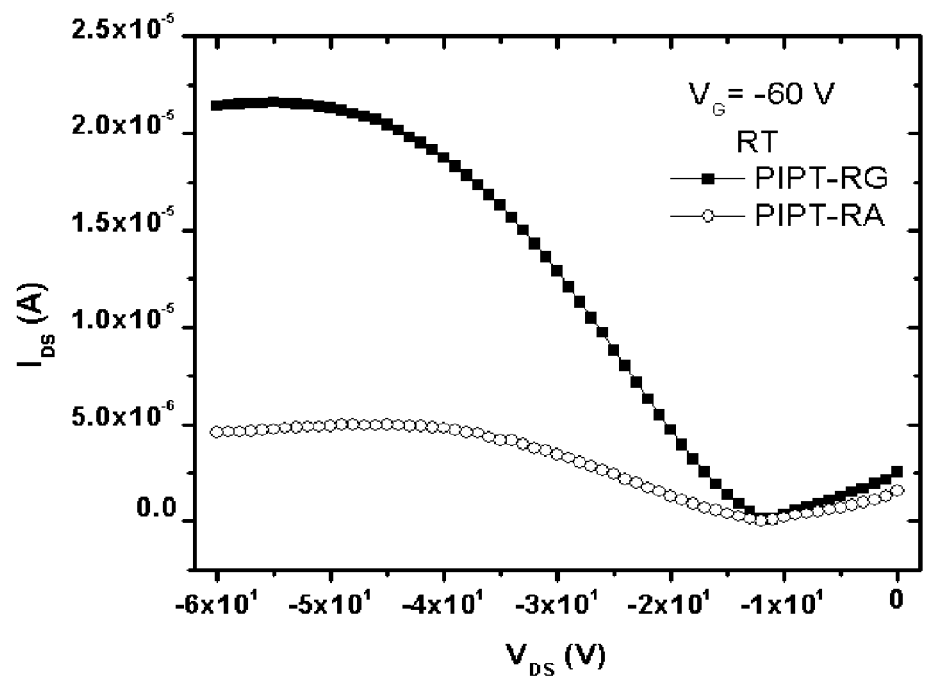
FIG. 14 is a panel of output and transfer characteristics ($V_D$=−60 V) for FETs based on PIPT-RG (black dot) and PIPT-RA (red dot) at room temperature (a) and (d), thermal annealed at 100° C. for 10 min (b) and (e), and thermal annealed at 150° C. for 10 min (c) and (f). FET with channel L=20 μm, W=1 mm.
Figure 14:
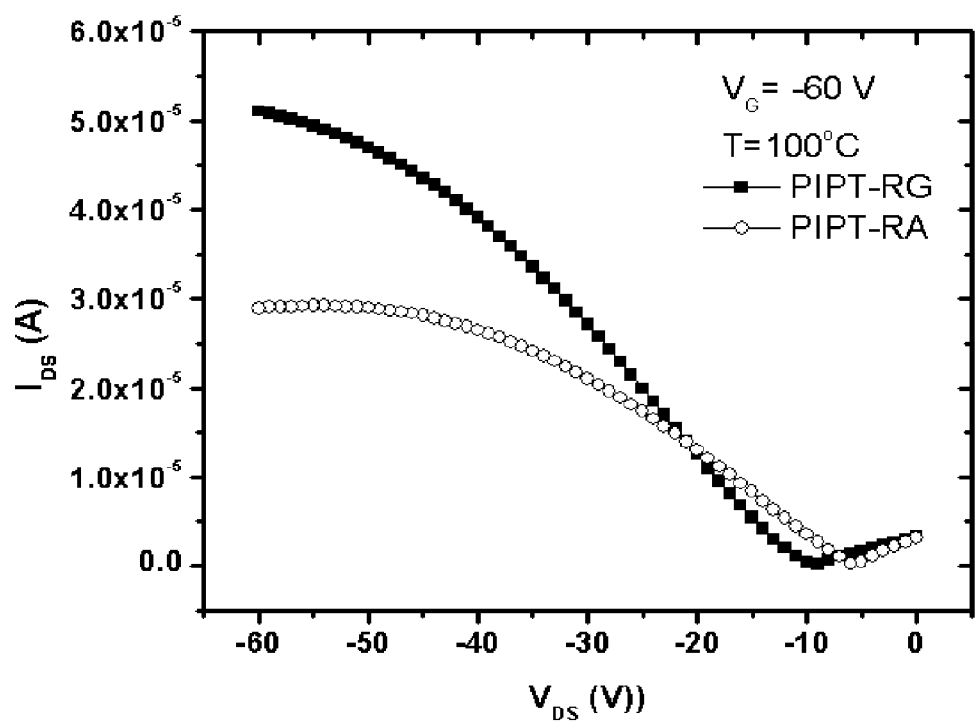
Figure 14C:
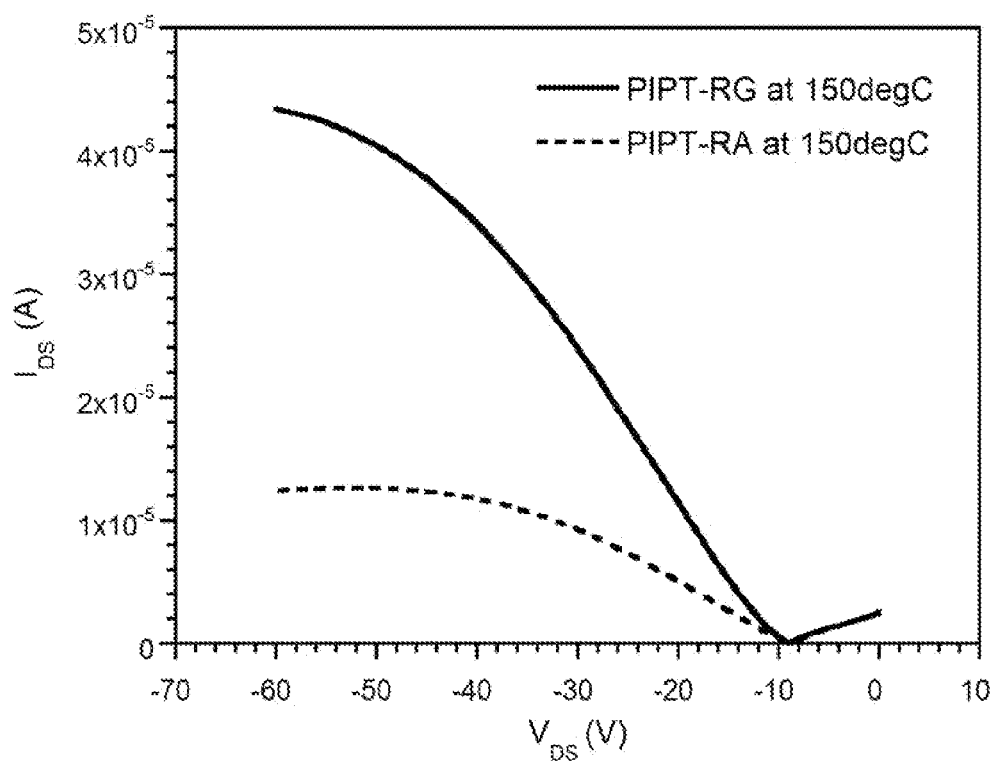
Figure 14D:
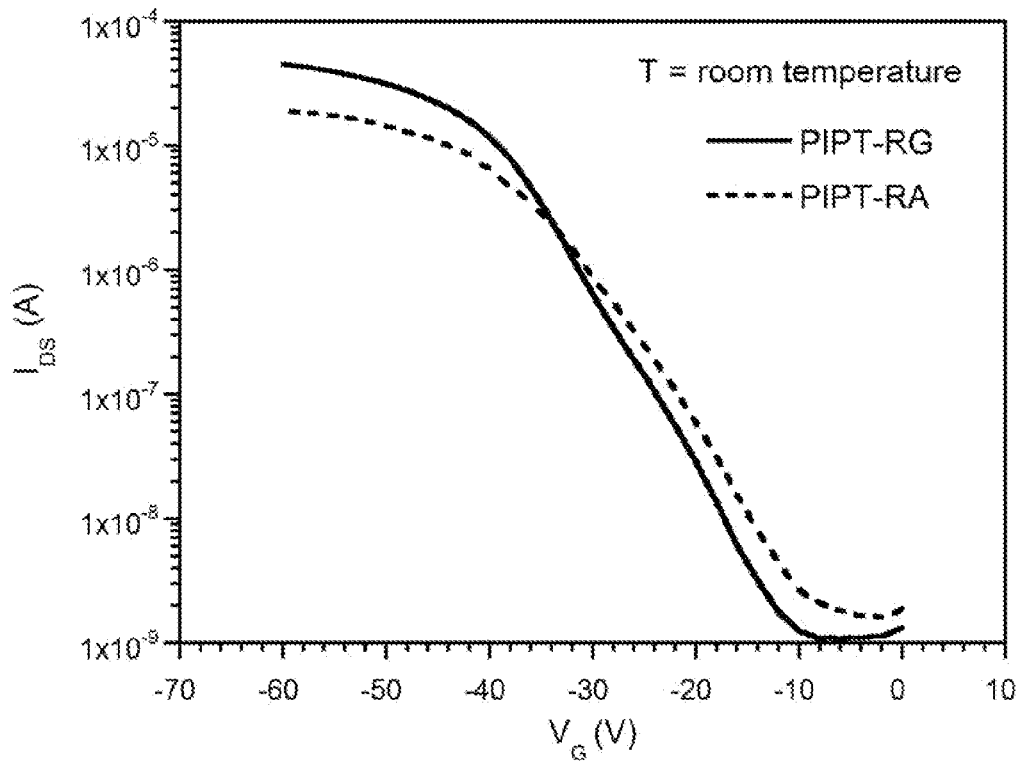
Figure 14E:
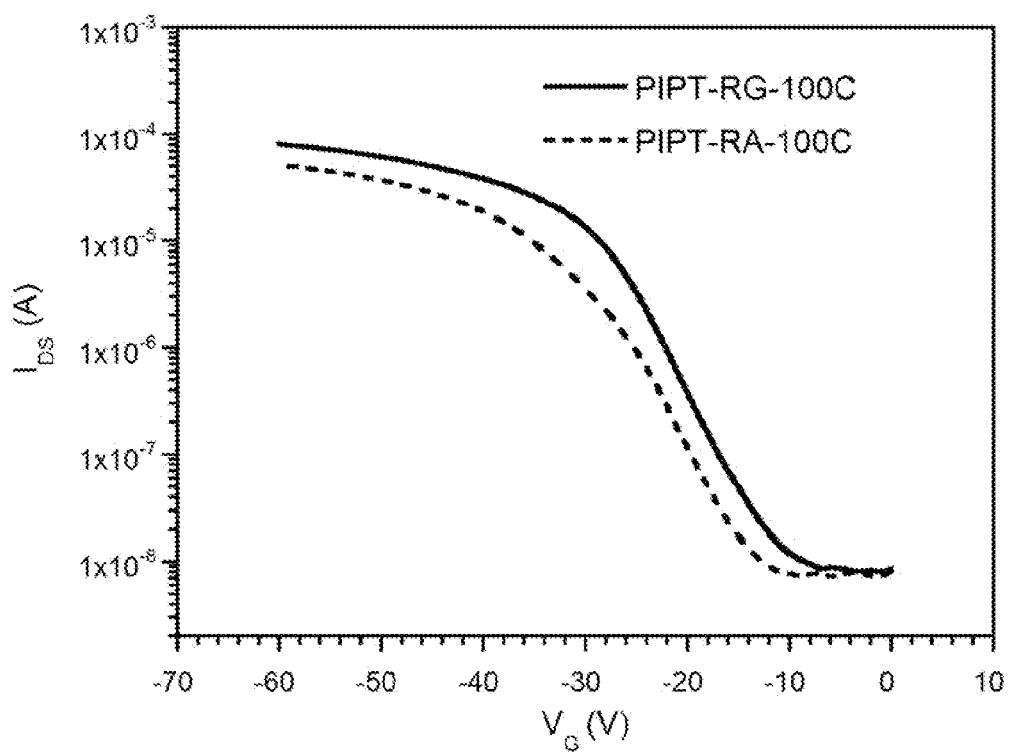
Figure 14F:
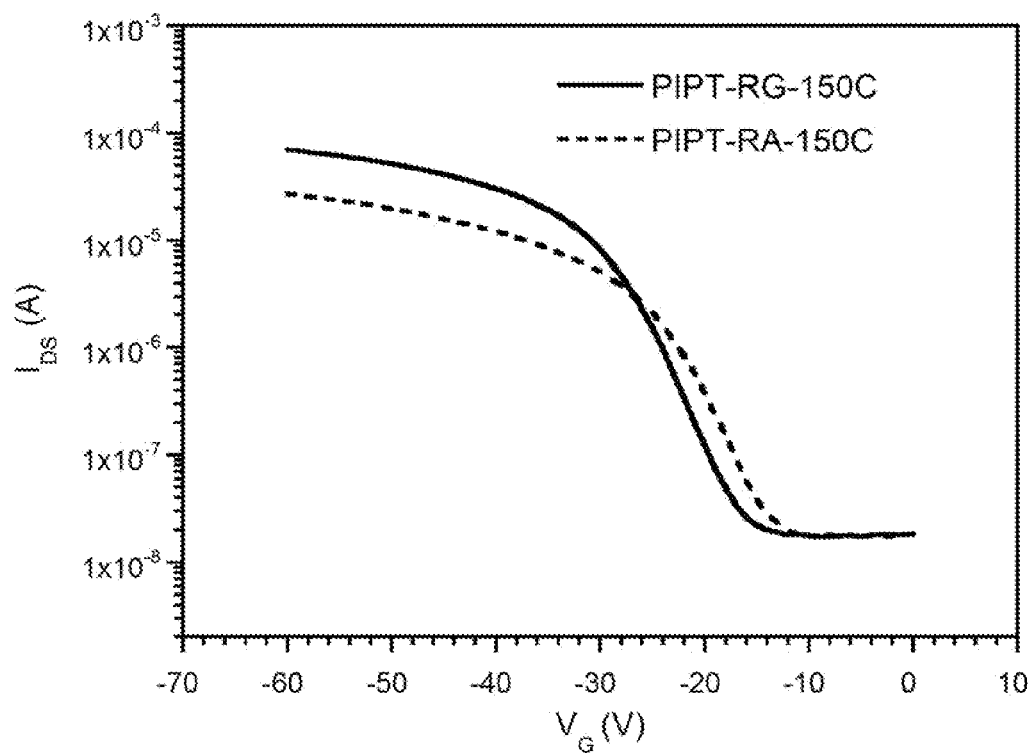

The field-effect hole mobilities of PIPT-RG and PIPT-RA were extracted from the transfer characteristics (FIG. 14) of field-effect transistors (FETs) fabricated with bottom contact, bottom gate geometry using Au electrodes. It was noted that the calculated mobilities for PIPT-RG at room temperature of 0.13 cm$^2$/Vs improved to 0.18 and 0.20 cm$^2$/Vs after thermal annealing at 100° C. and 150° C. for 10 min, respectively. These are higher than for devices prepared under the same conditions with a PIPT-RA copolymer film of 0.04 cm$^2$/Vs at room temperature, and 0.09 and 0.04 cm$^2$/Vs attained after thermal annealing at 100° C. and 150° C. for 10 min, respectively. The higher carrier mobility achieved with regioregular PIPT-RG than the regiorandom counterpart PIPT-RA indicates that better charge transport in the active layer could be achieved. The detailed FET data were summarized in Table 10.

TABLE 10

FET performances of bottom gate top-contact device structures

| polymer | $T_{anneal}$ (° C.) | $\mu_{hole}$ (cm$^2$/Vs) | $I_{on}/I_{off}$ |
|---|---|---|---|
| PIPT-RG | — | 0.13 | 4 × 10$^4$ |
|  | 100 | 0.18 | 1 × 10$^4$ |
|  | 150 | 0.20 | 4 × 10$^3$ |
| PIPT-RA | — | 0.04 | 1 × 10$^4$ |
|  | 100 | 0.09 | 7 × 10$^3$ |
|  | 150 | 0.04 | 2 × 10$^3$ |

Figure 15:
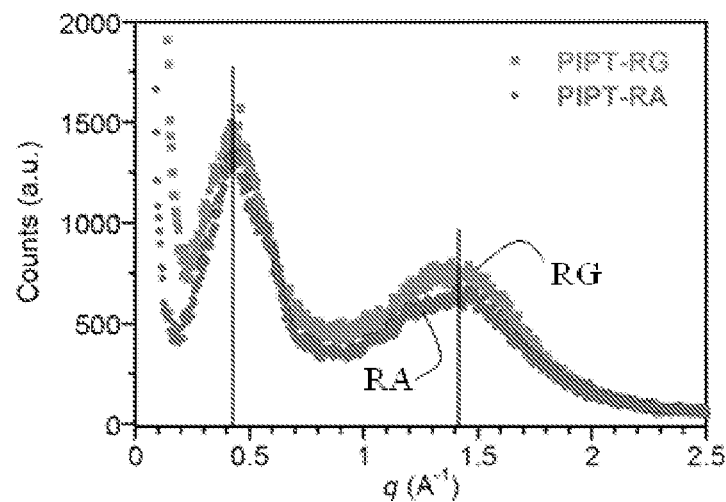
FIG. 15 is a composite drawing of grazing incident XRD of PIPT-RG and PIPT-RA polymer films.

The microstructures of two copolymer films were investigated by grazing incident X-ray diffraction (XRD). The samples were prepared on the top of (n-decyl)trichlorosilane (DTS) treated silicon substrate according to the same procedure of FET devices. The films were thermally annealed at 100° C. for 10 min. As shown in FIG. 15, the scattering features with two distinct peaks centered at q values of 0.42 Å$^{-1}$ (spacing of 14.9 Å) and 1.42 Å$^{-1}$ (spacing of 4.4 Å) were realized for both copolymers. However, more fine structures could be realized for the random copolymer PIPT-RA, which shows small bumpy scattering features with q values of 0.63 Å$^{-1}$ (spacing of 9.9 Å) and 1.21 Å$^{-1}$ (spacing of 5.2 Å). Such relatively weak scattering features might be attributed to the combination of various structures in random copolymers.

Figure 16:
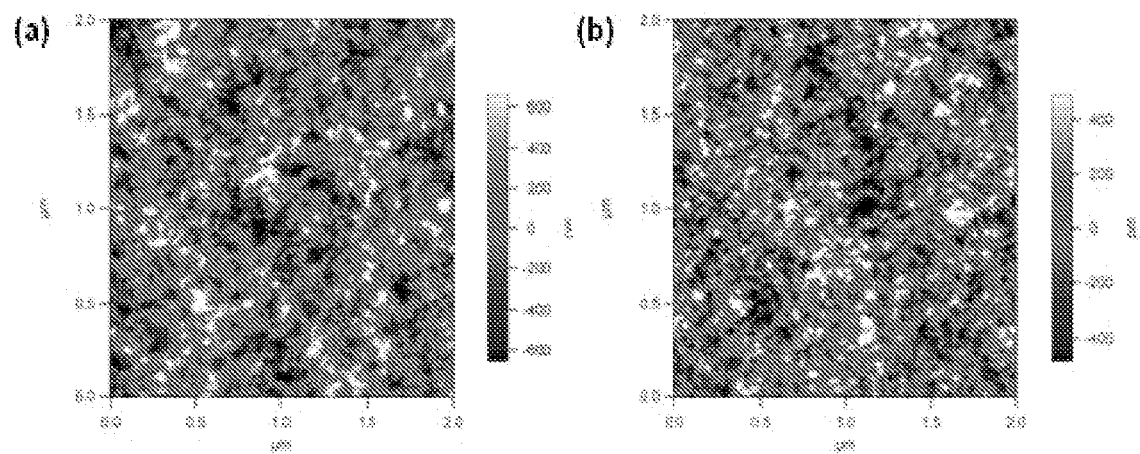
FIG. 16 is a panel of topographic AFM images (2 μm×2 μm) of (a) PIPT-RG:$PC_{71}BM$ (1:4) and (b) PIPT-RA:$PC_{71}BM$ (1:4) (b) blend films.

In considering that the copolymers were used as donor materials for bulk heterojunction solar cells, the contact of active layer with following deposited metal is of particular importance. The surface morphologies of copolymer: PC$_{71}$BM (1:4 in wt:wt) films were studies by tapping-mode atomic force microscopy (AFM), and the films were spin-casted from copolymer:PC$_{71}$BM solution on the top of ITO/MoOx layer and followed the optimized conditions for solar cell devices. Even though the solar cell devices based on PIPT-RG:PC$_{71}$BM as active layer showed much higher power conversion efficiency (5.1%) than that of achieved by PIPT-RA:PC$_{71}$BM device (3.4%), we noted that both films were quite smooth with root-mean-square (rms) value ~0.3 nm (FIG. 16).

Figure 17:
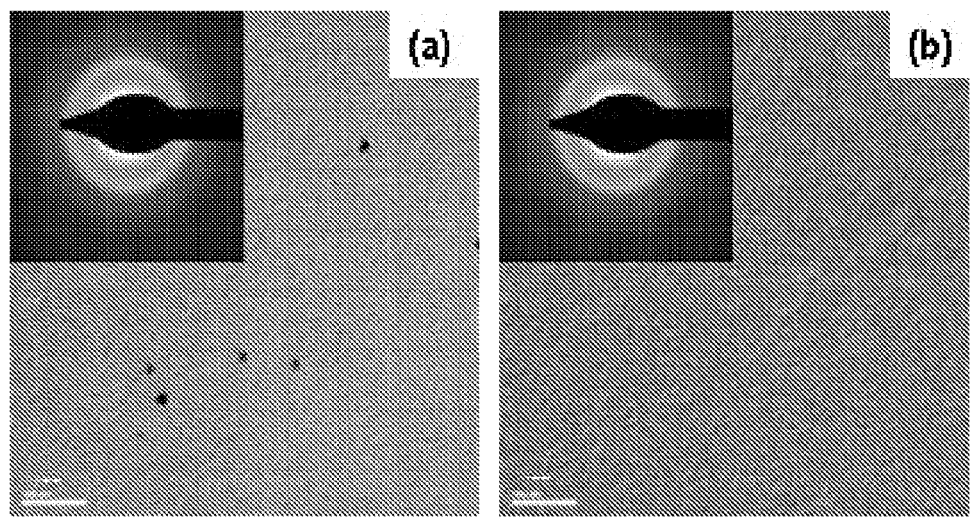
FIG. 17 is a panel of TEM images of (a) PIPT-RG:PCBM (1:4) and (b) PIPT-RA:PCBM (1:4) (b) films.

To further understand the microstructure differences in both films, we used transmission electron microscopy (TEM) to investigate the microstructure inside both films. It was realized that both PIPT-RG:PC$_{71}$BM (FIG. 17a) and PIPT-RA:PC$_{71}$BM (FIG. 17b) films exhibited relatively uniform images. It should be noted that the dark spots with size of 10~20 nm in FIG. 17(a) might be attributed to the metallic residue.

Example 3B

Materials and Methods for Example 3A

Instruments

Nuclear magnetic resonance (NMR) spectra were obtained on Bruker Avance DMX500 MHz spectrometer. Gel permeation chromatography (150° C. in 1,2,4-trichlorobenzene) was performed on a Polymer Laboratories PL220 Chromatograph. GPC with chloroform as eluent was performed in chloroform (with 0.25 v/v % triethylamine) on a Waters system, and the molecular weight of polymers were estimated relative to linear PS standards. Differential scanning calorimetry (DSC) was determined by a TA Instruments DSC (Model Q-20) with about 5 mg polymers samples at a rate of 10° C./min in the temperature range of −20 to 300° C. UV-Vis absorption spectra were recorded on a Shimadzu UV-2401 PC dual beam spectrometer. Cyclic voltammetry (CV) measurements were conducted using a standard three-electrode configuration under an argon atmosphere. A three-electrode cell equipped with a glassy carbon working electrode, a Ag wire reference electrode, and a Pt wire counterelectrode was employed. The measurements were performed in absolute acetonitrile with tetrabutylammonium hexafluorophosphate (0.1 M) as the supporting electrolyte at a scan rate of 50-100 mV/s. Polymer films for CV test were drop-casted onto the glassy carbon working electrode from a 2 mg/mL chloroform solution. The absolute energy level of ferrocene/ferrocenium (Fc/Fc$^+$) to be 4.8 eV below vacuum. Grazing incident X-ray diffraction was performed on Rigaku Smart instrument. Atomic force microscopy (AFM) was recorded on Asylum MFP3D instrument. All the samples were prepared identical to optimized device structure and conditions prior to electrode deposition. Transmission Electron Microscope (TEM) was performed on FEI Tecnai G2 Sphera Microscope instrument. The samples were prepared by spin-casting on the top of glass substrate and floated in water, following by put on the top of copper grid.

Synthesis of Monomers (4,4,9,9-Tetrakis(4-hexylphenyl)-4,9-dihydro-s-indaceno[1,2-b:5,6-b']dithiophene-2,7-diyl)bis(trimethylstannane) (M1)

A dry three-neck round bottom flask was equipped with a Schlenk adapter, dropping funnel, and rubber septum. Under nitrogen, 2,7-dibromo-4,4,9,9-tetrakis(4-hexylphenyl)-4,9-dihydro-s-indaceno[1,2-b:5,6-b']dithiophene (1.06 g, 1 mmol) was dissolved in dry THF (20 mL) and cooled −78° C. using a dry ice/acetone cold bath. Under nitrogen, a solution of n-butyllithium (1.6 M in hexane, 1.50 mL, 2.4 mmol) was added dropwise over 15 minutes to the reaction vessel. The reaction was stirred at −78° C. under nitrogen for one hour. Then trimethyltin chloride (0.60 g, 3.0 mmol) was added dropwise over 5 minutes to the reaction vessel via syringe at −78° C. The reaction was stirred at −78° C. under nitrogen for 1 hour and subsequently warmed to room temperature and stirred overnight. The mixture was then poured into deionized water (3×100 mL) and the organic phase was extracted with hexanes (3×100 mL). The organic phases were collected and washed with deionized water (5×100 mL), dried over sodium sulphate, filtered, and concentrated. The crude product was recrystallized from hexane/ethanol (10/90) and dried under high vacuum to give 1.07 g of final product as white needles, yield 87%. $^1$H NMR (500 MHz, CDCl$_3$) δ (ppm): 7.48 (s, 2H), 7.21 (d, 8H), 7.13 (d, 8H), 2.63 (t, J=7.75 Hz, 8H), 1.66-1.57 (m, 8H), 1.42-1.30 (m, 24H), 0.89 (m, 12H), 0.41 (s, 18H). $^{13}$C NMR (125 MHz, CD$_2$Cl$_2$) δ (ppm): 157.64, 153.75, 147.14, 142.31, 141.90, 141.54, 134.71, 130.44, 128.35, 128.28, 127.81, 127.75, 117.65, 62.19, 35.48, 31.76, 31.66, 29.16, 22.64, 13.89, −8.39. HRMS (FD) m/z, calcd for Chemical Formula: C$_{70}$H$_{90}$S$_2$Sn$_2$ (M$^+$): 1232.45. found: 1232.5.

4,4'-(4,4,9,9-Tetrakis(4-hexylphenyl)-4,9-dihydro-s-indaceno[1,2-b:5,6-b']dithiophene-2,7-diyl)bis(7-bromo-[1,2,5]thiadiazolo[3,4-c]pyridine) (M2)

To a 10-20 mL microwave tube was added M1 (0.616 g, 0.5 mmol), 4,7-dibromo-pyridal[2,1,3]thiadiazole (0.295 g, 1 mmol), Pd(PPh$_3$)$_4$ (57.8 mg, 0.05 mmol) and freshly distilled toluene (10 mL) under the protection of nitrogen, then the microwave tube was sealed. The microwave assisted Stille coupling was performed in the following procedure: 120° C. for 10 min, 140° C. for 10 min, 160° C. for 10 min and 170° C. for 40 min. The reaction was cooled down to room temperature, extracted with chloroform (100 mL×3), washed with deionized water (100 mL×3) and dried over with anhydrous magnesium sulfate. After removing solvent under reduced pressure, the mixture was separated by silica column with hexane/chloroform (form 100/0 to 0/100 in v/v) to give 0.553 g of dark-red oil, yield of 83%. $^1$H NMR (500 MHz, CDCl$_3$) δ (ppm): 8.64 (s, 2H), 8.60 (s, 2H), 7.65 (s, 2H), 7.31 (s, 8H), 7.16 (s, 8H), 2.61 (s, 8H), 1.63 (s, 8H), 1.45-1.26 (m, 24H), 0.90 (s, 12H). $^{13}$C NMR (125 MHz, CD$_2$Cl$_2$) δ (ppm): 158.11, 156.29, 154.63, 147.74, 147.54, 147.38, 145.91, 143.86, 141.84, 141.31, 136.01, 128.69, 128.55, 127.95, 127.95, 118.61, 107.54, 63.27, 35.60, 31.73, 31.35, 29.17, 22.61, 14.11. HRMS (FD) m/z, calcd for $C_{74}H^{74}Br_2N_6S_4$ (M+): 1334.32. found: 1334.3.

Polymerization of PIPT-RG

Monomer M1 (123.3 mg, 0.1 mmol), M2 (133.4 mg, 0.1 mmol), Pd(PPh$_3$)$_4$ (5.8 mg, 0.005 mmol) and freshly distilled xylenes (3 mL) was added to a 2-5 mL microwave tube under nitrogen. The tube was sealed and subjected to the following reaction conditions in a microwave reactor: 80° C. for 2 min, 120° C. for 2 min, 160° C. for 2 min and 180° C. for 40 min. The reaction was allowed to cool to room temperature, then freshly distilled xylenes (2 mL) and tributyl(thiophen-2-yl)stannane (20 µl) was added and the reaction was subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 µl) was added and the reaction was subjected to the following reaction conditions in a microwave reactor: 80° C. for 2 min, 130° C. for 2 min, 170° C. for 2 min and 200° C. for 20 min. The mixture was precipitated in methanol, collected via centrifugation, then re-dissolved in hot 1,2-dichlorobenzene and re-precipitated in methanol and collected via centrifugation. The collected solid fibers were loaded into a cellulose extraction thimble and washed successively with methanol (12 hours), acetone (12 hours) and hexanes (12 hours), and then chloroform (2 hours) to collected the copolymer. The solid residue in the thimble was collected and dried followed by re-dissolved in hot 1,2-dichlorobenzene, filtrated and re-precipitated in methanol. Then the resulted dark-green fibers were collected via centrifugation, dried over high vacuum line to give 156 mg of polymers, yield 75%. GPC with chloroform as eluent showed the Mn=68 kDa (PDI=2.4). $^1$H NMR (500 MHz, 1,2-dichlorobenzene-d$_4$, 110° C.) δ (ppm): 8.90 (s, 1H), 8.84 (s, 1H), 8.40 (s, 1H), 8.12 (s, 1H), 8.04 (s, 1H), 7.80-7.50 (br s, 8H), 7.30-7.15 (br s, 8H), 2.70 (br s, 8H), 1.71 (s, 8H), 1.55-1.32 (m, 24H), 0.98 (s, 12H). $^{13}$C NMR (125 MHz, 1,2-dichlorobenzene-d$_4$, 110° C.) δ (ppm): 180.06, 169.02, 163.49, 157.70, 141.59, 132.15, 130.04, 129.84, 129.71, 129.63, 129.42, 127.32, 127.22, 127.12, 127.05, 126.95, 126.85, 126.75, 126.65, 126.40, 102.74, 63.62, 35.38, 31.49, 30.98, 30.79, 28.88, 22.31, 13.61.

Polymerization of PIPT-RA

The polymerization was performed following the procedure for PIPT-RG in microwave reactor. The monomer M1 (246.6 mg, 0.2 mmol), and replacing monomer M2 by 4,7-dibromo-pyridal[2,1,3]thiadiazole (59.0 mg, 0.2 mmol), Pd(PPh$_3$)$_4$ (11.5 mg, 0.01 mmol) and xylenes (3 mL). The resulted dark-green solid was dried over high vacuum line to give 168.5 mg of polymer, yield 81%. GPC with chloroform as eluent showed the Mn=59 kDa (PDI=2.5). $^1$H NMR (500 MHz, 1,2-dichlorobenzene-d$_4$, 110° C.) δ (ppm): 8.86 (s, 1H), 8.81 (s, 1H), 8.35 (s, 1H), 8.12 (s, 1H), 8.03 (s, 1H), 7.82-7.49 (br s, 8H), 7.36-7.18 (br s, 8H), 2.66 (br s, 8H), 1.70 (s, 8H), 1.52-1.38 (m, 24H), 0.92 (s, 12H). $^{13}$C NMR (125 MHz, 1,2-dichlorobenzene-d$_4$, 110° C.) δ (ppm): 180.07, 169.03, 163.50, 157.99, 141.56, 132.19, 130.24, 129.94, 129.81, 129.80, 129.58, 127.45, 127.32, 127.22, 127.18, 127.06, 126.97, 126.86, 126.72, 126.51, 102.83, 63.84, 35.39, 32.38, 31.50, 29.10, 22.47, 13.74.

UPS Characterization

An Au film of 75 nm was deposited on a precleaned Si substrate with a thin native Oxide. A solution containing a mixture of PIPT-RA (or PIPT-RG):PC$_{71}$BM (1:4) in ODCB solvent with a concentration of 2 mg/mL was then spin-casted atop the Au film. The total time of spin coating was kept at 60 s for the two samples. Film fabrication was done in a N$_2$-atmosphere glove box. To minimize possible influence by exposure to air, the films were then transferred from the N$_2$-atmosphere dry box to the analysis chamber inside an air-free sample holder. Subsequently, the samples were kept inside a high-vacuum chamber overnight, to remove solvent. The UPS analysis chamber was equipped with a hemispherical electron-energy analyzer (Kratos Ultra spectrometer), and was maintained at $1.33 \times 10^{-7}$ Pa. The UPS was measured using the He I (hv=21.1 eV) source, and the electron energy analyzer was operated at constant pass energy of 10 eV. During the measurements, a sample bias of −9 V was used in order to separate the sample and the secondary edge for the analyzer. In order to confirm reproducibility of UPS spectra, we repeated these measurements twice on two sets of samples.

FET Device Fabrication

Semiconducting polymers, 0.5 wt % PIPT-RG or PIPT-RA dissolved in chlorobenzene. The copolymers were stirring under 110° C. before usage. Heavily doped n-type silicon substrates with 200 nm thermally grown SiO$_2$ were prepared as bottom gate electrode. After SiO$_2$ dielectric was passivated by OTS8 (octyl(trichlorosilane)), all three polymers were spun onto substrates by 2000 rpm/1 min. 60 nm thick film was created. Coated substrates were sequentially heated under 80° C. for 10 min. Thermal evaporator was applied to deposit 100 nm metal contacts on polymer layer through a silicon shadow mask. Defined channel was 20 µm long and 1 mm wide. Devices were tested on a Signatone probe station inside a nitrogen glovebox with atmosphere<1 ppm oxygen concentration. Data were all collected by a Keithley 4200 system. Mobility was extracted from saturation regime based on the following equation, $$I_D = \frac{1}{2}\mu C \frac{W}{L}(V_G - V_T)^2$$

where, W is the channel width (1 mm), L is the channel length (20 µm), µ is the carrier mobility, $V_G$ is the gate voltage, and $V_T$ is the threshold voltage. The capacitance, C, of the SiO$_2$ is 14 nF/cm$^2$.

Example 3C

Polymer Solar Cells

Device Architecture: ITO/Thermal Evaporated MoO$_x$/Polymer:PCBM/Al (Conventional)

Fabrication of PSCs: Polymer solar cells with conventional device architecture of ITO/MoO$_x$/polymer:PCBM/Al were fabricated according to the following procedure. The ITO-coated glass substrates were firstly cleaned by ultrasonic treatment in detergent, deionized water, acetone and isopropyl alcohol for 30 minutes each, and subsequently dried in an oven overnight. MoO$_x$ film was deposited onto ITO substrates by thermal evaporation in a vacuum of about $1 \times 10^{-6}$ Torr. The evaporation rate was 0.1 Å/s. Two solutions containing a mixture of PIPT-RA:PC$_{71}$BM (1:4) and PIPT-RG:PC$_{71}$BM (1:4) in o-DCB with a concentration of 10 mg/ml were spin-casted on top of MoO$_x$ film, respectively. The thickness of blend films were controlled by the spin-casting speed and optimized at 80 nm. After that, the BHJ films were annealing at 100° C. for 10 min. Finally, the cathode (Al, ~100 nm) was deposited through a shadow mask by thermal evaporation in a vacuum of about $3\times10^{-6}$ Torr. The active area of device was 0.106 cm$^2$.

PSCs Characterization: The thickness of the multilayer was measured with a profilometer and Atomic Force Microscope (AFM), respectively. Current density-voltage (J-V) characteristics were measured using a Keithley 2602 Source measure Unit, under solar simulation conditions of 100 mW/cm$^2$ AM 1.5 G using a 300 W Xe arc lamp with an AM 1.5 global filter. The illumination intensity of the solar simulator was measured using a standard silicon photovoltaic with a protective KG1 filter calibrated by the National renewable Energy Laboratory.

Figure 18:
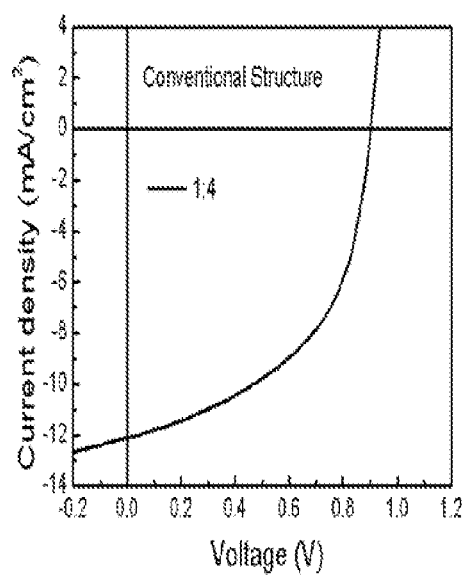
FIG. 18 is a panel showing J-V characteristics (a) and IPCE (b) of thermal evaporated $MoO_x$ PSC devices based on regioregular and regiorandom PIPT polymers.
Figure 18:
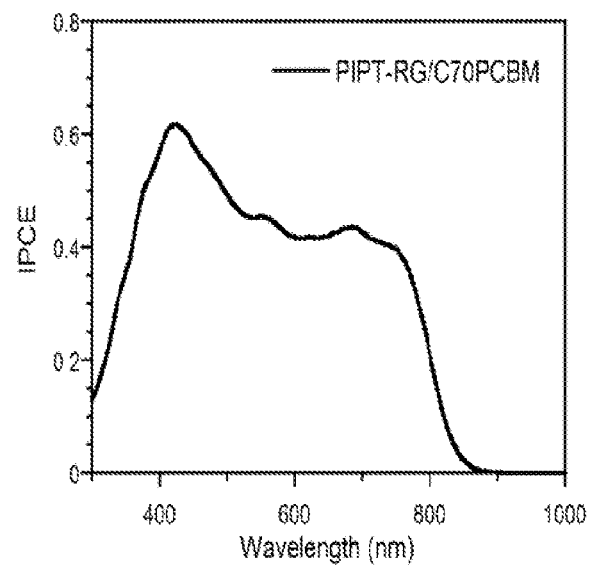

Devices data: FIG. 18 (*a*) illustrates the J-V characteristics of the optimized BHJ solar cell using PIPT-RG as donor materials. The optimized blend ratio of PIPT and fullerene is 1:4. Detailed comparisons of different blend ratio are not shown here. Using PIPT-RG as donor materials shows a PCE of 5.5%. Moreover, the IPCE spectrum shown in FIG. 12 18(*b*) is in good agreement with the J-V values.

Device Architecture: ITO/Solution Processed MoO$_x$/Polymer:PCBM/Al (Conventional)

Preparation of MoO$_x$ solution: The aqueous MoO$_x$ solution was prepared by hydration method according to the procedure reported by Liu et al (Fengmin Liu, Zhiyuan Xie, et al. Solar Energy Materials & Solar Cells. 2010, 94, 94842-845, incorporated by reference herein). Ammonium molybdate ((NH$_4$)$_6$Mo$_7$O$_{24}$) was dissolved in water to form 0.01 mol/L solution, marked as solution A. 2 mol/L hydrochloric acid (HCl) water solution was marked as solution B. Solution B was dropped into solution A until the pH value of the mixed solution was adjusted between 1.5 and 2.0. This mixed solution was marked as solution C, which is the aqueous MoO$_x$ solution Fabrication of PSCs (Pre-thermal annealing): Polymer solar cells with conventional device architecture of ITO/MoO$_3$/polymer:PCBM//Al were fabricated according to the following procedure. The ITO-coated glass substrates were firstly cleaned by ultrasonic treatment in detergent, deionized water, acetone and isopropyl alcohol for 30 minutes each, and subsequently dried in an oven overnight. After treatment with UV/ozone for 20 min, MoO$_x$ (filtered at 0.45 μm) was spin-coated from aqueous solution at 5000 rpm for 40 s to form a film of ~8 nm thickness. The substrates were then baked at 160° C. for 25 min in air, and moved into a glovebox for spin-casting the active layer. Two solutions containing a mixture of PIPT-RA:PC$_{71}$BM and PIPT-RG:PC$_{71}$BM with different blend ratios in o-DCB with a concentration of 10 mg/ml were spin-casted on top of MoO$_x$ layer, respectively. The film thickness of ~90 nm was optimized by controlling the spin-casting speed. After that, the BHJ films were annealed at 100° C. for 10 min. Finally, the cathode (Al, ~100 nm) was deposited through a shadow mask by thermal evaporation in a vacuum of about $3\times10^{-6}$ Torr. The active area of the devices was 0.106 cm$^2$.

Fabrication of PSCs (Post-thermal annealing): Polymer solar cells with conventional device architecture of ITO/MoO$_3$/polymer:PCBM//Al were fabricated according to the following procedure. The ITO-coated glass substrates were firstly cleaned by ultrasonic treatment in detergent, deionized water, acetone and isopropyl alcohol for 30 minutes each, and subsequently dried in an oven overnight. After treated with UV/ozone for 20 min, MoO$_x$ (filtered at 0.45 μm) was spin-coated from aqueous solution at 5000 rpm for 40 s to form a film of ~8 nm thickness. The substrates were then barked at 160° C. for 25 min in air, and moved into a glovebox for spin-casting the active layer. Two solutions containing a mixture of PIPT-RA:PC$_{71}$BM and PIPT-RG: PC$_{71}$BM with different blend ratio in o-DCB with a concentration of 10 mg/ml were spin-casted on top of MoO$_x$ layer, respectively. The film thickness of ~90 nm was optimized by controlling the spin-casting speed. After that, the cathode (Al, ~100 nm) was deposited through a shadow mask by thermal evaporation in a vacuum of about $3\times10^{-6}$ Torr. Finally, the devices were annealing at 100° C. for 10 min. The active area of device was 0.106 cm$^2$.

Fabrication of PSCs (Additive): Polymer solar cells with conventional device architecture of ITO/MoO$_3$/polymer: PCBM/Al were fabricated according to the following procedure. The ITO-coated glass substrates were firstly cleaned by ultrasonic treatment in detergent, deionized water, acetone and isopropyl alcohol for 30 minutes each, and subsequently dried in an oven overnight. After treated with UV/ozone for 20 min, MoO$_x$ (filtered at 0.45 μm) was spin-coated from aqueous solution at 5000 rpm for 40 s to form a film of ~8 nm thickness. The substrates were then barked at 160° C. for 25 min in air, and moved into a glovebox for spin-casting the active layer. The solutions containing a mixture of PIPT-RG:PC$_{71}$BM (1:4) with different amount of additive in o-DCB with a concentration of 10 mg/ml were spin-casted on top of MoO$_x$ layer, respectively. The film thickness of ~90 nm was optimized by controlling the spin-casting speed. After that, the BHJ films were annealing at 100° C. for 10 min. Finally, the cathode (Al, ~100 nm) was deposited through a shadow mask by thermal evaporation in a vacuum of about $3\times10^{-6}$ Torr. The active area of device was 0.106 cm$^2$.

Fabrication of PSCs (CPE): Polymer solar cells with conventional device architecture of ITO/MoO$_3$/polymer: PCBM/Al were fabricated according to the following procedure. The ITO-coated glass substrates were firstly cleaned by ultrasonic treatment in detergent, deionized water, acetone and isopropyl alcohol for 30 minutes each, and subsequently dried in an oven overnight. After treated with UV/ozone for 20 min, MoO$_x$ (filtered at 0.45 μm) was spin-coated from aqueous solution at 5000 rpm for 40 s to form a film of ~8 nm thickness. The substrates were then barked at 160° C. for 25 min in air, and moved into a glovebox for spin-casting the active layer. Two solutions containing a mixture of PIPT-RA:PC$_{71}$BM and PIPT-RG: PC$_{71}$BM with different blend ratio in o-DCB with a concentration of 10 mg/ml were spin-casted on top of MoO$_x$ layer, respectively. The film thickness of ~90 nm was optimized by controlling the spin-casting speed. After that, the BHJ films were annealing at 100° C. for 10 min. Then, CPE was spin-casting on the active layer to form a very thin interfacial layer. Finally, the cathode (Al, ~100 nm) was deposited through a shadow mask by thermal evaporation in a vacuum of about $3\times10^{-6}$ Torr. The active area of device was 0.106 cm$^2$.

PSCs Characterization: The thickness of the multilayer was measured with a profilometer and Atomic Force Microscope (AFM), respectively. Current density-voltage (J-V) characteristics were measured using a Keithley 2602 Source measure Unit, under solar simulation conditions of 100 mW/cm$^2$ AM 1.5 G using a 300 W Xe arc lamp with an AM 1.5 global filter. The illumination intensity of the solar simulator was measured using a standard silicon photovoltaic with a protective KG1 filter calibrated by the National renewable Energy Laboratory.

Figure 19:
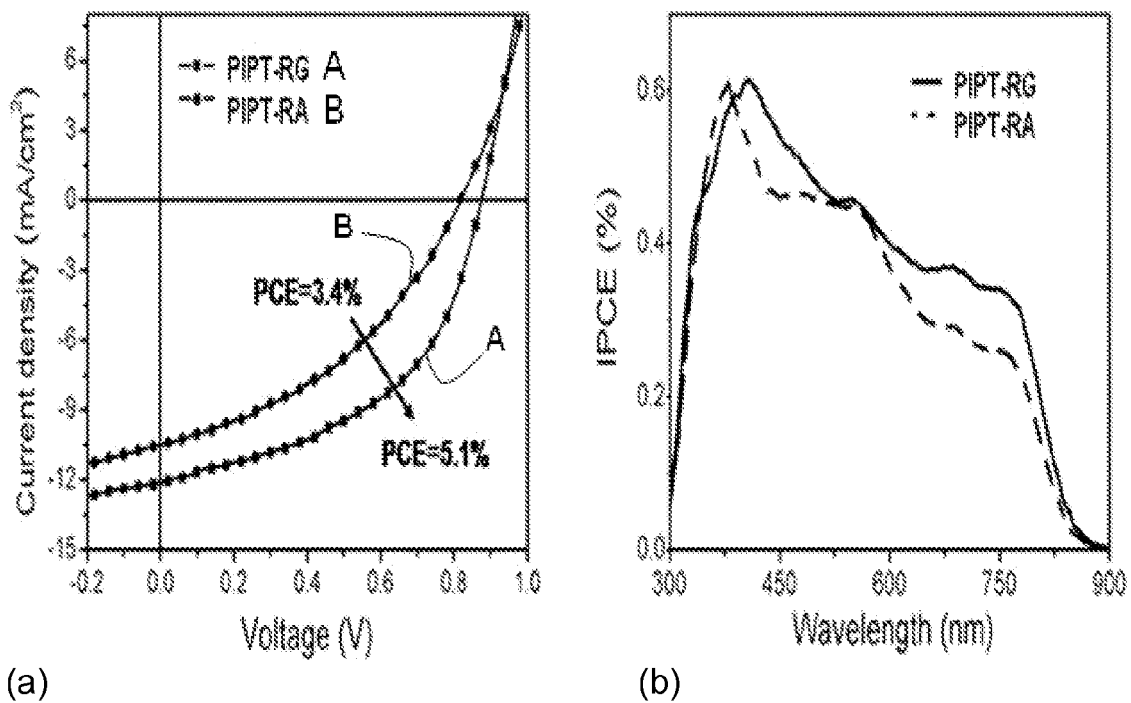
FIG. 19 is a panel showing J-V characteristics (a) and IPCE (b) of solution-processed $MoO_x$ PSC devices based on regioregular and regiorandom PIPT polymers.

Device data: FIG. 19(*a*) illustrates the J-V characteristics of the optimized BHJ solar cell based on PIPT-RA and PIPT-RG as donor materials, respectively. Detailed comparisons of different blend ratio are summarized in Table 11. It could be seen that the performance of PIPT-RG devices is much better than that of PIPT-RA devices, corresponding to PCE increases of from 3.4% to 5.1%. From FIG. 19(b) we could see that the IPCE spectrum of PIPT-RG based devices is more broadened than that of PIPT-RA based devices, which is in good agreement with the increased $J_{sc}$.

TABLE 11

Summary of solar cell device performance with different blend ratios

| Device | Ratio (x:y) | Voc (V) | Jsc (mA/cm$^2$) | FF (%) | PCE (%) | Thickness (nm) | Rs (KΩ) | Rsh (KΩ) |
|---|---|---|---|---|---|---|---|---|
| PIPT-RR:PC$_{71}$BM | 1:1 | 0.82 | 5.11 | 30 | 1.3 | 63 | | |
| | 1:2 | 0.84 | 8.89 | 39 | 2.9 | 80 | | |
| | 1:3 | 0.88 | 10.68 | 45 | 4.2 | 85 | | |
| | 1:4 | 0.88 | 12.11 | 48 | 5.1 | 91 | 0.07 | 639 |
| PIPT-Ra:PC$_{71}$BM | 1:3 | 0.74 | 8.35 | 37 | 2.3 | 90 | | |
| | 1:4 | 0.82 | 10.08 | 40 | 3.4 | 87 | 0.13 | 545 |

Figure 20:
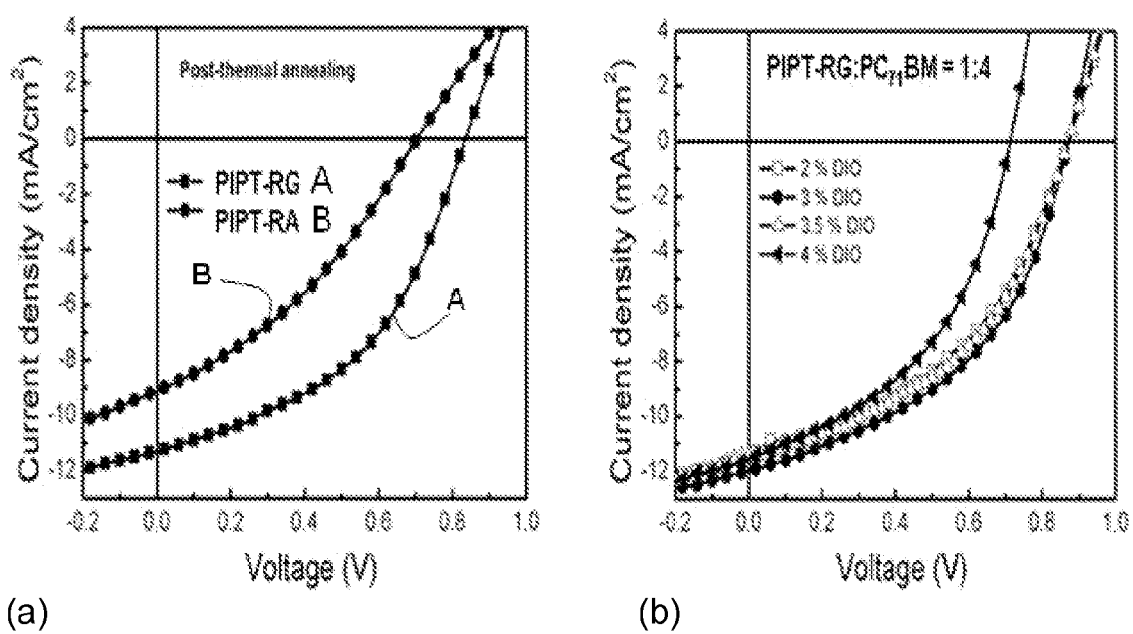
FIG. 20 is a panel showing J-V characteristics of devices (a) post-thermal annealing, and (b) with additive.

To achieve a better FF, more fabrication methods are used, such as post-thermal annealing (annealing devices after evaporation cathode), adding a different amount of additive (DIO), and spin-casting CPE as interfacial layer between the active layer and cathode, et al. From a starting rough experiment value showed in FIG. 20, we find that post-thermal annealing is not as good as the pre-thermal annealing (annealing active layer before Al evaporation), whereas adding a proper amount of DIO to the fresh solution is a good way to get a better morphology of blend film.

Device Architecture: ITO/ZnO/PIPT-RG:PCBM/MoO$_x$/Ag (Inverted)

Preparation of ZnO precursor: Preparation of the ZnO Precursor: The ZnO precursor was prepared by dissolving zinc acetate dihydrate (Zn(CH$_3$ COO)$_2$.2H$_2$O, Aldrich, 99.9%, 1 g) and ethanolamine (NH$_2$CH$_2$CH$_2$OH, Aldrich, 99.5%, 0.28 g in 2-methoxyethanol (CH$_3$OCH$_2$CH$_2$OH, Aldrich, 99.8%, 10 mL) under vigorous stirring for 12 h for the hydrolysis reaction in air.

Fabrication of Inverted PSCs: Inverted solar cells were fabricated on ITO-coated glass substrates. The ITO-coated glass substrates were first cleaned with detergent, ultrasonicated in water, actone and isopropyl alcohol, and subsequently dried overnight in an oven. The ZnO precursor solution was spin-cast on top of the ITO-glass substrate. The films were annealed at 150° C. for 1 h in air. The ZnO film thickness was approximately 30 nm, as determined by a profilometer. The ZnO-coated substrates were transferred into a glove box. A solution containing a mixture of PIPT-RG:PC$_{71}$BM (1:4) in o-DCB with a concentration of 10 mg/ml was spin-casted on top of a ZnO film with thickness of approximately 80 nm, respectively. The BHJ film was heated at 100° C. for 10 min. Then, a thin layer of MoO$_x$ film (≈6 nm) was evaporated on top of the BHJ layer. Finally, the anode (Ag, ≈60 nm) was deposited through a shadow mask by thermal evaporation in a vacuum of about 3×10$^{-6}$ Torr. The active area of device was 0.05 cm$^2$.

PSCs Characterization: The thickness of multilayers was measured with a profilometer and Atomic Force Microscope (AFM), respectively. Current density-voltage (J-V) characteristics were measured using a Keithley 2602 Source measure Unit, under solar simulation conditions of 100 mW/cm$^2$ AM 1.5 G using a 300 W Xe arc lamp with an AM 1.5 global filter. The illumination intensity of the solar simulator was measured using a standard silicon photovoltaic with a protective KG1 filter calibrated by the National renewable Energy Laboratory.

Figure 21:
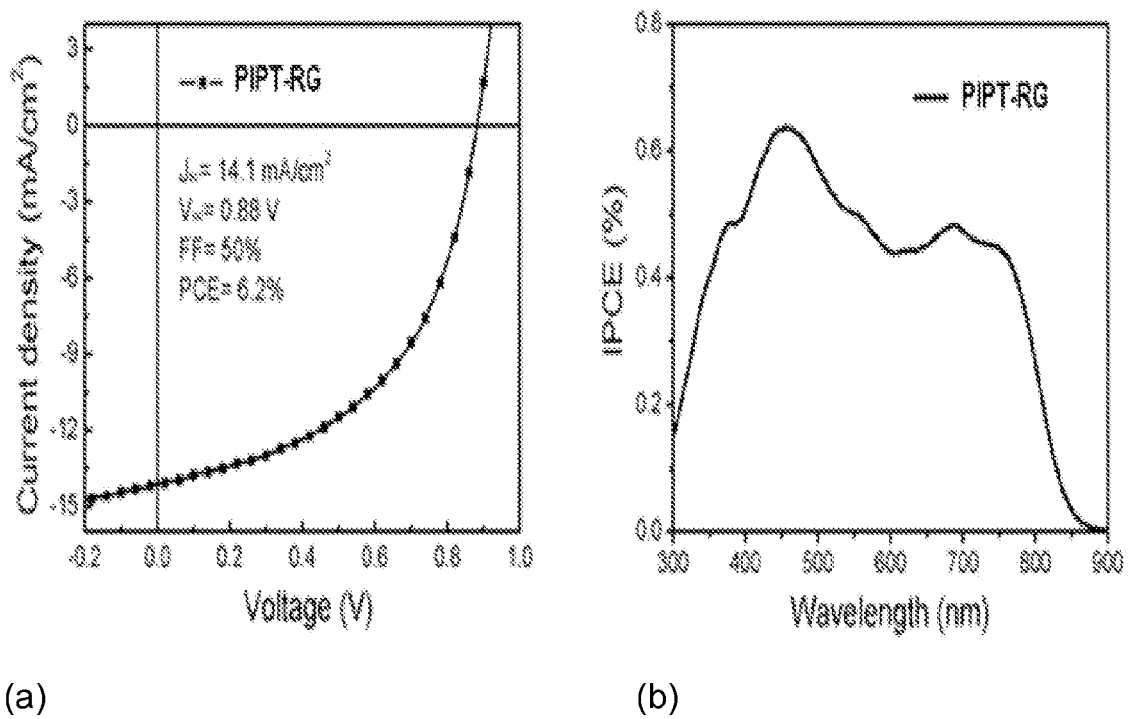
FIG. 21 is a panel showing J-V characteristics (a) and IPCE (b) of inverted structure devices based on PIPT-RG polymer

Device data: FIG. 21(a) illustrates the J-V characteristics of the optimized BHJ solar cell based on PIPT-RG as donor material. The device shows a nice open circle voltage of 0.88 V and short circle current of 14.1 mA/cm$^2$. Although the FF is relatively low, the PCE is up to 6.2%, which is very comparable to our conventional devices. This consistent value indicated that even when using different device structures, region-regular PIDTPT polymer can distinctly improved OPV devices.

Example 4

The inventors recognize that achieving structurally more precise narrow band materials is relevant within the context of bulk heterojunction polymer solar cells, where improved charge carrier transport could potentially impart higher short circuit currency ($J_{sc}$) and power conversion efficiencies (PCE). Copolymers based on cyclopenta[2,1-b:3,4-b']dithiophene (CDT) as donor showed a relatively low open circuit voltage ($V_{oc}$) of about 0.4 V. The inventors realize that replacement of the carbon bridge in CDT unit by a silicon bridge, with the new donor of silolo[3,2-b:4,5-b'] dithiophene (SDT), might decrease the highest occupied molecular orbital (HOMO) energy level, and that OPVs incorporating SDT-PT-based conjugated copolymers might show higher Voc values than that of CDT-PT copolymers. Thus, using of SDT-PT-based regioregular copolymers as the active layer can achieve improved $J_{sc}$ and PCE in OPVs.

Experimental

Synthesis of PSDTPT2-EH

Monomers 4,4-bis(2-ethylhexyl)-2,6-bis(trimethylstannyl)-4H-silolo[3,2-b:4,5-b']dithiophene (74.4 mg, 0.1 mmol) and 4,4'-(4,4-bis(2-ethylhexyl)-4H-silolo[3,2-b:4,5-b']dithiophene-2,6-diyl)bis(7-bromo-[1,2,5]thiadiazolo[3,4-c]pyridine) (84.6 mg, 0.1 mmol) were added to a 2-5 mL microwave tube, then Pd(PPh$_3$)$_4$ (5.8 mg, 0.005 mmol) and freshly distilled xylenes (3 ml) were added into the microwave tube. The tube was sealed and subjected to the following reaction conditions in a microwave reactor: 80° C. for 2 min, 130° C. for 2 min, 170° C. for 2 min and 200° C. for 40 min. The reaction was allowed to cool to room temperature, then tributyl(thiophen-2-yl)stannane (20 μl) was added and the reaction was subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 μl) was added and the end-capping procedure was repeated once again. The mixture was precipitated in methanol, collected via centrifugation. The collected solid fibers were loaded into a cellulose extraction thimble and washed successively with methanol (6 hours), acetone (6 hours), hexanes (12 hours), and the polymer comes out with chloroform (within 2 hours) from the thimble. Chloroform was removed under reduced pressure and resulted solid was dried over high vacuum line to final products with yield of 85%. GPC with 1,2,4-trichlorobenzene as eluent at 150° C. showed number average molecular weight (Mn) of 22 KDa with polydispersity (PDI) of 1.9.

$PC_{71}BM$ (99.5%) was purchased from Nano-C. Chlorobenzene (CB, anhydrous, 99%) was supplied by Sigma-Aldrich Company. All materials were used as received.

The structures of the regiorandom polymer PSDTPTR-EH and the regioregular polymer PSDTPT2-EH used in this study are shown in Scheme 6.

Scheme 6

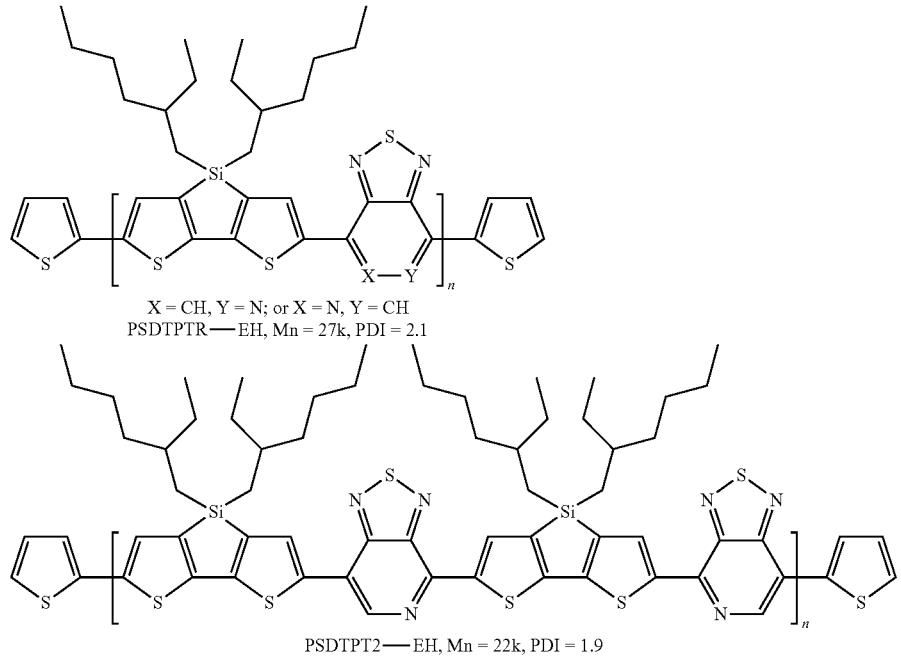

X = CH, Y = N; or X = N, Y = CH
PSDTPTR—EH, Mn = 27k, PDI = 2.1

PSDTPT2—EH, Mn = 22k, PDI = 1.9

Synthesis of PSDTPTR-EH

Monomers 4,4-bis(2-ethylhexyl)-2,6-bis(trimethylstannyl)-4H-silolo[3,2-b:4,5-b']dithiophene (74.4 mg, 0.1 mmol) and 4,7-dibromo-pyridal[2,1,3]thiadiazole (29.5 mg, 0.1 mmol) were added to a 2-5 mL microwave tube, then $Pd(PPh_3)_4$ (5.8 mg, 0.005 mmol) and freshly distilled xylenes (3 ml) were added into the microwave tube. The tube was sealed and subjected to the following reaction conditions in a microwave reactor: 80° C. for 2 min, 130° C. for 2 min, 170° C. for 2 min and 200° C. for 40 min. The reaction was allowed to cool to room temperature, then tributyl(thiophen-2-yl)stannane (20 μl) was added and the reaction was subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 μl) was added and the end-capping procedure was repeated once again. The mixture was precipitated in methanol, collected via centrifugation. The collected solid fibers were loaded into a cellulose extraction thimble and washed successively with methanol (6 hours), acetone (6 hours), hexanes (12 hours), and the polymer comes out with chloroform (within 2 hours) from the thimble. Chloroform was removed under reduced pressure and resulted solid was dried over high vacuum line to final products with yield of 80%. GPC with 1,2,4-trichlorobenzene as eluent at 150° C. showed number average molecular weight (Mn) of 27 KDa with polydispersity (PDI) of 2.1.

Device Architecture: ITO/PEDOT:PSS/PSDTPT:PCBM/Al (Conventional)

Fabrication of PSCs: Polymer solar cells with conventional device architecture of ITO/PEDOT:PSS/PSDTPT: PCBM/Al were fabricated according to the following procedure. The ITO-coated glass substrates were firstly cleaned by ultrasonic treatment in detergent, deionized water, acetone and isopropyl alcohol for 30 minutes each, and subsequently dried in an oven overnight. After treated with UV/ozone for 20 min, PEDOT:PSS (Baytron P VP AI 4083, filtered at 0.45 μm) was spin-coated from aqueous solution at 4000 rpm for 40 s to form a film of ~40 nm thickness. The substrates were barked at 140° C. for 10 min in air, and then moved into a glovebox for spin-casting the active layer. Two solution containing with PSDTPT2-EH:$PC_{71}BM$ (1:1, w/w) and PSDTPR-EH:$PC_{71}BM$ (1:1, w/w) in CB with a concentration of 10 mg/ml were then spin-casted on top of PEDOT:PSS layer, which were marked as device I and device II, respectively. The film thickness of ~80 nm was controlled by adjusting the spin-casting speed. In order to evaporate the solvent quickly, the BHJ films were dried at 70° C. for 10 min. After that, the cathode (Al, ~100 nm) was deposited through a shadow mask by thermal evaporation in a vacuum of about $3\times10^{-6}$ Torr. The active area of device was 0.106 $cm^2$.

PSCs Characterization: The thickness of the active layer and PEDOT:PSS was measured with a profilometer. Current density-voltage (J-V) characteristics were measured using a Keithley 2602 Source measure Unit, under solar simulation conditions of 100 mW/cm² AM 1.5 G using a 300 W Xe arc lamp with an AM 1.5 global filter. The illumination intensity of the solar simulator was measured using a standard silicon photovoltaic with a protective KG1 filter calibrated by the National renewable Energy Laboratory.

Figure 22:
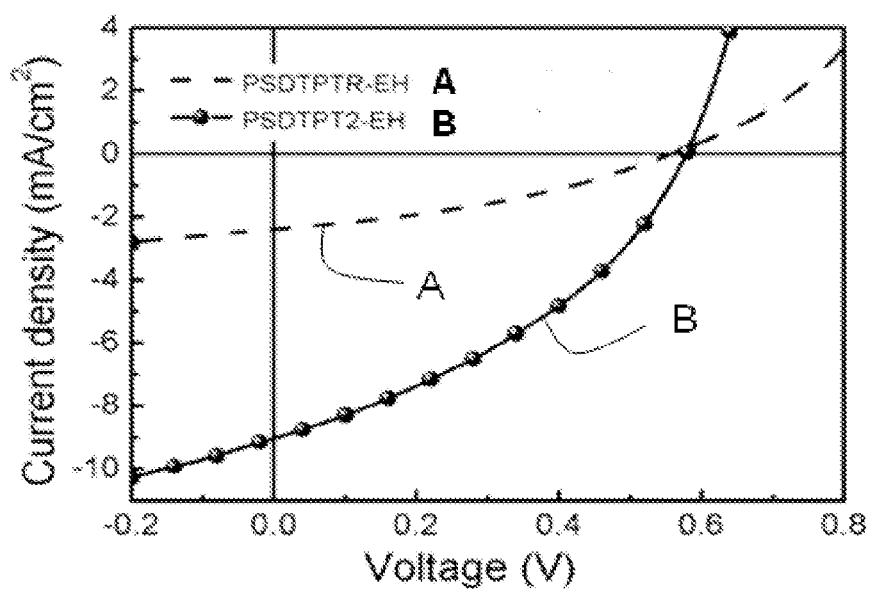
FIG. 22 is a composite drawing of density-voltage (J-V) characteristics of PSC devices based on PSDTPTR-EH (A) and PSDTPT2-EH (B) copolymers.

Devices data: FIG. 22 illustrates the J-V characteristics of the two devices, and the detailed comparisons are summarized in Table 12. Using the regioregular copolymers, the short circuit current density ($J_{sc}$) of device II increases as much as four times (from 2.41 to 9.03 mA/cm²) compared with that of device I using the regionrandom copolymers. As is known, the $J_{sc}$ is not only determined by the number of absorbed photons, but also heavily influenced by the component morphology in the active layer. Therefore, a remarkable increase in $J_{sc}$ for the device II implies that the morphology of the active layer has been substantially improved. Moreover, the open circuit voltage ($V_{oc}$) and Fill Factor (FF) increased slightly, and the power conversion efficiency (PCE) of device II is up to 1.96%.

TABLE 12

Summary of solar cell device performance based on PSDTPTR-EH and PSDTPT2-EH copolymers

| Devices | $V_{oc}$ (V) | $J_{sc}$ (mA/cm²) | FF (%) | PCE (%) |
|---|---|---|---|---|
| PSDTPTR-EH | 0.56 | 2.41 | 35.9 | 0.48 |
| PSDTPT2-EH | 0.58 | 9.03 | 37.3 | 1.96 |

Example 5

High mobility lies in the heart of practical applications for organic electronics. High mobility enables low operating voltage and less energy consumption in organic thin film transistors (OTFTs). Recently, narrow bandgap donor-acceptor (DA) copolymers are attracting researchers' attention. The combination of DA moieties on polymer chain can induce preferred charge transfer between DA units with different electron affinities. Therefore, delocalization, improved transport and higher mobility are expected.

Figure 23:
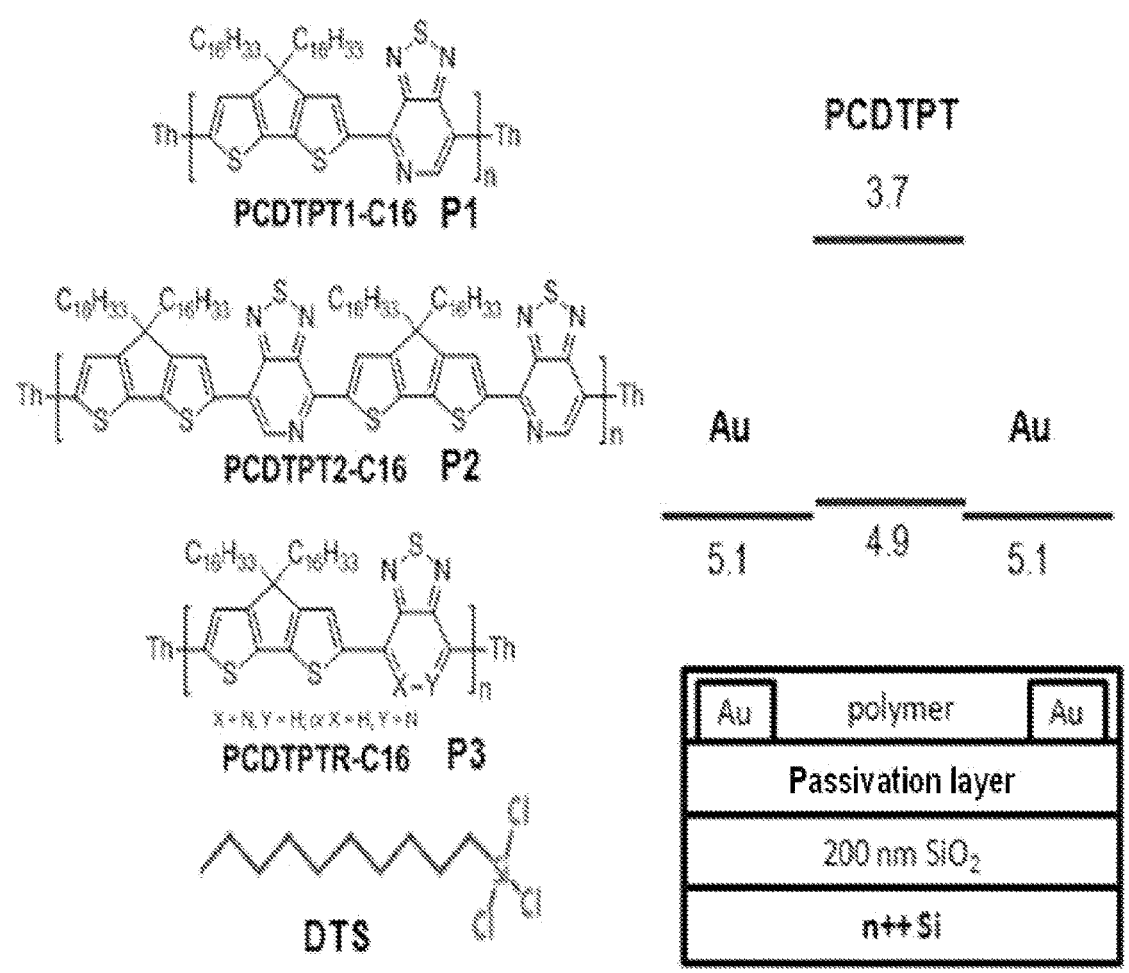
FIG. 23 is a panel showing molecular structures of polymers and decyl(trichloro)silane, and device architecture.

An outstanding class of polymers composed of cyclopenta[2,1-b:3,4-b']dithiophene (CDT) and 2,1,3-benzothiadiazole (BT) has been reported [14-18]. After replacing BT unit by pyridal[2,1,3]thiadiazole (PT) with larger electron affinity difference to CDT, higher mobility was demonstrated on regioregular-PCDTPT1 (rr-P1) (see FIG. 23) and regioregular-PCDTPT2 (rr-P2) but not in regiorandom-PCDTPTR (ra-P3). Ra-P3 only gave µ=5×10⁻³ cm²/Vs while µ=0.6 and 0.4 cm²/Vs, respectively, were obtained by rr-P2 and rr-P1 [19]. Molecular structures of the three polymers, device architecture, and work functions are shown in FIG. 23. In order to further increase the mobility, larger molecular weight and films with improved structural order are required. However, to precisely characterize the performance from the different mass distribution of the synthesized polymers, low polydispersity index (PDI) is important as well as molecular weight.

Using gel permeation chromatography (GPC), it is possible to fraction different partitions of molecular weight with low PDI from rr-P2. By controlling collecting time of permeated polymer solution, high molecular weight 300 kDa with PDI≈1.6 was collected and high mobility, µ=2.5 cm²/Vs, was demonstrated after annealing. Improved alky stacking with annealing temperature was confirmed by a growing peak in X-ray diffraction (XRD) spectra. Obvious fiber structure was observed after the film was annealed over 300° C. Thus, the high mobility, over 2 cm²/Vs, after annealing could be correlated to the higher degree of structural order in films of high molecular weight rr-P2. To push mobility even higher than 2.5 cm²/Vs, inducing higher molecular weight and more ordering in polymer film are promising. However, to further increase the molecular weight by GPC is impractical because of the required collecting time and the quantity of the fractionated solution.

Figure 24:
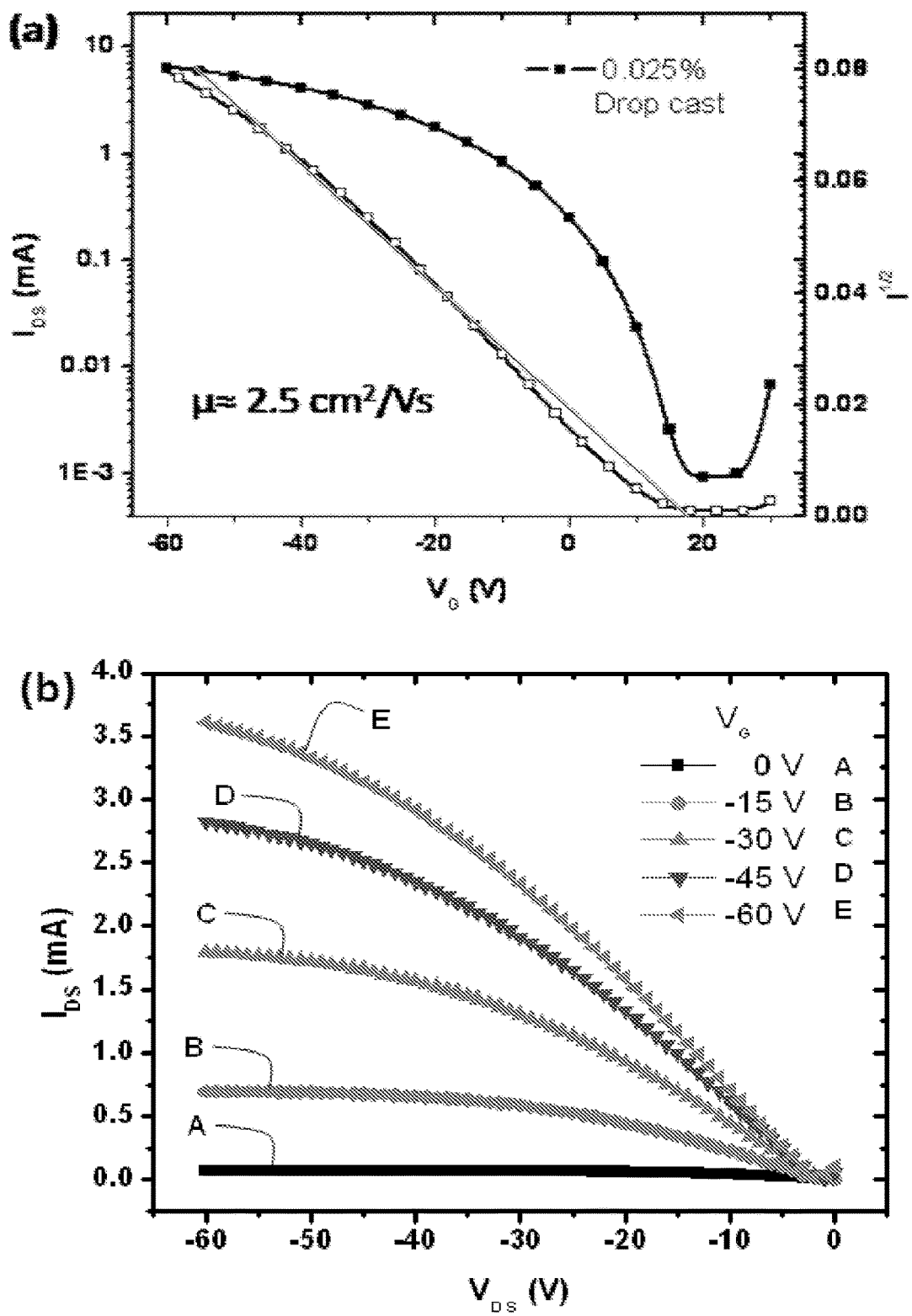
FIG. 24 is a panel showing (a) the transfer characteristic of an organic TFT after annealing at 350° C., and b) the output characteristic of the same OTFT.

The transfer and output characteristics of the OTFTs made of rr-P2 are shown in FIGS. 24(a) and 24(b). The polymer film was drop cast on a prepatterned substrate with bottom contact (BC) architecture made of gold. The $SiO_2$ gate dielectric was passivated by decyl(trichloro)silane (DTS). FIG. 24(a) shows clear transistor behavior with linear and saturation regimes and on-off ration 6×10⁶. The positive shift of threshold voltage from negative $V_G$ to $V_G$=20 V elucidates the existence of hole traps on the interface of gold and polymer.

Table 13 is a mobility table showing drop casted films prepared from different concentration solutions after different annealing temperatures. The highest mobility value 2.5 cm²/Vs, was achieved from the film prepared by 0.025 wt % solution and annealed at 350° C. Even though the mobility values continuously increase with annealing temperature, the numbers saturate after 200° C., mainly varying from 1.8 to 2.3 cm²/Vs.

TABLE 13

Polymer films were drop casted from various solution concentrations. Hole mobility values after annealed at different temperatures were collected.

| Sol. Concentration | Annealing Temp | | | | | | |
|---|---|---|---|---|---|---|---|
| | RT | 100° C. | 150° C. | 200° C. | 250° C. | 300° C. | 350° C. |
| 0.1% | 0.9 | 1.1 | 1.6 | 1.8 | 1.9 | 2.2 | 2.2 |
| 0.075% | 1.4 | 1.2 | 1.8 | 2.1 | 2.2 | 2.3 | 2.3 |
| 0.05% | 0.8 | 1.2 | 1.2 | 1.9 | 2.1 | 1.9 | 2.3 |
| 0.025% | 0.8 | 1.4 | 1.6 | 1.8 | 2.0 | 2.1 | 2.5 |

Height and phase images shown in FIGS. 25(a) and 25(b) were obtained by atomic force microscopy, showing fiber structure with length≈100 to 200 nm after annealing at 350° C. XRD spectra with temperature dependence shown in FIGS. 26(a) and 26(b) confirms the ordered structure increasing with annealing temperature. The peak at 2θ=3.3° can be correlated to 2.7 nm alkyl packing. As demonstrated in Table 13, because mobility values obviously increase with annealing temperature, the increasing mobility can be associated with the increasing ordered alkyl packing.

The dark spots in the image are actually holes in the film.

Figure 27:
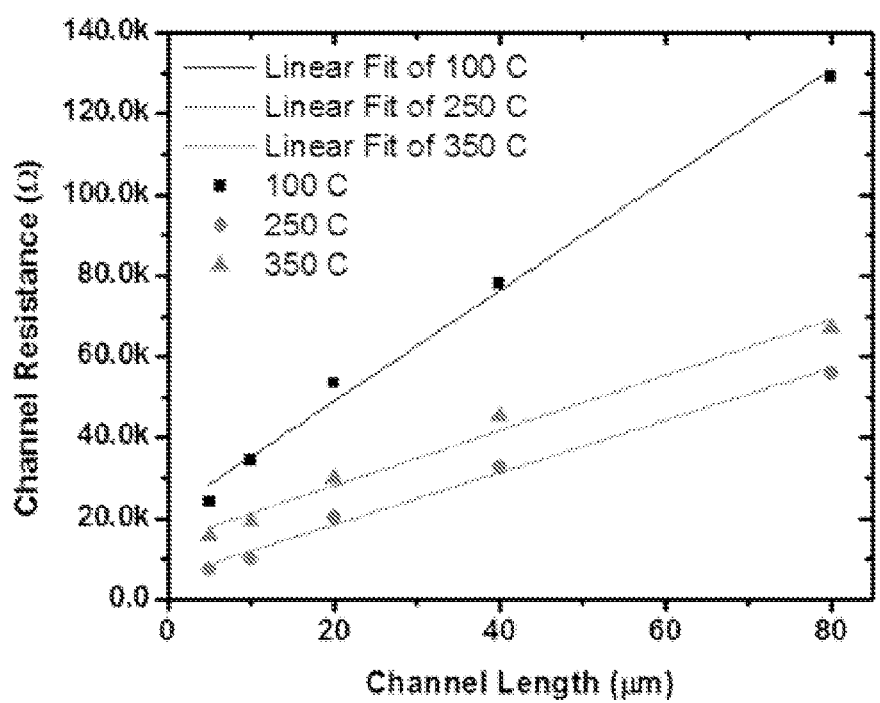
FIG. 27 is a composite drawing of contact resistances at different annealing temperatures obtained by transfer line measurement.

To further optimize device performance, contact resistance ($R_c$) was also studied. $R_c$ shown in FIG. 27 demonstrates a largest $R_c$=21.5 kΩ at RT, decreases to 5.4 kΩ after 250° C. annealing, and increases to 14.7 kΩ after annealed at 350° C. $R_c$ was significantly reduced by factor 4 after annealed at 250° C. The increase of $R_c$ after 350° C. annealing could come from possible thermal decomposition of the polymer films that degrades the interface between polymer and metal contact.

Figure 25:
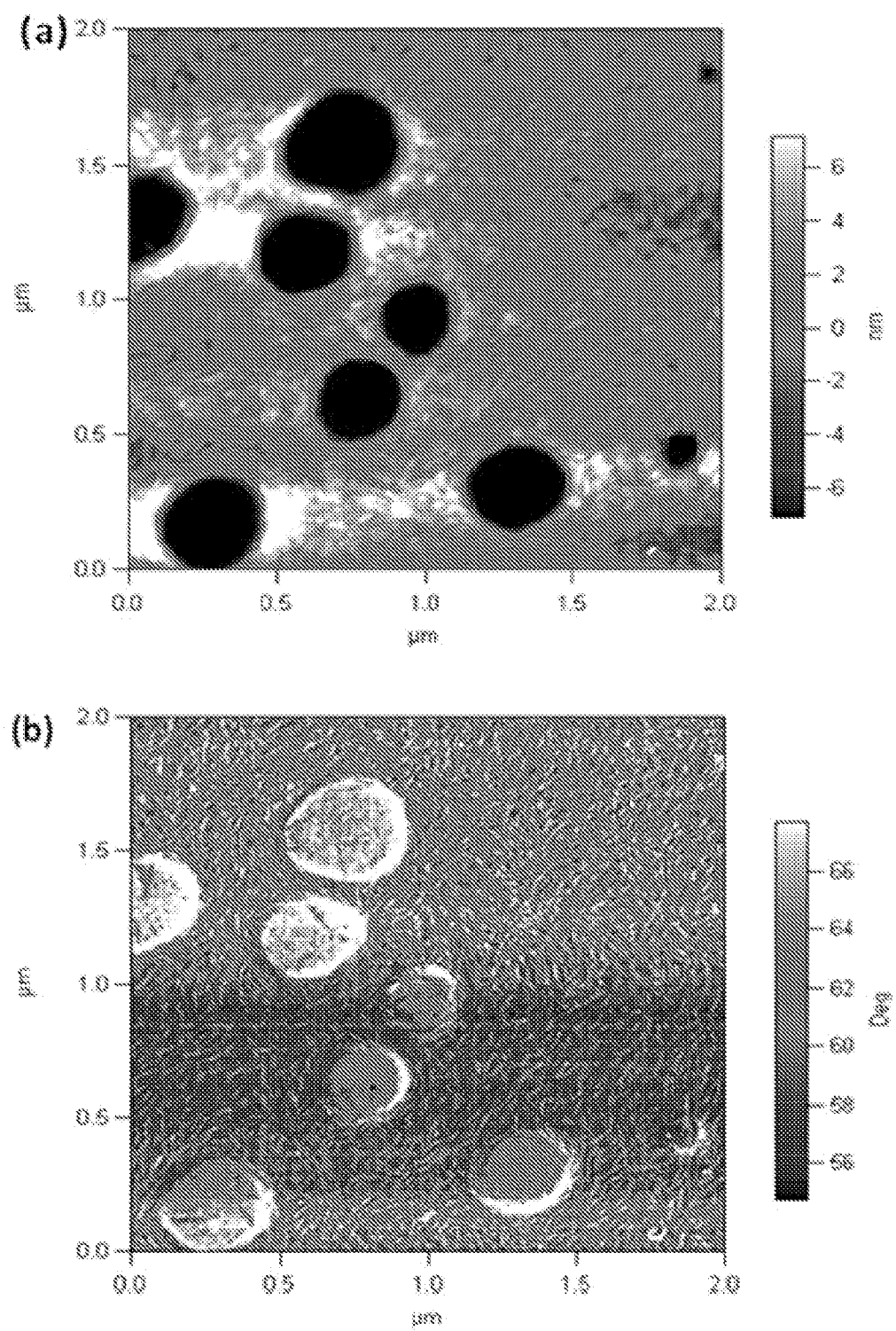
FIG. 25 are atomic force microscopy images of (a) the height image of a polymer film after 350° C. annealing obtained by the tapping mode of AFM, and (b) the phase image correlated to 24(a).
Figure 26A:
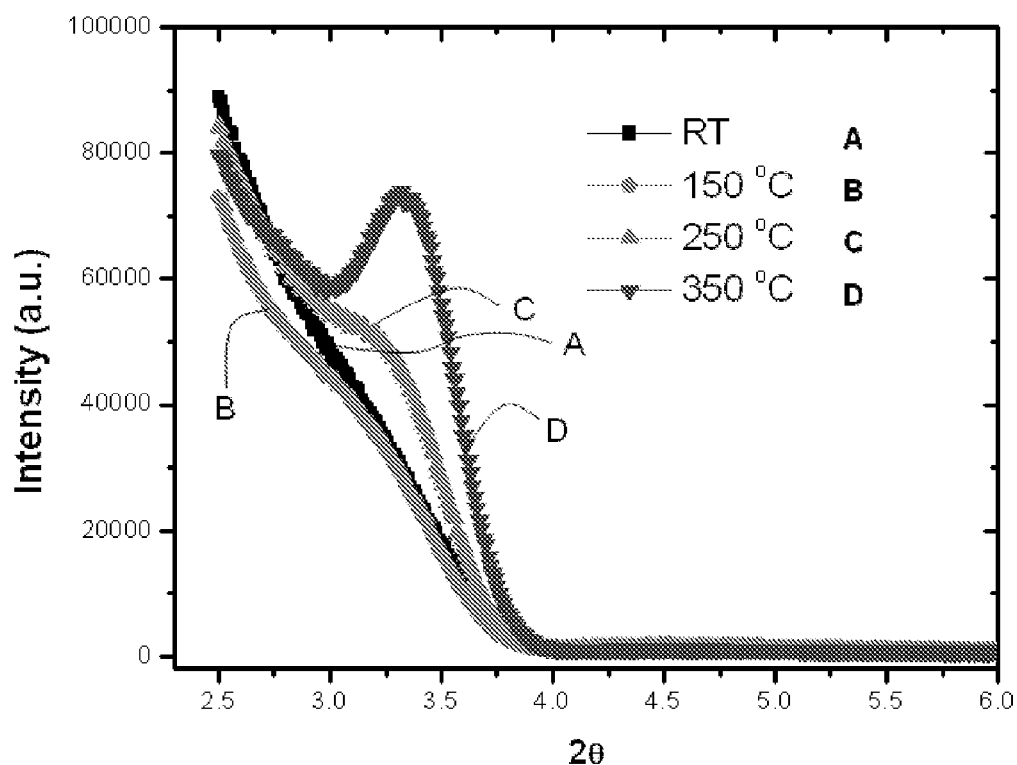
FIG. 26 is a panel of (a) out-of-plane XRD spectra after annealing at various temperatures, and (b) correlated in-plane XRD.
Figure 26B:
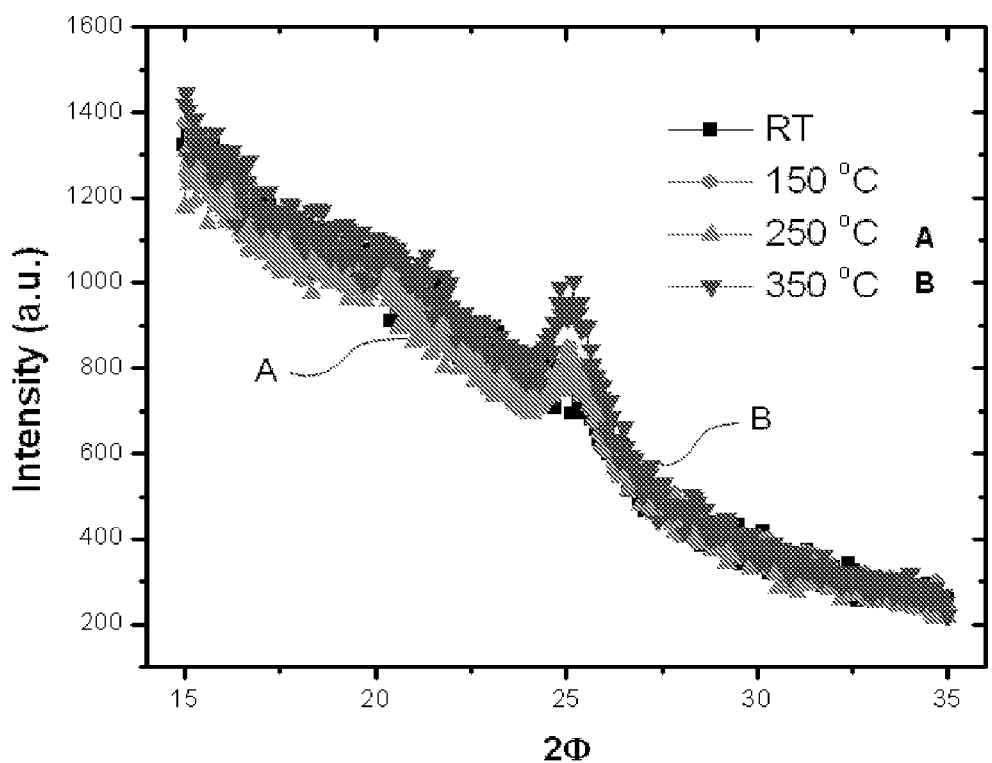

Through comparing the temperature dependence among Table 13, AFM images in FIG. 25, and XRD spectra in FIG.

26, we concluded the high mobility over 2 cm²/Vs was from the ordered packing of the high molecular weight rr-P2 after annealing. In order to advance the performance of this polymer system, higher molecular weight and more ordering in polymer film are both important.

Experimental

PCDTPT2 (P2) was originally synthesized with 55 kDa and PDI>4. To collect high molecular weight P2 by gel permeated chromatography (GPC), 75 mg P2 was dissolved in chloroform (0.25% triethylamine) with 1 mg/ml concentration. Permeated solution was collected within 6 sec and produced P2 with 300 kDa and PDI=1.6. After drying, then, the high molecular weight P2 was dissolved in chlorobenzene with 0.1, 0.075, 0.05, and 0.025 wt % for drop casting on bottom contact substrates passivated by decyl(trichloro)silane. The casted substrates were kept in a glovebox with oxygen level less than 2 ppm, drying for 6 hours. All devices were tested in a nitrogen environment and data were collected by Keithley 4200.

REFERENCES

The following publications are incorporated by reference herein in their entireties:
1. (a) Bürgi, L.; Turbiez, M.; Pfeiffer, R.; Bienewald, F.; Kirner, H.-J.; Winnewisser, C. Adv. Mater. 2008, 20, 2217-2224. (b) Bijleveld, J. C.; Zoombelt, A. P.; Mathijssen, S. G. J.; Wienk, M. M.; Turbiez, M.; de Leeuw, D. M.; Janssen, R. A. J. Am. Chem. Soc. 2009, 131, 16616-16617. (c) Li, Y. N.; Sonar, P.; Singh, S. P.; Soh, M. S.; van Meurs, M.; Tan, J. J. Am. Chem. Soc. 2011, 133, 2198-2204. (d) Yan, H.; Chen, Z. H.; Zheng, Y.; Newman, C.; Quinn, J. R.; Dotz, F.; Kastler, M.; Facchetti, A. Nature, 2009, 457, 679-687.
2. (a) Son, H. J.; Wang, W.; Xu, T.; Liang, Y. Y.; Wu, Y.; Li, G.; Yu, L. P. J. Am. Chem. Soc. 2011, 133, 1885-1894. (b) Liang, Y. Y.; Xu, Z.; Xia, J. B.; Tsai, S. T.; Wu, Y.; Li, G.; Ray, C.; Yu, L. P. Adv. Mater. 2010, 22, E135-E138.
3. (a) Zhang, M.; Tsao, H. N.; Pisula, W.; Yang, C.; Mishra, A. K.; Müllen, K. J. Am. Chem. Soc. 2007, 129, 3472-3473. (b) Tsao, H. N.; Cho, D.; Andreasen, J. W.; Rouhanipour, A.; Breiby, D. W.; Pisula, W.; Müllen, K. Adv. Mater. 2009, 21, 209-212. (c) Tsao, H. N.; Cho, D. M.; Park, I.; Hansen, M. R.; Mavrinskiy, A.; Yoon, D. Y.; Graf, R.; Pisula, W.; Spiess, H. W.; Müllen, K. J. Am. Chem. Soc. 2011, dx.doi.org/10.1021/ja 108861q.
4. Welch, G. C.; Coffin, R.; Peet, J.; Bazan, G. C. J. Am. Chem. Soc. 2009, 131, 10802-10803.
5. Blouin, N.; Michaud, A.; Gendron, D.; Wakim, S.; Blair, E.; Neagu-Plesu, R.; Belletête, M.; Durocher, G.; Tao, Y.; Leclerc, M. J. Am. Chem. Soc. 2008, 130, 732-742.
6. Zhou, H. X.; Yang, L. Q.; Price. S. C.; Knight, K. J.; You, W. Angew. Chem. Int. Ed. 2010, 49, 7992-7995.
7. (a) Yamamoto, T.; Arai, M.; Kokubo, H. Macromolecules 2003, 36, 7986-7993. (b) Nambiar, R.; Woody, K. B.; Ochocki, J. D.; Brizius, G. L.; Collard, D. M. Macromolecules 2009, 42, 43-51.
8. Osaka, I.; McCullough, R. D. Acc. Chem. Res. 2008, 41, 1202-1214.
9. (a) Tilley, J. W.; Zawoiski, S. J. Org. Chem. 1988, 53, 386-390. (b) Schröter, S.; Stock, C.; Bach, T. Tetrahedron, 2005, 61, 2245-2267. (c) Handy, S. T.; Wilson, T.; Muth, A. J. Org. Chem. 2007, 72, 8496-8500.
10. Coffin, R.; Peet, J.; Rogers, J.; Bazan, G. C. Nat. Chem. 2009, 1, 657-661.
11. Sun, Y.; Chien, S. C.; Yip, H. L.; Zhang, Y.; Chen, K. S.; Zeigler, D. F.; Chen, F. C.; Lin, B. P.; Jen, A. K. Y. J Mater Chem 2011, 21, 13247-13255.
12. Lei Ying, Guillermo C. Bazan, et al. J. Am. Chem. Soc. 2011, 133, 18538-18541.
13. Fengmin Liu, Zhiyuan Xie, et al. Solar Energy Materials & Solar Cells. 2010, 94, 94842-845.
14. Bijleveld, J. C.; Zoombelt, A. P.; Mathijssen, S. G. J.; Wienk, M. M.; Turbiez, M.; de Leeuw, D. M.; Janssen, R. A., J. Am. Chem. Soc. 2009, 131, 16616
15. Wang, M.; Hu, X. W.; Liu, P.; Li, W.; Gong, X.; Huang, F.; Cao, Y. J. Am. Chem. Soc. 2011, 133, 9638.
16. Li, Y. N.; Sonar, P.; Singh, S. P.; Soh, M. S.; van Meurs, M.; Tan, J., J. Am. Chem. Soc. 2011, 133, 2198
17. Yan, H.; Chen, Z. H.; Zheng, Y.; Newman, C.; Quinn, J. R.; Dotz, F.; Kastler, M.; Facchetti, A., Nature 2009, 457, 679
18. Zhang, W. M.; Smith, J.; Watkins, S. W.; Gysel, R.; McGehee, M.; Salleo, A.; Kirkpatrick, J.; Ashraf, S.; Anthopoulos, T.; Heeney, M.; McCulloch, I., J. Am. Chem. Soc. 2010, 132, 11437
19. Lei Ying, Ben B. Y. Hsu, Hongmei Zhan, Gregory C. Welch, Peter Zalar, Louis A. Perez, Edward J. Kramer, Thuc-Quyen Nguyen, Alan J. Heeger, Wai-Yeung Wong, and Guillermo C. Bazan, J. Am. Chem. Soc. 2011, 133, 18538

Although the present invention has been described in connection with the preferred embodiments, it is to be understood that modifications and variations may be utilized without departing from the principles and scope of the invention, as those skilled in the art will readily understand. Accordingly, such modifications may be practiced within the scope of the invention and the following claims.

What is claimed is:
1. A method of preparing a regioregular donor-acceptor copolymer, comprising:
    regioselectively preparing a monomer, wherein the monomer comprises a donor moiety having a first electron affinity in combination with an acceptor moiety having a second electron affinity; and
    reacting the monomer to produce a donor-acceptor copolymer that comprises a regioregular conjugated main chain section, wherein the combination of the donor moiety having the first electron affinity and the acceptor moiety having the second electron affinity is selected so as to induce charge transfer between the donor moiety and the acceptor moiety in the donor-acceptor copolymer, wherein:
    the charge carrier mobility of the regioregular donor-acceptor copolymer is greater than the charge carrier mobility of a regiorandom donor-acceptor copolymer of similar composition.
2. The method of claim 1, wherein regioselectively preparing comprises reacting halogen-functionalized pyridal[2,1,3]thiadiazole with cyclopenta[2,1-b:3,4-b']dithiophene or indaceno[1,2-b:5,6-b']dithiophene by direct arylation polycondensation.
3. The method of claim 1, wherein regioselectively preparing comprises reacting halogen-functionalized pyridal[2,1,3]thiadiazole with organotin-functionalized cyclopenta[2,1-b:3,4-b']dithiophene or organotin-functionalized indaceno[1,2-b:5,6-b']dithiophene.
4. The method of claim 3, wherein the halogen-functionalized pyridal[2,1,3]thiadiazole has the following structure:

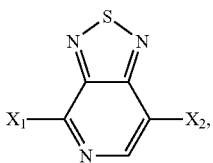

wherein $X_1$ and $X_2$ are each independently I, Br, Cl, or $CF_3SO_3$.

5. The method of claim 3, wherein the organotin-functionalized cyclopenta[2,1-b:3,4-b']dithiophene has the following structure (I) or the organotin-functionalized indaceno[1,2-b:5,6-b']dithiophene has the following structure (II):

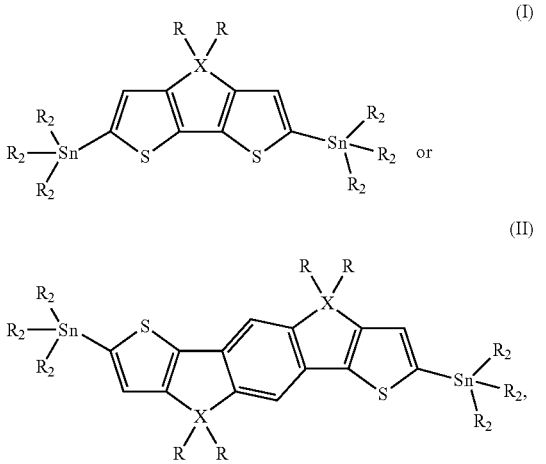

wherein each R is independently hydrogen or a substituted or non-substituted alkyl, aryl or alkoxy chain, each $R_2$ is independently methyl or n-butyl, and X is C, Si, Ge, N or P.

6. The method of claim 1, wherein the monomer has the following structure:

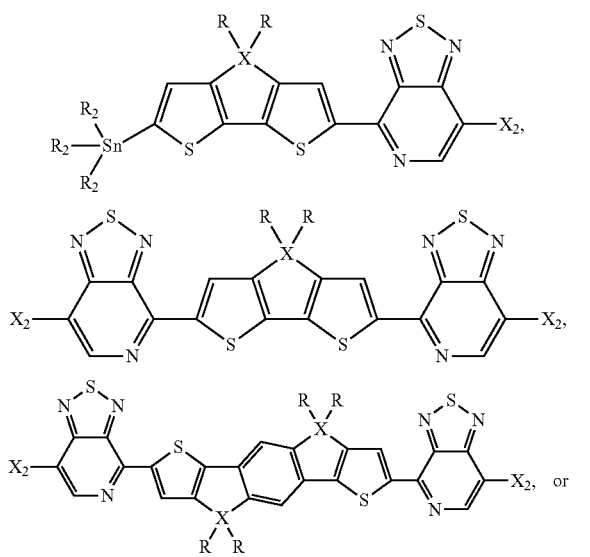

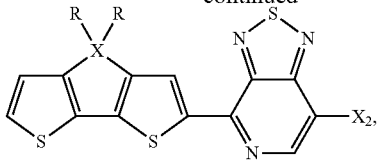

wherein each R is independently hydrogen or a substituted or non-substituted alkyl, aryl or alkoxy chain, each $R_2$ is independently methyl or n-butyl, X is C, Si, Ge, N or P, and $X_2$ is I, Br, Cl, or $CF_3SO_3$.

7. The method of claim 6, wherein X is C or Si, and $X_2$ is Br.

8. The method of claim 1, wherein the regioselectivity of preparing the monomer is 95% or greater.

9. The method of claim 1, wherein the regioselectively preparing comprises reacting halogen-functionalized pyridal[2,1,3]thiadiazole at a temperature in the range of about 50° C. to about 150° C.

10. The method of claim 1, wherein when the monomer is a cyclopenta[2,1-b:3,4-b']dithiophene-pyridal[2,1,3]thiadiazole monomer, the reacting the monomer comprises reacting the monomer to itself, or reacting the monomer to another monomer containing a cyclopenta[2,1-b:3,4-b']dithiophene unit.

11. The method of claim 1, wherein when the monomer is a pyridal[2,1,3]thiadiazole-indaceno[1,2-b:5,6-b']dithiophene-pyridal[2,1,3]thiadiazole monomer, the reacting the monomer comprises reacting the monomer to another monomer containing an indaceno[1,2-b:5,6-b']dithiophene-pyridal[2,1,3]thiadiazole unit.

12. The method of claim 1, further comprising disposing the donor-acceptor copolymer as a layer on a substrate.

13. The method of claim 12, wherein the donor-acceptor copolymer forms an active semiconductor layer.

14. The method of claim 1, wherein the method comprises a Stille cross-coupling reaction performed under reaction conditions selected to favor cross-coupling reactions at a first position on the donor moiety or the acceptor moiety.

15. The method of claim 14, wherein the method comprises microwave assisted Stille polymerization.

16. The method of claim 1, wherein the regioregular donor-acceptor copolymer can exhibit a field effect transistor hole mobility of at least 0.14 cm²/Vs in a field-effect transistor device.

17. A method of preparing a regioregular donor-acceptor copolymer, comprising:
(a) regioselectively preparing a monomer, wherein:
the monomer comprises a donor moiety having a first electron affinity in combination with an acceptor moiety having a second electron affinity;
the combination of the donor moiety having the first electron affinity and the acceptor moiety having the second electron affinity donor is selected so as to induce charge transfer between the donor moiety and the acceptor moiety in the donor-acceptor copolymer; and
the monomer is regioselectively prepared using a cross-coupling reaction under reaction conditions that favor cross-coupling reactions at a first position on the donor moiety or the acceptor moiety; and
(b) reacting the monomer to produce a donor-acceptor copolymer that comprises a regioregular conjugated main chain section, wherein:

the charge carrier mobility of the regioregular donor-acceptor copolymer is greater than the charge carrier mobility of a regiorandom donor-acceptor copolymer of similar composition.

18. The method of claim 17, wherein the regioregular donor-acceptor copolymer comprises a regioregular conjugated main chain section, said regioregular conjugated main chain section having a repeat unit that comprises a pyridine of the structure

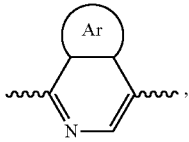

wherein:
- Ar is a substituted or non-substituted aromatic functional group;
- the pyridine is regioregularly arranged along the conjugated main chain section; and
- the repeat unit further comprises a dithiophene of the structure

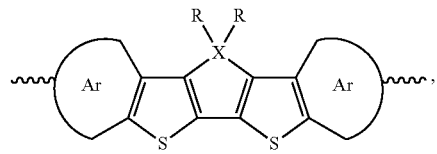

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain; and X is C, Si, Ge, N or P.

19. The method of claim 18, wherein:

the monomer is regioselectively prepared using a Stille cross-coupling reaction performed under reaction conditions including a temperature selected to favor cross-coupling reactions at a first position on the pyridine repeat unit.

* * * * *